United States Patent
Lee et al.

(10) Patent No.: US 11,580,916 B2
(45) Date of Patent: *Feb. 14, 2023

(54) DISPLAY DEVICE

(71) Applicant: Samsung Display Co., Ltd., Yongin-si (KR)

(72) Inventors: Ji Seon Lee, Hwaseong-si (KR); Jin Sung An, Seongnam-si (KR); Seok Je Seong, Seongnam-si (KR); Seong Jun Lee, Seoul (KR); Se Wan Son, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/680,964

(22) Filed: Feb. 25, 2022

(65) Prior Publication Data

US 2022/0180820 A1 Jun. 9, 2022

Related U.S. Application Data

(63) Continuation of application No. 17/193,281, filed on Mar. 5, 2021, now Pat. No. 11,302,268.

(30) Foreign Application Priority Data

Mar. 6, 2020 (KR) .......................... 10-2020-0028624

(51) Int. Cl.
*G09G 3/3291* (2016.01)
*H01L 27/32* (2006.01)
*H01L 27/12* (2006.01)

(52) U.S. Cl.
CPC ... *G09G 3/3291* (2013.01); *G09G 2300/0426* (2013.01); *H01L 27/3262* (2013.01)

(58) Field of Classification Search
None
See application file for complete search history.

(56) References Cited

U.S. PATENT DOCUMENTS

| | | | |
|---|---|---|---|
| 8,711,138 B2 | 4/2014 | Kawabe | |
| 10,957,714 B2* | 3/2021 | Yamazaki | ........... H01L 27/1225 |
| 2010/0276696 A1* | 11/2010 | Yamazaki | ......... G02F 1/136286 |
| | | | 257/72 |
| 2016/0163780 A1* | 6/2016 | Park | .................... H01L 27/3272 |
| | | | 257/40 |
| 2018/0076192 A1 | 3/2018 | Kim et al. | |
| 2018/0175135 A1* | 6/2018 | Lim | .................... H01L 27/3246 |
| 2019/0131371 A1* | 5/2019 | Yi | ....................... H01L 27/3218 |
| 2019/0363151 A1* | 11/2019 | Kim | .................... H01L 27/3258 |
| 2020/0168155 A1* | 5/2020 | Xiong | .................. H01L 27/3262 |
| 2021/0125561 A1* | 4/2021 | Choi | .................... H01L 27/3258 |

OTHER PUBLICATIONS

Extended European Search Report for Application No. 21152423.6 dated Jul. 9, 2021.

* cited by examiner

*Primary Examiner* — Sepehr Azari
(74) *Attorney, Agent, or Firm* — Cantor Colburn LLP

(57) ABSTRACT

A display device includes a substrate, a first active pattern, a first gate electrode, a second active pattern, a second gate electrode, a first connecting pattern, and a second connecting pattern. The first connecting pattern is disposed on the second active pattern and is electrically connected to the first gate electrode, and the second connecting pattern is disposed on the first connecting pattern and is electrically connected to the first connecting pattern and the second active pattern.

20 Claims, 44 Drawing Sheets

DISPLAY DEVICE

This application is a continuation of U.S. patent application Ser. No. 17/193,281, filed on Mar. 5, 2021, which claims priority to Korean Patent Application No. 10-2020-0028624, filed on Mar. 6, 2020, and all the benefits accruing therefrom under 35 U.S.C. § 119, the content of which in its entirety is herein incorporated by reference.

BACKGROUND

1. Field

Embodiments of the invention relate generally to a display device, more particularly, relate to the display device which resists a load and an impact.

2. Discussion of the Related Art

In general, a display device includes a plurality of pixel structures. The pixel structure may include transistors, at least one storage capacitor, and an emitting diode. The transistors may include a first transistor that generates a driving current and provides the driving current to the emitting diode, a second transistor that transfers a data voltage to the first transistor in response to a gate signal, and a third transistor compensating for a threshold voltage of the first transistor. The display device may further include a data line for transferring the data voltage to the second transistor. The first transistor and the third transistor may be electrically connected to each other through a connecting pattern disposed between the first transistor and the third transistor.

SUMMARY

In a display device, a crosstalk may occur between the data line and the connecting pattern. In a display device, there is a limit in reducing the area of the pixel structure on a plane due to the area occupied by the connecting pattern.

Embodiments of a display device provide a display device with improved display quality.

An embodiment of a display device includes a substrate, a first active pattern disposed on the substrate, a first gate electrode disposed on the first active pattern and constituting a first transistor together with the first active pattern, a second active pattern disposed on the first gate electrode and the second gate electrode, a second gate electrode disposed on the second active pattern and constituting a second transistor together with the second active pattern, a first connecting pattern disposed on the second active pattern and electrically connected to the first gate electrode, and a second connecting pattern disposed on the first connecting pattern and electrically connected to the first connecting pattern and the second active pattern.

According to an embodiment, the first connecting pattern may be disposed in a same layer as the second gate electrode.

According to an embodiment, the display may further include a shielding pattern disposed on the first connecting pattern, where the shielding pattern may receive a constant voltage, and a data line disposed on the shielding pattern, where the data line may overlap the shielding pattern, and provide a data voltage.

According to an embodiment, the shielding pattern may overlap the first connecting pattern.

According to an embodiment, the shielding pattern may be disposed between the data line and the first connecting pattern.

According to an embodiment, the data line may be disposed on the second connecting pattern.

According to an embodiment, the constant voltage may be a power voltage.

According to an embodiment, the display device may further include a power voltage line disposed on the shielding pattern, where the power voltage line may provide the power voltage to the shielding pattern.

According to an embodiment, the second connecting pattern may partially overlap the first connecting pattern.

According to an embodiment, the display device may further include a storage capacitor electrode disposed on the first gate electrode, where a hole may be defined through the storage capacitor electrode, and the second connecting pattern may not overlap the hole.

According to an embodiment, the first connecting pattern may contact the first gate electrode through a first contact hole overlapping the first connecting pattern and the first gate electrode, and the second connecting pattern may not overlap the first contact hole.

According to an embodiment, the second connecting pattern may contact the first connecting pattern through a second contact hole overlapping the first connecting pattern and the second connecting pattern.

According to an embodiment, the second connecting pattern may contact the second active pattern through a third contact hole overlapping the second connecting pattern and the second active pattern.

According to an embodiment, the first contact hole, the second contact hole, and the third contact hole may be spaced apart from each other.

According to an embodiment, the display device may further include a first bottom gate electrode disposed under the second active pattern and electrically connected the second gate electrode, and the second gate electrode may be disposed in an island shape According to an embodiment, the first bottom gate electrode may overlap the second gate electrode.

According to an embodiment, the display device may further include a third gate electrode disposed on the second active pattern and constituting a third transistor together with the second active pattern and a second bottom gate electrode disposed under the second active pattern, overlapping the third gate electrode, and electrically connected to the third gate electrode.

According to an embodiment, the first active pattern may include polycrystalline silicon, and the second active pattern may include oxide semiconductor.

According to an embodiment, the display device may further include a light blocking pattern disposed on the second connecting pattern and overlapping the second active pattern.

According to an embodiment, the display device may further include a fourth gate electrode disposed between the first active pattern and the second active pattern and constituting a fourth transistor with the second active pattern.

As described herein, in embodiments of the display device, a gate terminal of a first transistor and a second terminal of a third transistor are connected to each other through a first connecting pattern and the second connecting pattern. In such embodiments, the display device includes a shielding pattern that shields the first connecting pattern, such that a crosstalk between the first connecting pattern and a data line may be effectively prevented. In such embodiments, the area of the pixel structure on a plane may be reduced by partially overlapping the second connecting pattern and the first connecting pattern, such that a resolution of the display device can be increased.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
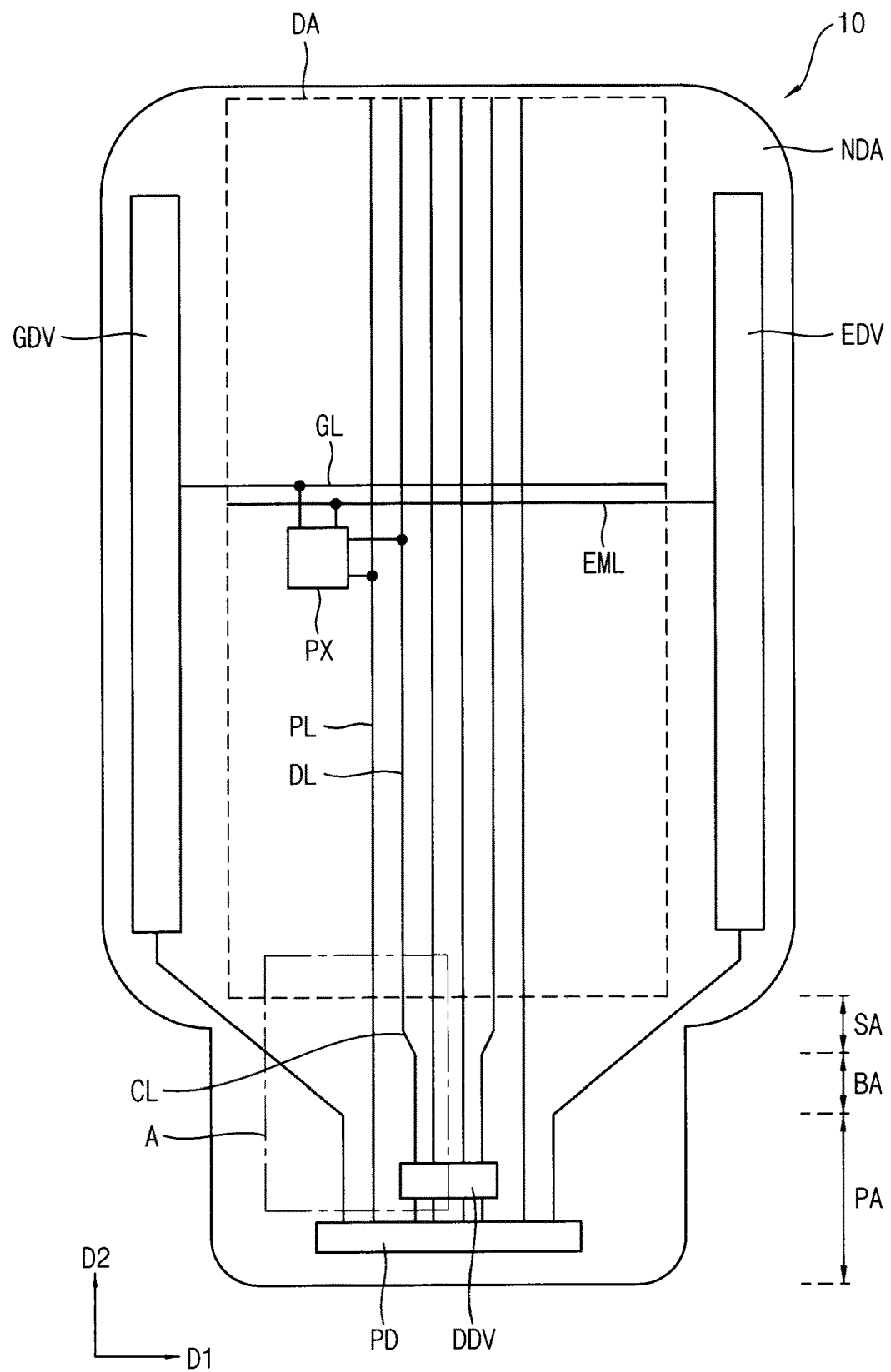
FIG. 1 is a plan view illustrating a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may be different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the invention will be described in detail with reference to the accompanying drawings.

Figure 2:
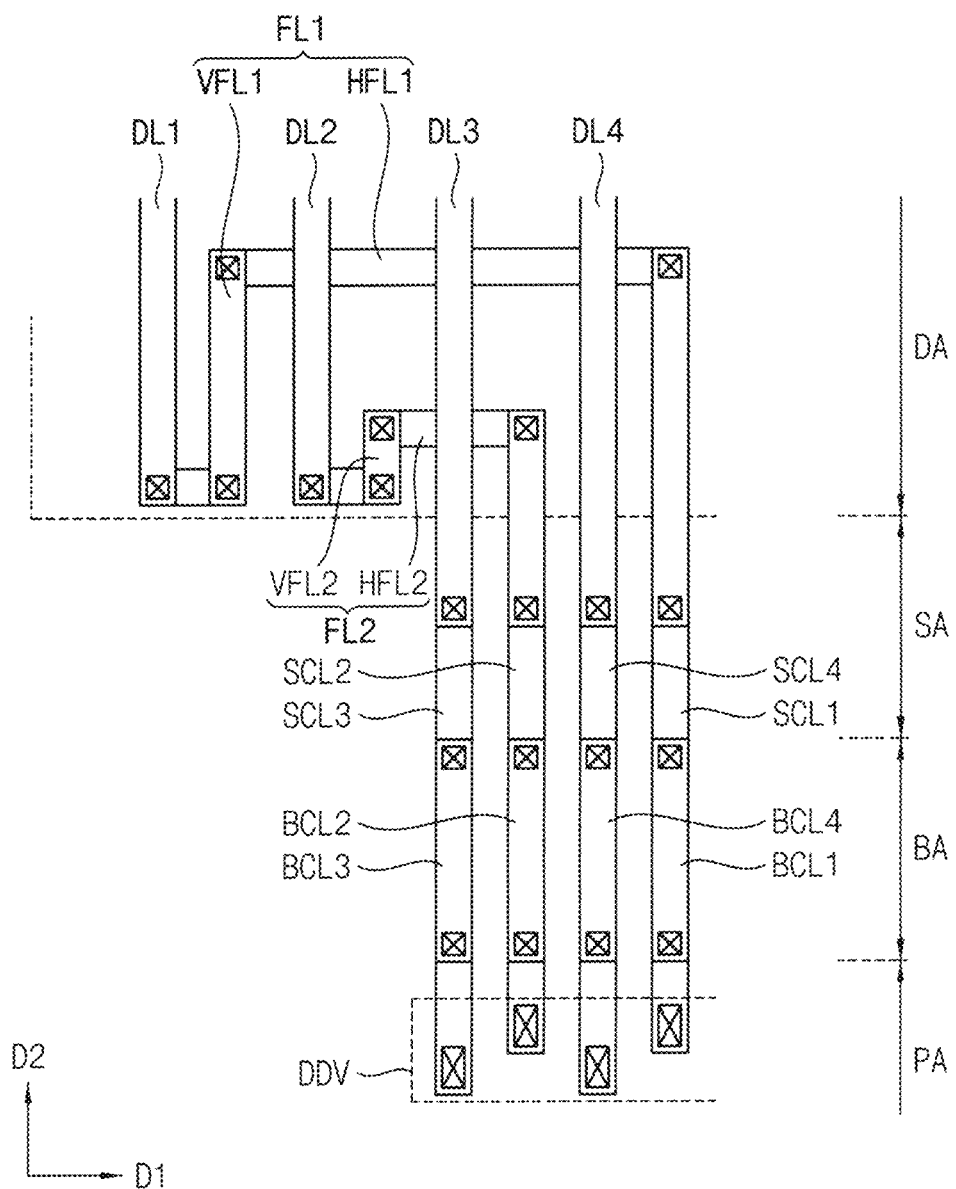
FIG. 2 is an enlarged view illustrating a connecting line included in the display device of FIG. 1.
Figure 3:
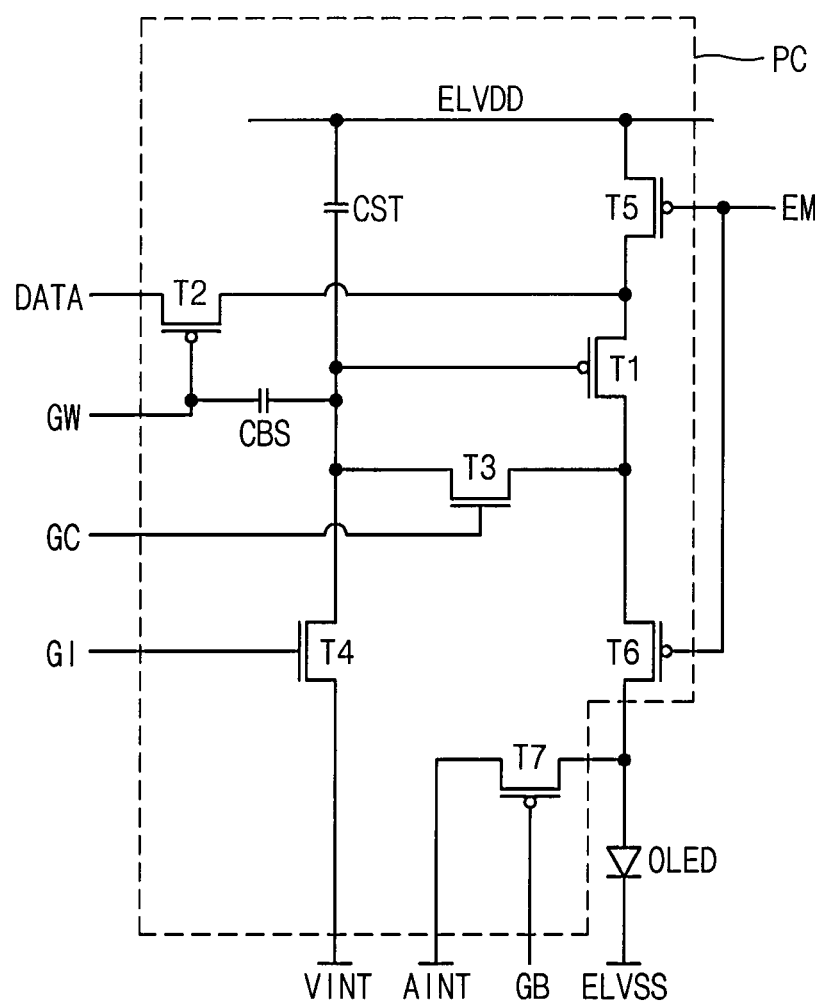
FIG. 3 is a circuit diagram illustrating an embodiment of a pixel circuit and an organic light emitting diode included in the display device of FIG. 1.

FIG. 1 is a plan view illustrating a display device according to an embodiment. FIG. 2 is an enlarged view illustrating a connecting line included in the display device of FIG. 1. FIG. 3 is a circuit diagram illustrating an embodiment of a pixel circuit and an organic light emitting diode included in the display device of FIG. 1.

Referring to FIGS. 1, 2, and 3, an embodiment of a display device 10 may include a display area DA and a non-display area NDA surrounding the display area DA. The non-display area NDA may include a bending area BA which can be bent, a peripheral area SA between the display area DA and the bending area BA, and a pad area PA.

In one embodiment, for example, a pixel structure PX may be disposed in the display area DA and a driver for driving the pixel structure PX may be disposed in the non-display area NDA. In one embodiment, for example, a pad part PD and a data driver DDV may be disposed in the pad area PA, and the bending area BA may be bent based on a virtual bending axis. In such an embodiment, the pixel structure PX is not disposed in the peripheral area SA, such that a width extending in a second direction D2 of the peripheral area SA may be defined as a dead space of the display device 10.

In such an embodiment, the pixel structure PX, a data line DL connected to the pixel structure PX, a gate line GL connected to the pixel structure PX, an emission management (or emission control) line EML connected to the pixel structure PX, a driving voltage line PL connected to the pixel structure PX, and a connecting line CL connected to the pixel structure PX may be disposed in the display area DA.

The data line DL may be electrically connected to the data driver DDV and may extend along the second direction D2. The data line DL may receive a data voltage DATA from the data driver DDV and may transmit the data voltage DATA to the pixel structure PX.

The gate line GL may be electrically connected to a gate driver GDV and may extend along a first direction D1 crossing the second direction D2. The gate line GL may receive a gate signal from the gate driver GDV and transmit the gate signal to the pixel structure PX.

The emission management line EML may be electrically connected to an emission driver EDV and may extend along the first direction D1. The emission management line EML may receive an emission management (or emission control) signal EM from the emission driver EDV and transfer the emission management signal EM to the pixel structure PX. In one embodiment, for example, an activation period of the emission management signal EM may be an emission period of the display device 10 and an inactivation period of the emission management signal EM may be a non-emission period of the display device 10.

The driving voltage line PL may be electrically connected to the pad part PD and may extend along the second direction D2. In an embodiment, the driving voltage line PL may receive a high power voltage ELVDD from the pad part PD and transfer the high power voltage ELVDD to the pixel structure PX. In such an embodiment, a low power voltage ELVSS may be commonly provided to an opposite electrode (e.g., a cathode electrode) of an organic light emitting diode OLED.

The driver may include the gate driver GDV, the data driver DDV, the emission driver EDV, and the pad part PD. In such an embodiment, the driver may further include a timing controller, and the timing controller may control the gate driver GDV, the data driver DDV, the emission driver EDV, and the pad part PD.

The gate driver GDV may receive a voltage from the pad part PD to generate the gate signal. In one embodiment, for example, the gate signal may include a first gate signal GW, a second gate signal GC, a third gate signal GI, and a fourth gate signal GB.

The data driver DDV may generate the data voltage DATA corresponding to the emission period and the non-emission period. The emission driver EDV may receive a voltage from the pad part PD to generate the emission management signal EM. The pad part PD may be electrically connected to an external device and may provide the voltages to the gate driver GDV, the emission driver EDV, and the driving voltage line PL, respectively.

In an embodiment, as shown in FIG. 1, the gate driver GDV and the emission driver EDV are respectively disposed on the left and right sides of the display device 10, but the invention is not limited thereto.

In an embodiment, the data driver DDV is mounted in the non-display area NDA of the display device 10 as shown in FIG. 1, but the invention is not limited thereto. In one alternative embodiment, for example, the data driver DDV may be disposed on a separate flexible printed circuit board ("FPCB"), and the pad part PD may be electrically connected to the FPCB.

In an embodiment, the data line DL and the connecting line CL may be disposed in the display area DA. In one embodiment, for example, as shown in FIG. 2, first to fourth data lines DL1, DL2, DL3, and DL4, a first connecting line FL1, and a second connecting line FL2 may be disposed in the display area DA. The first connecting line FL1 may extend in the first direction D1 and the second direction D2, and electrically connect the data driver DDV and the first data line DL1. The second connecting line FL2 may extend in the first direction D1 and the second direction D2, and electrically connect the data driver DDV and the second data line DL2. Each of the third and fourth data lines DL3 and DL4 may be connected to the data driver DDV. In an embodiment, the connecting line CL is disposed in the display area DA, such that a width extending in the second direction D2 of the peripheral area SA of the display device 10 may be reduced compared to a width extending in the second direction D2 of a peripheral area of a conventional display device. In such an embodiment, the dead space of the display device 10 may be reduced.

In an embodiment, as shown in FIG. 3, a pixel circuit PC may include a first transistor T1, a second transistor T2, a third transistor T3, a fourth transistor T4, a fifth transistor T5, a sixth transistor T6, a seventh transistor T7, a storage capacitor CST, and a boosting capacitor CBS. The pixel circuit PC may be electrically connected to the organic light emitting diode OLED and may provide a driving current to the organic light emitting diode OLED.

The organic light emitting device OLED may include a first terminal (e.g., an anode terminal) and a second terminal (e.g., a cathode terminal). The first terminal of the organic light emitting diode OLED may be electrically connected to the first transistor T1 through the sixth transistor T6 and may receive the driving current. The second terminal may receive the low power voltage ELVSS. The organic light emitting diode OLED may generate light having a luminance corresponding to the driving current.

The storage capacitor CST may include a first terminal and a second terminal. The first terminal of the storage capacitor CST may be connected to the first transistor T1, and the second terminal of the storage capacitor CST may receive the high power voltage ELVDD. The storage capacitor CST may maintain a voltage level of a gate terminal of the first transistor T1 during an inactive period of the first gate signal GW.

The boosting capacitor CBS may include a first terminal and a second terminal. The first terminal of the boosting capacitor CBS may be connected to the first terminal of the storage capacitor CST, and the second terminal of the boosting capacitor CBS may receive the first gate signal GW. When the application of the first gate signal GW is stopped, the boosting capacitor CBS may compensate for a voltage drop of the gate terminal of the first transistor T1 by increasing the voltage level of the gate terminal.

The first transistor T1 may include the gate terminal, a first terminal (e.g., a source terminal), and a second terminal (e.g., a drain terminal). The gate terminal of the first transistor T1 may be connected to the first terminal of the storage capacitor CST. The first terminal of the first transistor T1 may be connected to the second transistor T2 to receive the data voltage DATA. The second terminal of the first transistor T1 may be connected to the organic light emitting device OLED through the sixth transistor T6 to provide the driving current. The first transistor T1 may generate the driving current based on a voltage difference between the gate terminal and the first terminal. In such an embodiment, the first transistor T1 may be referred to as a driving transistor.

The second transistor T2 may include a gate terminal, a first terminal (e.g., a source terminal), and a second terminal (e.g., a drain terminal). The gate terminal of the second transistor T2 may receive the first gate signal GW through the gate line GL.

The second transistor T2 may be turned on or turned off in response to the first gate signal GW. In one embodiment, for example, where the second transistor T2 is a P-type metal-oxide-semiconductor ("PMOS") transistor, the second transistor T2 may be turned off when the first gate signal GW has a positive voltage level, and may be turned on when the first gate signal GW has a negative voltage level. The first terminal of the second transistor T2 may receive the data voltage DATA through the data line DL. The second terminal of the second transistor T2 may provide the data voltage DATA to the first terminal of the first transistor T1 while the second transistor T2 is turned on. In such an embodiment, the second transistor T2 may be referred to as a switching transistor.

The third transistor T3 may include a gate terminal, a first terminal (e.g., a source terminal), and a second terminal (e.g., a drain terminal). The gate terminal of the third transistor T3 may receive the second gate signal GC. The first terminal of the third transistor T3 may be connected to the second terminal of the first transistor T1. The second terminal of the third transistor T3 may be connected to the gate terminal of the first transistor T1.

The third transistor T3 may be turned on or turned off in response to the second gate signal GC. In one embodiment, for example, where the third transistor T3 is an N-type metal-oxide-semiconductor ("NMOS") transistor, the third transistor T3 may be turned on when the second gate signal GC has a positive voltage level, and may be turned off when the second gate signal GC has a negative voltage level.

During a period in which the third transistor T3 is turned on in response to the second gate signal GC, the third transistor T3 may diode-connect the first transistor T1. When the first transistor T1 is diode-connected, a voltage difference equal to the threshold voltage of the first transistor T1 may occur between the gate terminal of the first transistor T1 and the first terminal of the first transistor T1. Accordingly, during the period in which the third transistor T3 is turned on, a voltage obtained by adding the data voltage DATA and the voltage difference may be provided to the gate terminal of the first transistor T1. Therefore, the third transistor T3 may compensate for the threshold voltage of the first transistor T1. In such an embodiment, the third transistor T3 may be referred to as a compensation transistor.

The fourth transistor T4 may include a gate terminal, a first terminal (e.g., a source terminal), and a second terminal (e.g., a drain terminal). The gate terminal of the fourth transistor T4 may receive the third gate signal GI. The first terminal of the fourth transistor T4 may be connected to the gate terminal of the first transistor T1. The second terminal of the fourth transistor T4 may receive a gate initialization voltage VINT.

The fourth transistor T4 may be turned on or turned off in response to the third gate signal GI. In one embodiment, for example, where the fourth transistor T4 is a NMOS transistor, the fourth transistor T4 may be turned on when the third gate signal GI has a positive voltage level, and may be turned off when the third gate signal GI has a negative voltage level.

During a period in which the fourth transistor T4 is turned on in response to the third gate signal GI, the gate initialization voltage VINT may be provided to the gate terminal of the first transistor T1. Accordingly, the fourth transistor T4 may initialize the gate terminal of the first transistor T1 to the gate initialization voltage VINT. In such an embodiment, the fourth transistor T4 may be referred to as a gate initialization transistor.

The fifth transistor T5 may include a gate terminal, a first terminal (e.g., a source terminal), and a second terminal (e.g., a drain terminal). The gate terminal of the fifth transistor T5 may receive the emission management signal EM. The first terminal of the fifth transistor T5 may receive the high power voltage ELVDD. The second terminal of the fifth transistor T5 may be connected to the first terminal of the first transistor T1. When the fifth transistor T5 is turned on in response to the emission management signal EM, the fifth transistor T5 may provide the high power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission management signal EM. The first terminal of the sixth transistor T6 may be connected to the second terminal of the first transistor T1. The second terminal of the sixth transistor T6 may be connected to the first terminal of the organic light emitting diode OLED. When the sixth transistor T6 is turned on in response to the emission management signal EM, the sixth transistor T6 may transmit the driving current generated by the first transistor T1 to the organic light emitting diode OLED.

The seventh transistor T7 may include a gate terminal, a first terminal (e.g., a source terminal), and a second terminal (e.g., a drain terminal). The gate terminal of the seventh transistor T7 may receive the fourth gate signal GB. The first terminal of the seventh transistor T7 may receive an anode initialization voltage AINT. The second terminal of the seventh transistor T7 may be connected to the first terminal of the organic light emitting diode OLED. When the seventh transistor T7 is turned on in response to the fourth gate signal GB, the seventh transistor T7 may provide the anode initialization voltage AINT to the organic light emitting diode OLED. Accordingly, the seventh transistor T7 may initialize the first terminal of the organic light emitting diode OLED to the anode initialization voltage AINT.

The connection structure of the pixel circuit PC illustrated in FIG. 3 is merely exemplary and may be variously changed or modified.

FIGS. 4 to 16 are plan views illustrating a pixel structure included in the display device of FIG. 1.

Figure 4:
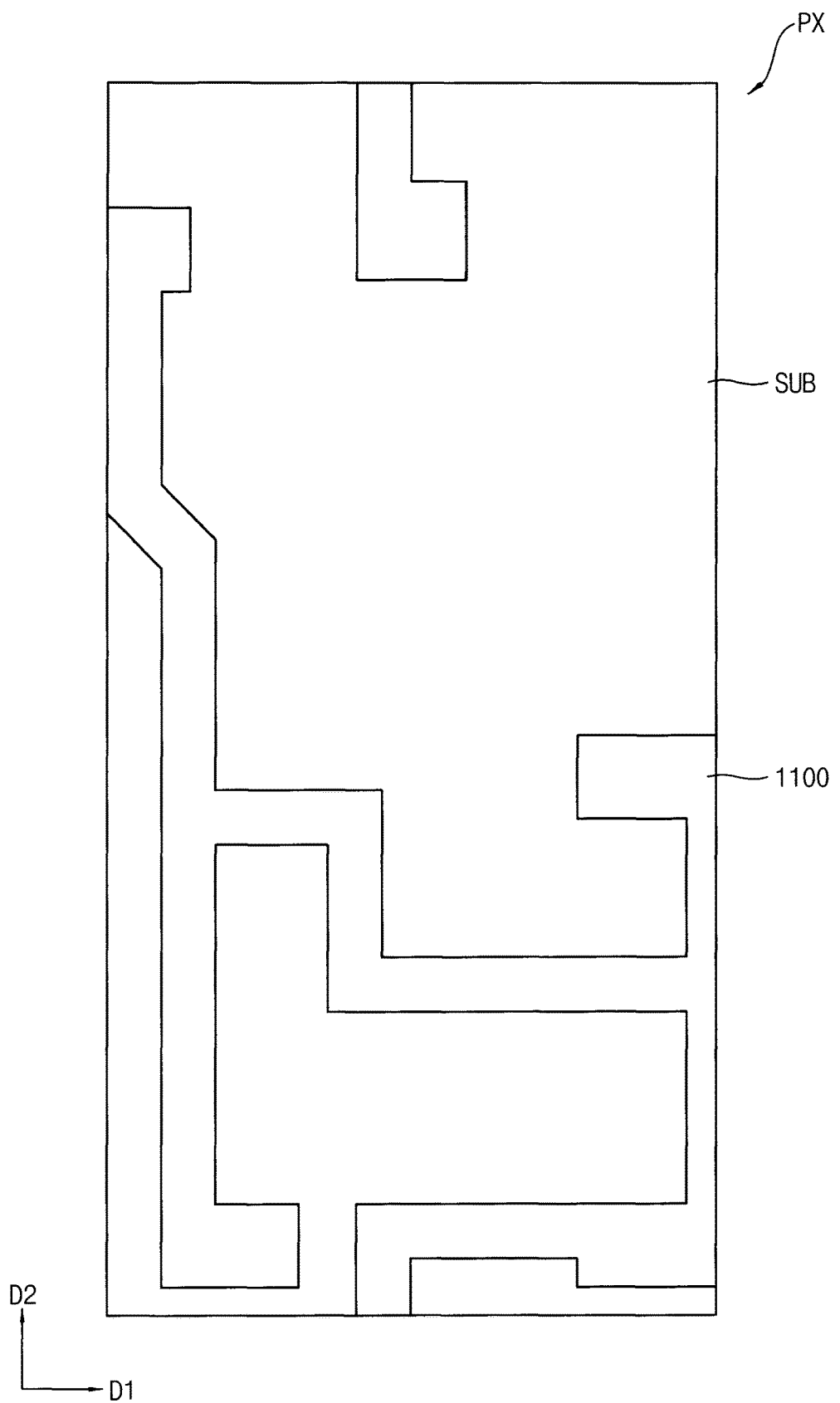
FIGS. 4 to 16 are plan views illustrating a pixel structure included in the display device of FIG. 1.

Referring to FIG. 4, an embodiment of the pixel structure PX may include a substrate SUB and a first active pattern 1100 disposed on the substrate SUB.

The substrate SUB may include a glass substrate, a quartz substrate, a plastic substrate, or the like. In an embodiment, the substrate SUB may include a plastic substrate, and thus the display device 10 may be a flexible display device. In such an embodiment, the substrate SUB may have a structure in which at least one organic film layer and at least one barrier layer are alternately stacked. In one embodiment, for example, the organic film layer may include or be formed of an organic material such as polyimide, and the barrier layer may include or be formed of an inorganic material such as silicon oxide or silicon nitride.

A buffer layer may be disposed on the substrate SUB. The buffer layer may effectively prevent diffusion of metal atoms or impurities from the substrate SUB into the first active pattern 1100. In such an embodiment, the buffer layer may allow the first active pattern 1100 to be uniformly formed by controlling a heat transfer rate during a crystallization process for forming the first active pattern 1100.

The first active pattern 1100 may be disposed on the buffer layer. In an embodiment, the first active pattern 1100 may include a silicon semiconductor. In one embodiment, for example, the first active pattern 1100 may include amorphous silicon, polycrystalline silicon, or the like.

In an embodiment, ions may be selectively implanted into the first active pattern 1100. In one embodiment, for example, where the first and second transistors T1 and T2 are the PMOS transistors, the first active pattern 1100 may include a source region into which cations are implanted, a drain region into which cations are implanted, and a channel area into which cations are not implanted.

A first gate insulating layer (e.g., a first gate insulating layer GI1 of FIG. 17) may cover the first active pattern 1100 and may be disposed on the substrate SUB. The first gate insulating layer may include an insulating material. In one embodiment, for example, the first gate insulating layer may include silicon oxide, silicon nitride, titanium oxide, tantalum oxide, or the like.

Figure 5:
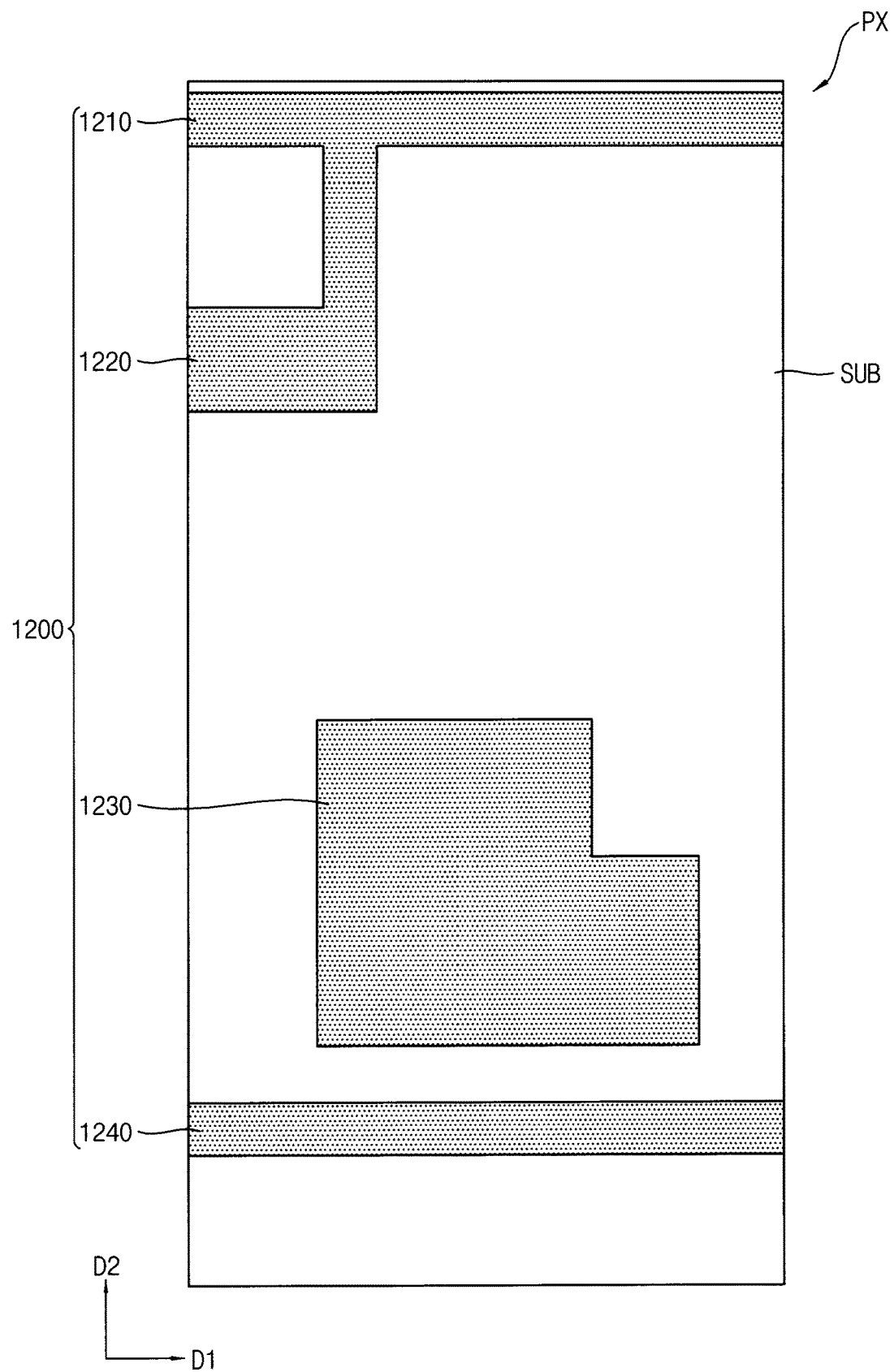
Figure 6:
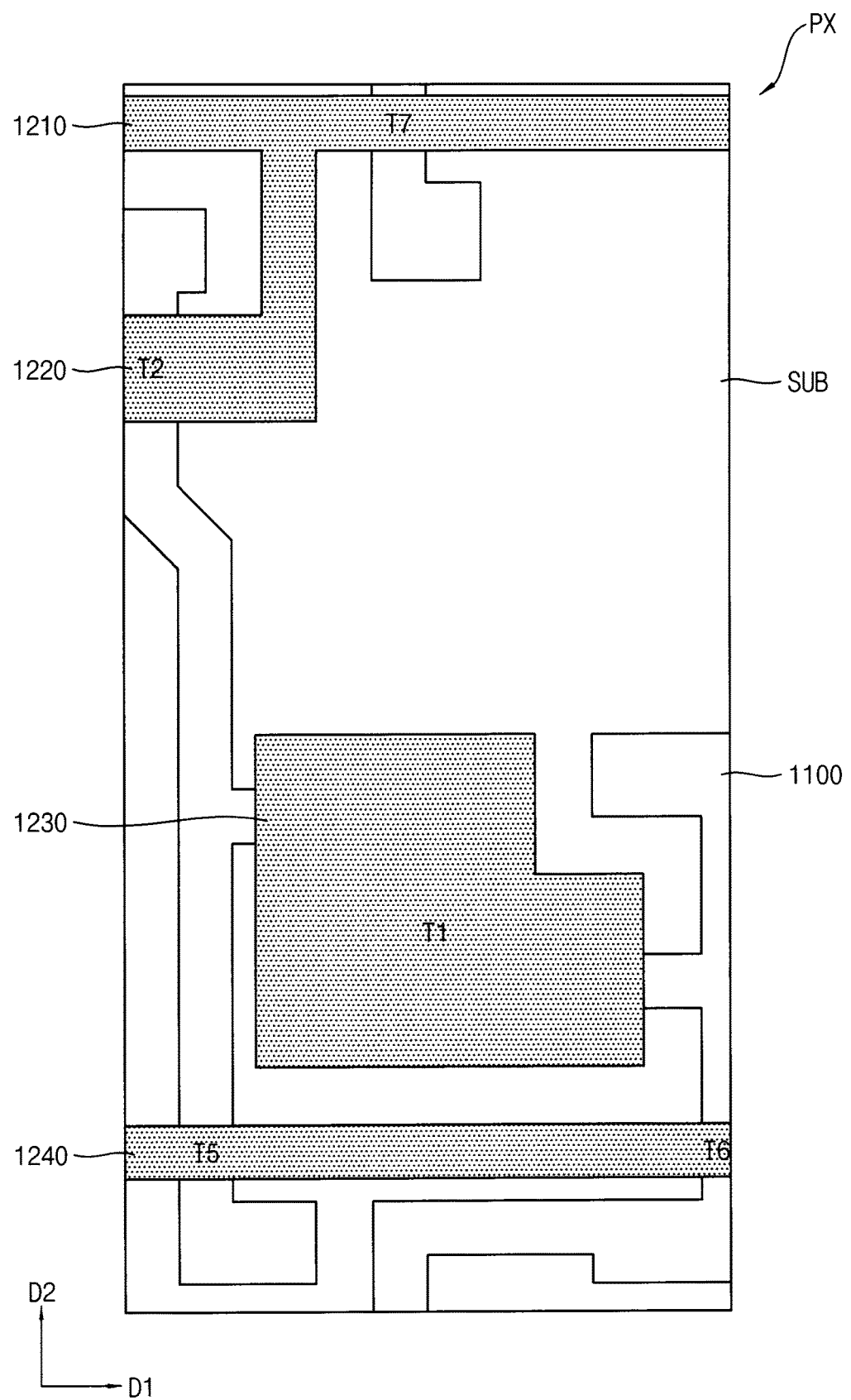

Referring to FIGS. 5 and 6, a first conductive pattern 1200 may be disposed on the first gate insulating layer. The first conductive pattern 1200 may include a fourth gate line 1210, a first gate line 1220, a first gate electrode 1230, and an emission management line 1240.

The fourth gate line 1210 may constitute the seventh transistor T7 together with a part of the first active pattern 1100. In one embodiment, for example, the fourth gate signal GB may be provided to the fourth gate line 1210.

The first gate line 1220 may constitute the second transistor T2 together with a part of the first active pattern 1100. In one embodiment, for example, the first gate signal GW may be provided to the first gate line 1220.

The first gate electrode 1230 may constitute the first transistor T1 together with a part of the first active pattern 1100. The emission management line 1240 may constitute the fifth and sixth transistors T5 and T6 together with parts of the first active pattern 1100.

In one embodiment, for example, the first conductive pattern 1200 may include a metal, an alloy, a conductive metal oxide, a transparent conductive material, or the like. In one embodiment, for example, the first conductive pattern 1200 may include at least one material selected from silver ("Ag"), an alloy containing silver, molybdenum ("Mo"), an alloy containing molybdenum, aluminum ("Al"), an alloy containing aluminum, Aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

A first interlayer insulating layer (e.g., a first interlayer insulating layer ILD1 of FIG. 17) may cover the first conductive pattern 1200 and may be disposed on the first gate insulating layer. The first interlayer insulating layer may include an insulating material.

In such an embodiment, the first, second, fifth, sixth, and seventh transistors T1, T2, T5, T6, and T7 may correspond to the first, second, fifth, sixth and seventh transistors T1, T2, T5, T6, and T7 described above with reference to FIG. 3. In one embodiment, for example, the first gate electrode 1230 may correspond to the gate terminal of the first transistor T1 described with reference to FIG. 3.

In such an embodiment, the gate terminals, the first terminals, and the second terminals described above with reference to FIG. 3 may substantially correspond to conductive patterns to be described later. However, this correspondence relationship will not be described in detail, and the correspondence will be apparent to those skilled in the relevant art.

Figure 7:
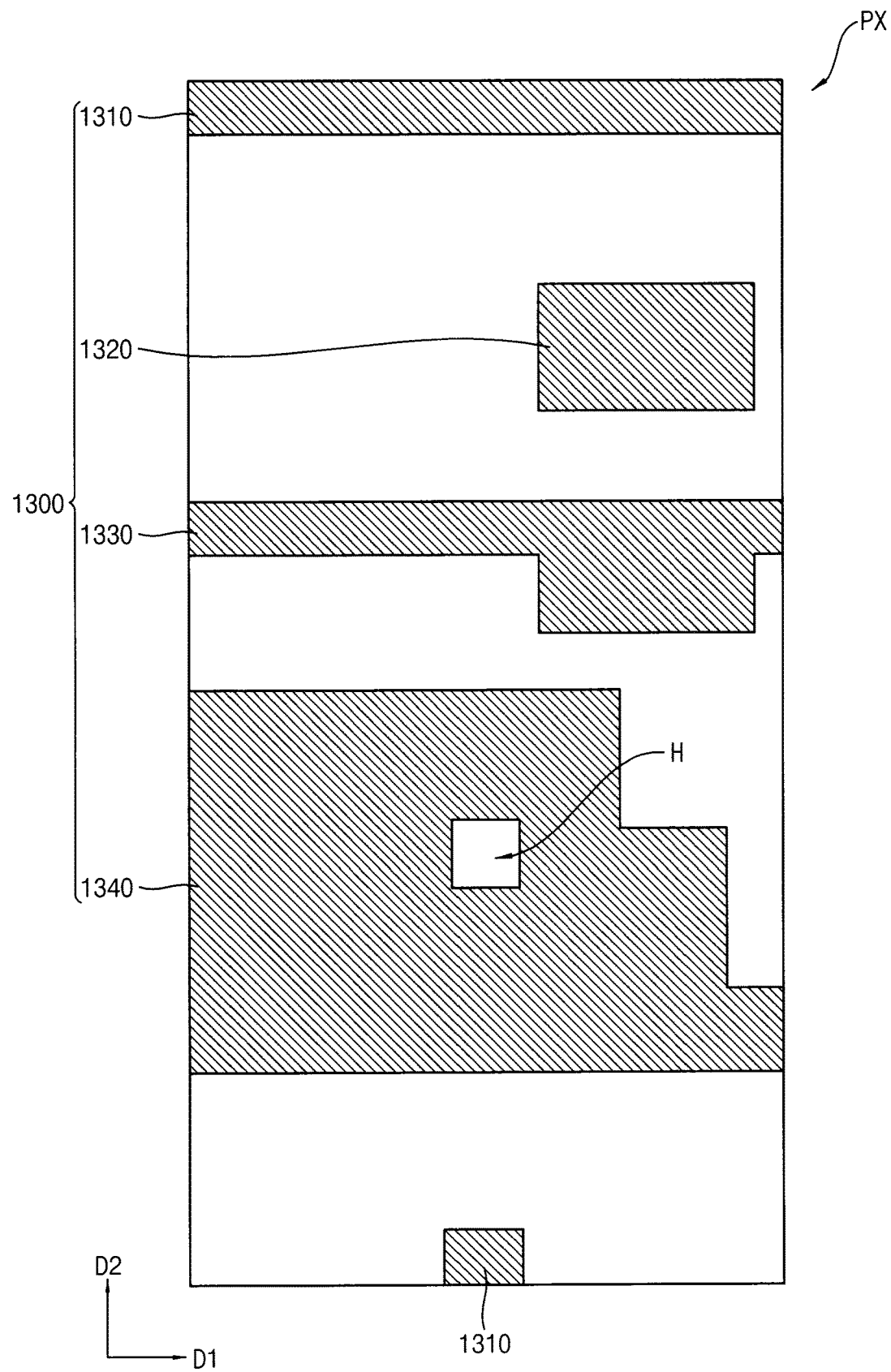
Figure 8:
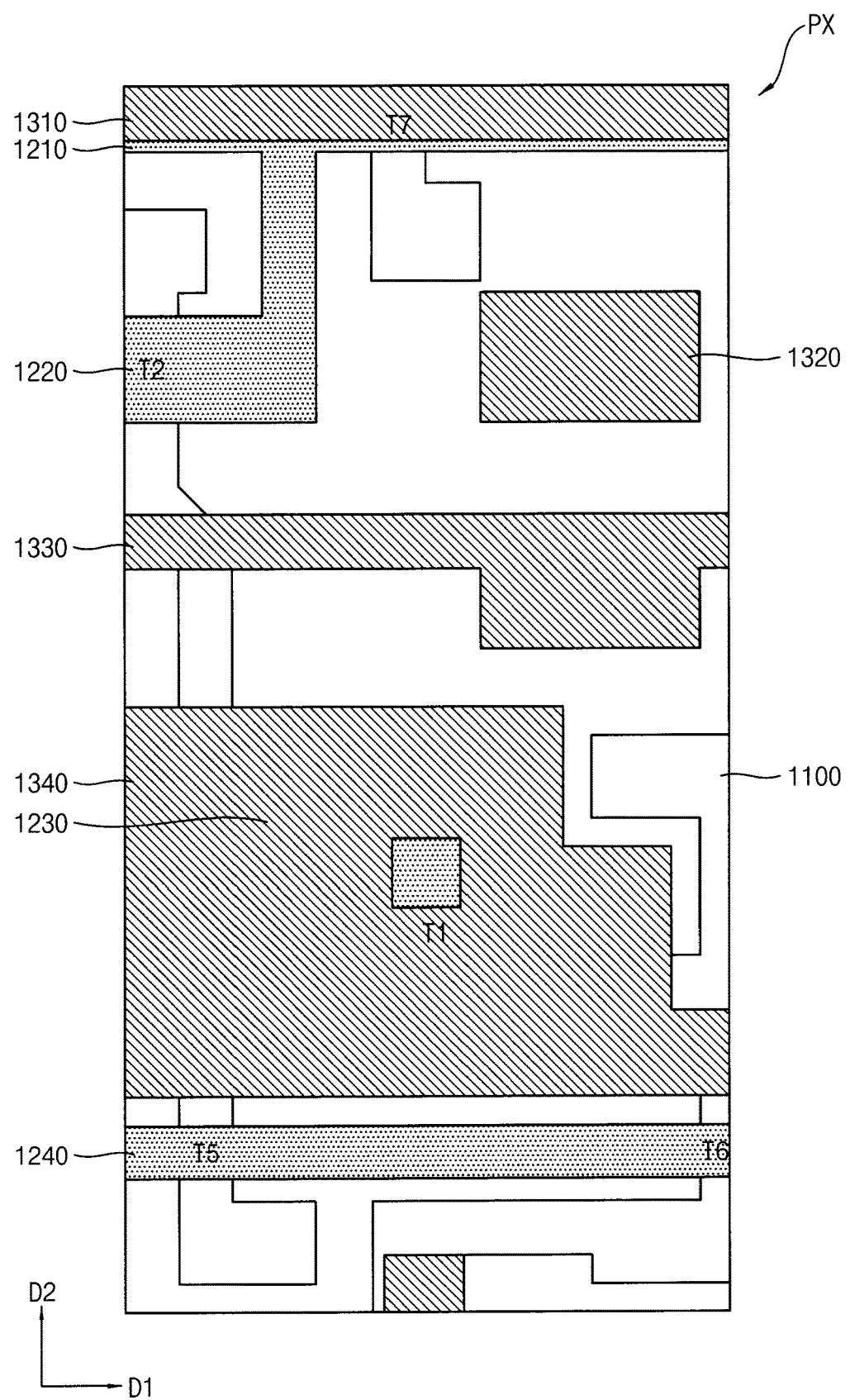

Referring to FIGS. 7 and 8, a second conductive pattern 1300 may be disposed on the first interlayer insulating layer. The second conductive pattern 1300 may include an anode initialization voltage line 1310, a first bottom gate electrode 1320, a second bottom gate electrode 1330, and a storage capacitor electrode 1340.

The anode initialization voltage line 1310 may provide the anode initialization voltage AINT to the seventh transistor T7.

The third gate signal GI may be provided to the first bottom gate electrode 1320. In an embodiment, the first bottom gate electrode 1320 may be disposed in an island shape along the first direction D1.

The second gate signal GC may be provided to the second bottom gate electrode 1330. In an embodiment, the second bottom gate electrode 1330 may extend in the first direction D1. In such an embodiment, the second bottom gate electrode 1330 may include a protrusion.

The storage capacitor electrode 1340 may constitute the storage capacitor CST together with the first gate electrode 1230. In one embodiment, for example, the storage capacitor electrode 1340 may overlap the first gate electrode 1230, and the high power voltage ELVDD may be provided to the storage capacitor electrode 1340. In an embodiment, an opening H may be defined through the storage capacitor electrode 1340. The gate terminal of the first transistor T1 and the second terminal of the third transistor T3 may be connected to each other through the opening H.

In one embodiment, for example, the second conductive pattern 1300 may include a metal, an alloy, a conductive metal oxide, a transparent conductive material, or the like.

A second interlayer insulating layer (e.g., a second interlayer insulating layer ILD2 in FIG. 17) may cover the second conductive pattern 1300 and may be disposed on the first interlayer insulating layer. The second interlayer insulating layer may include an insulating material.

Figure 9:
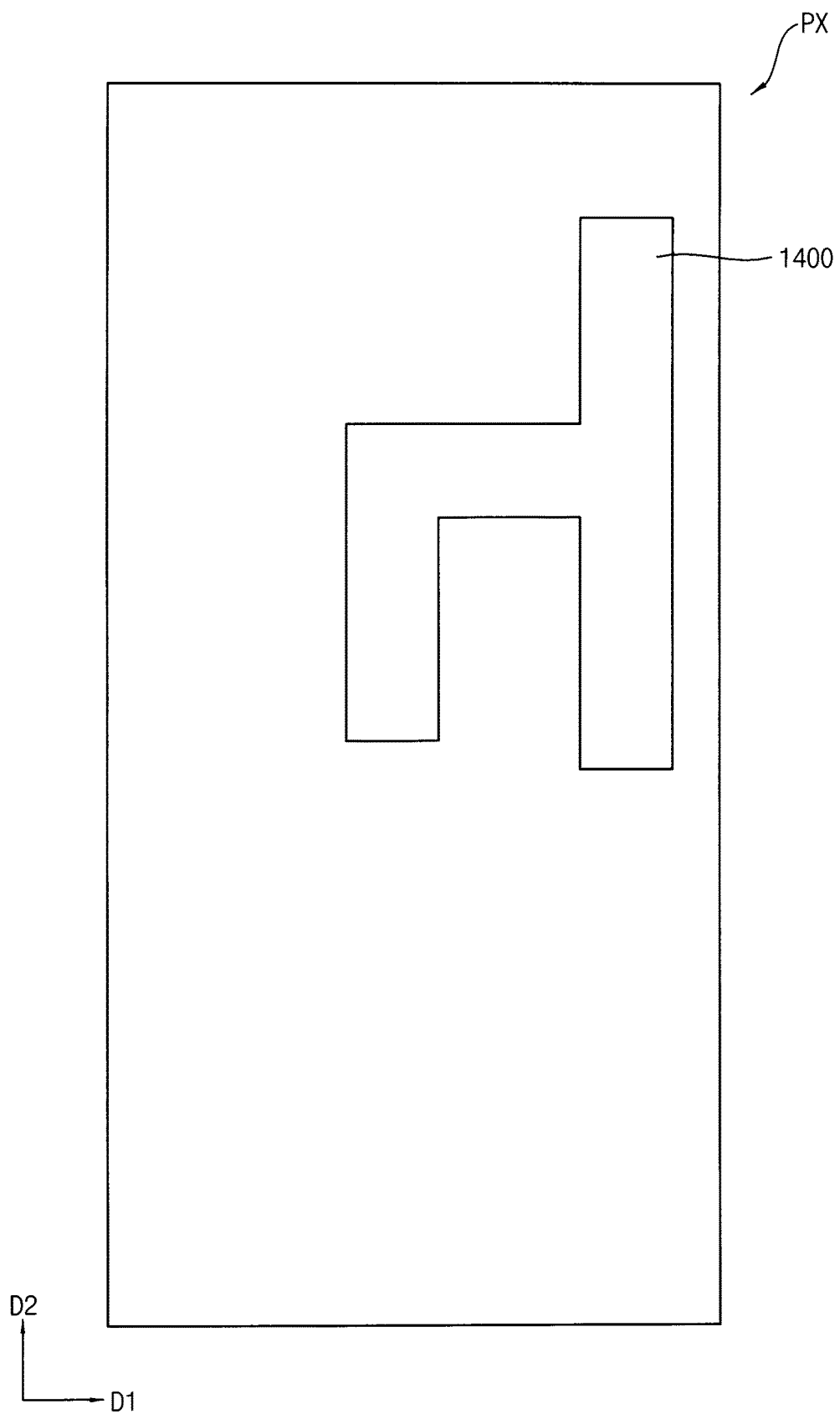
Figure 10:
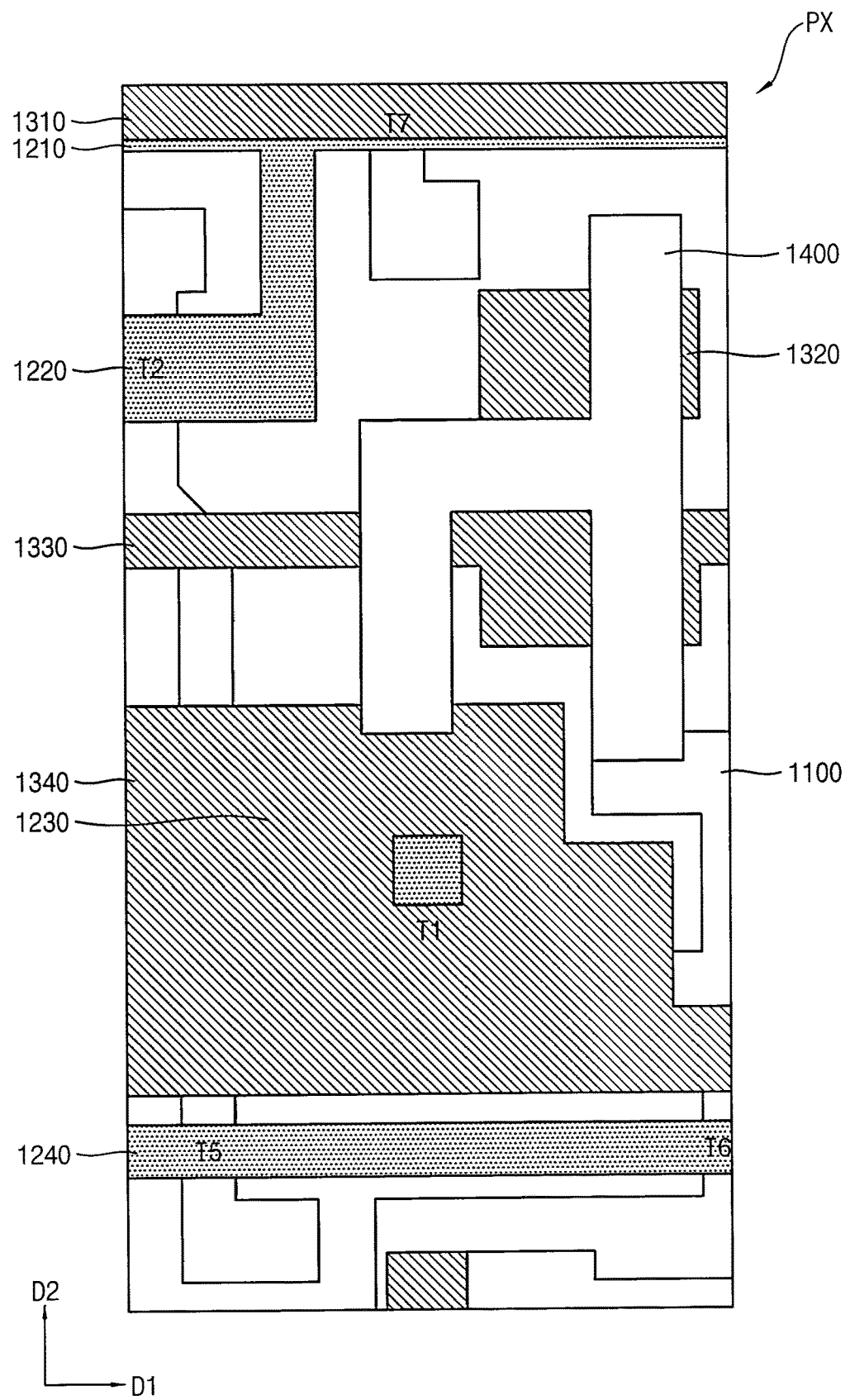

Referring to FIGS. 9 and 10, the second active pattern 1400 may be disposed on the second interlayer insulating layer. In one embodiment, for example, the second active pattern 1400 may overlap the first bottom gate electrode 1320 and the second bottom gate electrode 1330.

In an embodiment, the second active pattern 1400 may be disposed in a different layer from the first active pattern 1100 and may not overlap the first active pattern 1100. In one embodiment, for example, the second active pattern 1400 may be formed separately from the first active pattern 1100. In one embodiment, for example, the first active pattern 1100 may include the silicon semiconductor, and the second active pattern 1400 may include an oxide semiconductor.

In an embodiment, the pixel structure PX may include the first, second, fifth, sixth, and seventh transistors T1, T2, T5, T6, and T7, which are silicon-based semiconductor elements, and the third and fourth transistors T3 and T4 which are oxide-based semiconductor elements. In one embodiment, for example, the first, second, fifth, sixth and seventh transistors T1, T2, T5, T6, and T7 may be the PMOS transistors, and the third and fourth transistors T3 and T4 may be the NMOS transistors.

A second gate insulating layer (e.g., a second gate insulating layer GI2 in FIG. 17) may cover the second active pattern 1400 and may be disposed on the second interlayer insulating layer. The second gate insulating layer may include an insulating material.

Figure 11:
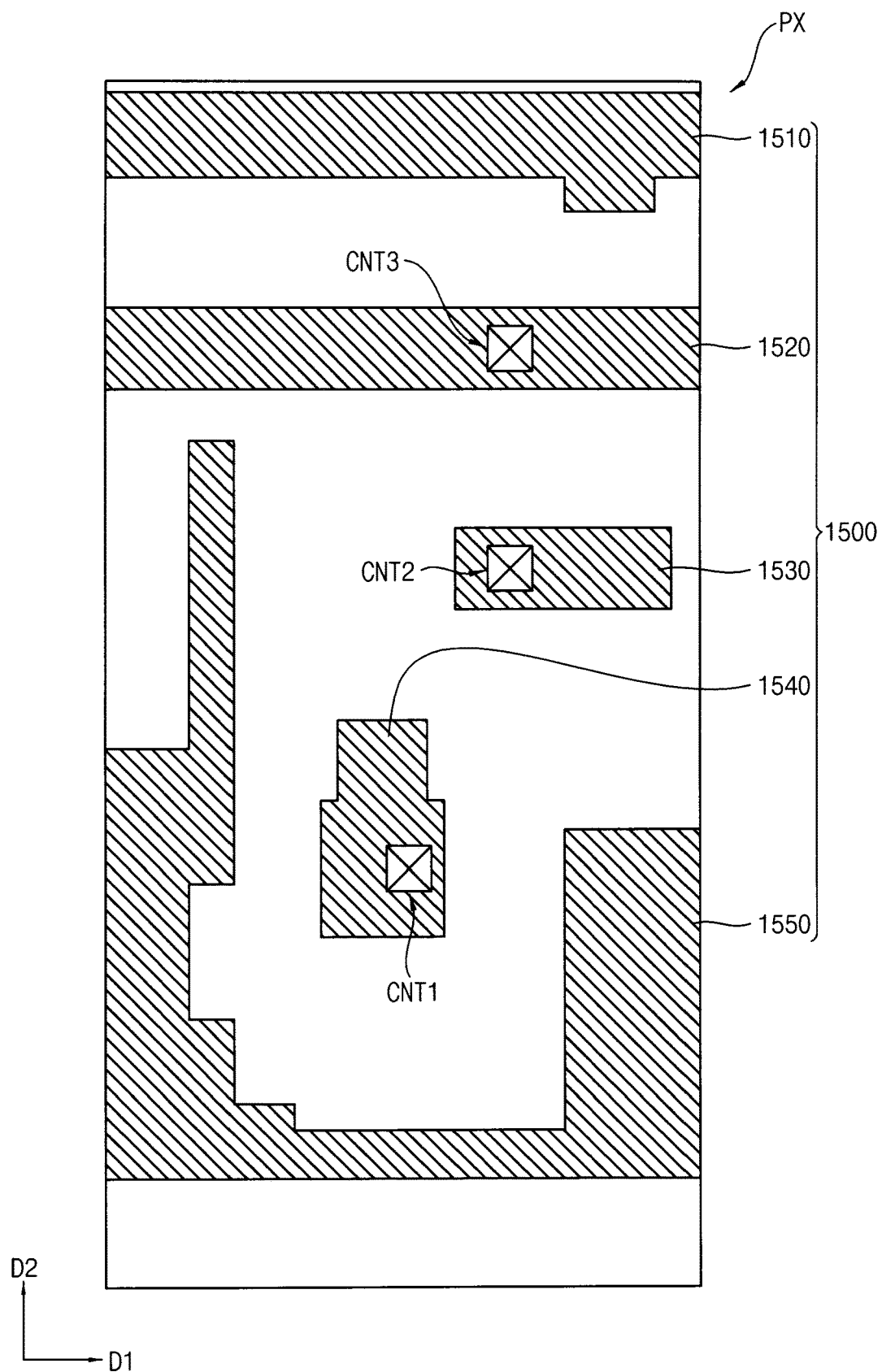
Figure 12:
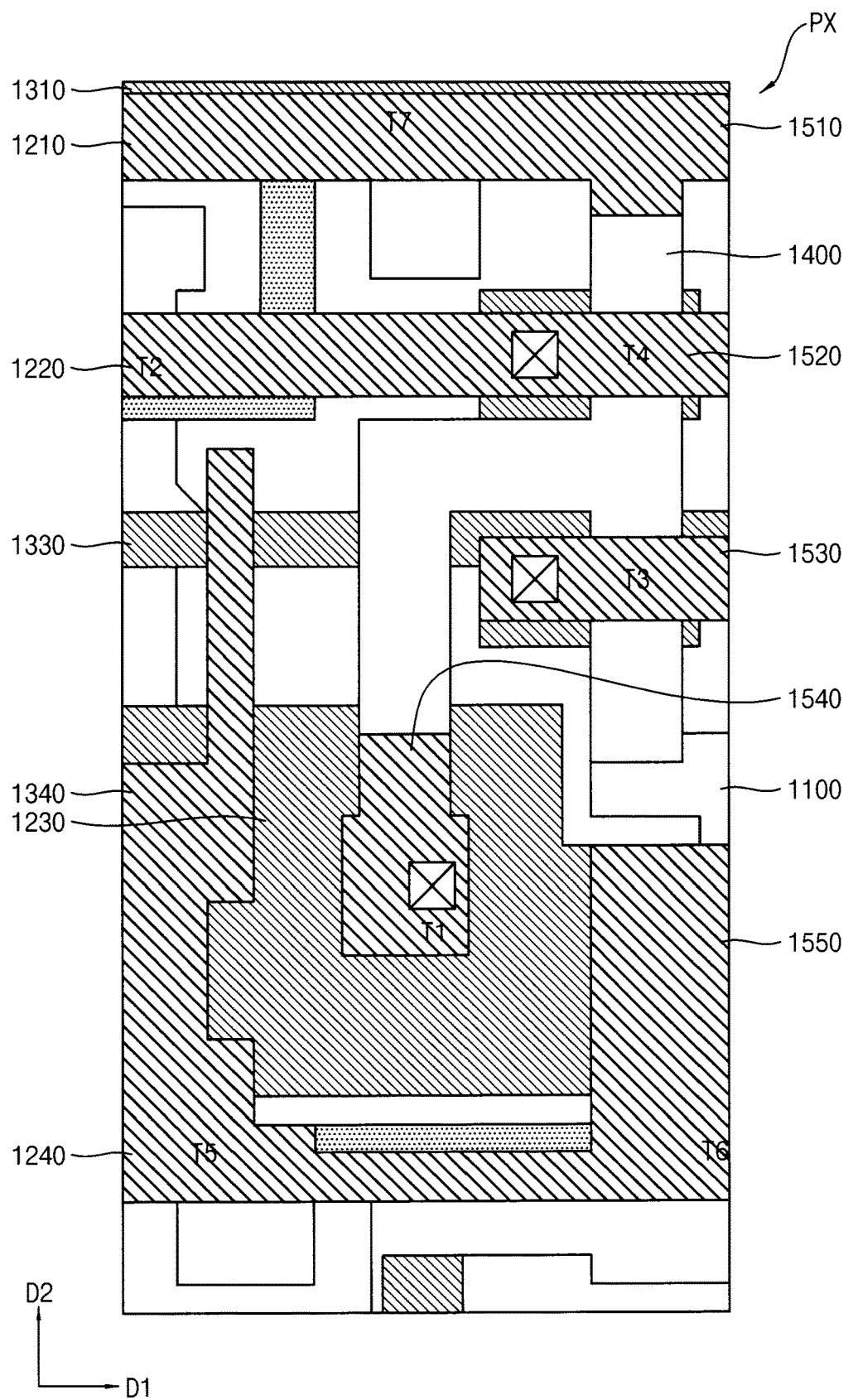

Referring to FIGS. 11 and 12, a third conductive pattern 1500 may be disposed on the second gate insulating layer. The third conductive pattern 1500 may include a gate initialization voltage line 1510, a third gate electrode 1520, a second gate electrode 1530, a first connecting pattern 1540, and a shielding pattern 1550.

The gate initialization voltage line 1510 may transfer the gate initialization voltage VINT to the fourth transistor T4.

The third gate electrode 1520 may constitute the fourth transistor T4 together with a part of the second active pattern 1400. In one embodiment, for example, the third gate signal GI may be provided to the third gate electrode 1520.

In an embodiment, the third gate electrode 1520 may overlap a third contact hole CNT3. The third gate electrode 1520 may contact the first bottom gate electrode 1320 through the third contact hole CNT3.

The second gate electrode 1530 may constitute the third transistor T3 together with a part of the second active pattern 1400. In one embodiment, for example, the second gate signal GC may be provided to the second gate electrode 1530.

In an embodiment, the second gate electrode 1530 may overlap a second contact hole CNT2. The second gate electrode 1530 may contact the second bottom gate electrode 1330 through the second contact hole CNT2. In one embodiment, for example, the second contact hole CNT may overlap the protrusion of the second bottom gate electrode 1330.

The first connecting pattern 1540 may be configured to connect the gate terminal of the first transistor T1 and the second terminal of the third transistor T3.

In an embodiment, the first connecting pattern 1540 may contact the first gate electrode 1230. In one embodiment, for example, the first connecting pattern 1540 may overlap a first contact hole CNT1. The first contact hole CNT1 may overlap the opening H of the storage capacitor electrode 1340. The first connecting pattern 1540 may contact the first gate electrode 1230 through the first contact hole CNT1.

In an embodiment, the shielding pattern 1550 may be disposed to surround the first connection pattern 1540 on a plane, or when viewed from a plan view in a thickness direction of the display device (a direction perpendicular to the first and second direction D1 and D2). In one embodiment, for example, the second gate electrode 1530 may be disposed in an island shape along the first direction D1 to secure a space in which the shielding pattern 1550 is to be disposed.

A third interlayer insulating layer (e.g., a third interlayer insulating layer ILD3 of FIG. 17) may cover the third conductive pattern 1500 and may be disposed on the second gate insulating layer. The third interlayer insulating layer may include an insulating material.

Figure 13:
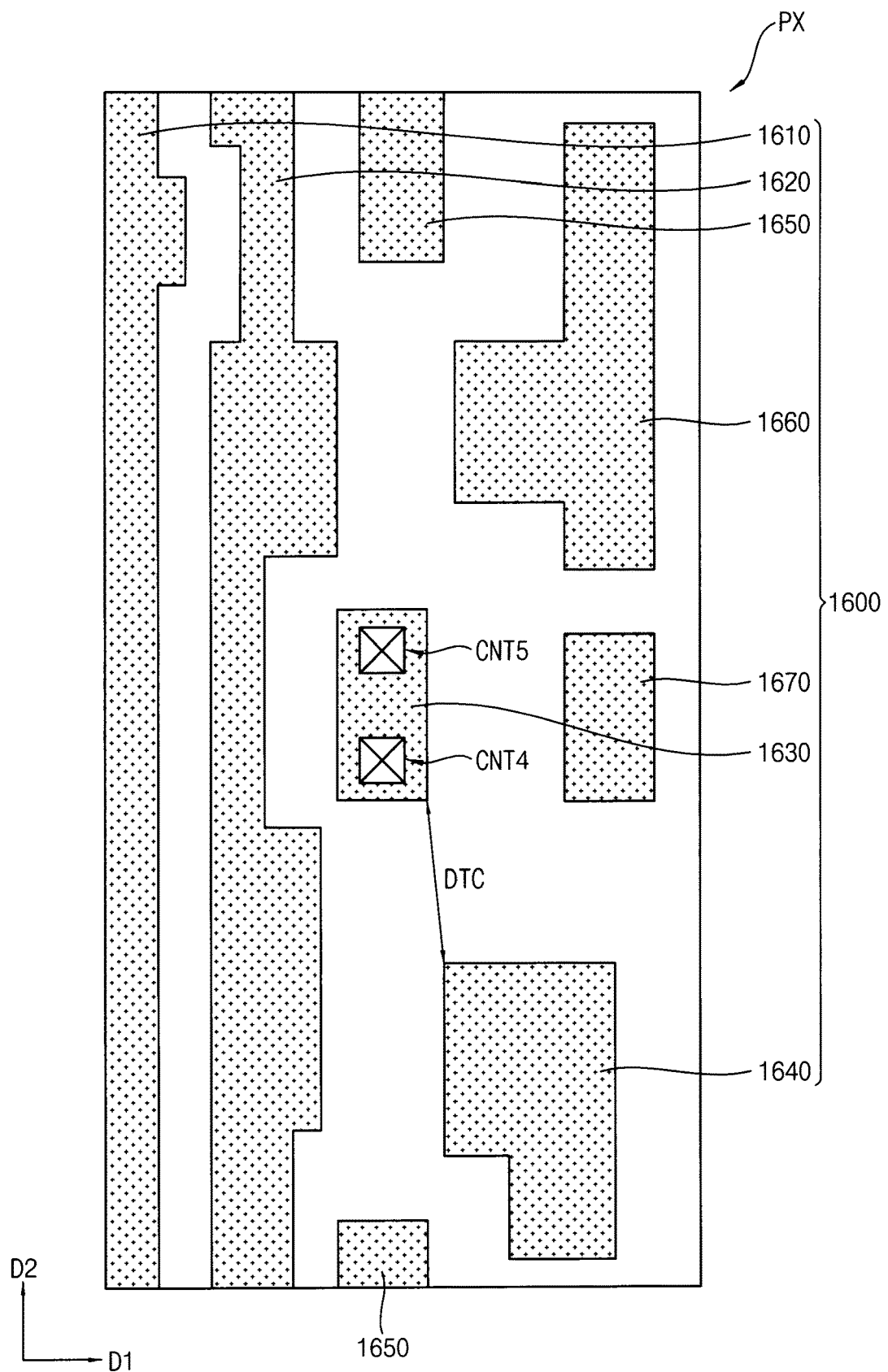
Figure 14:
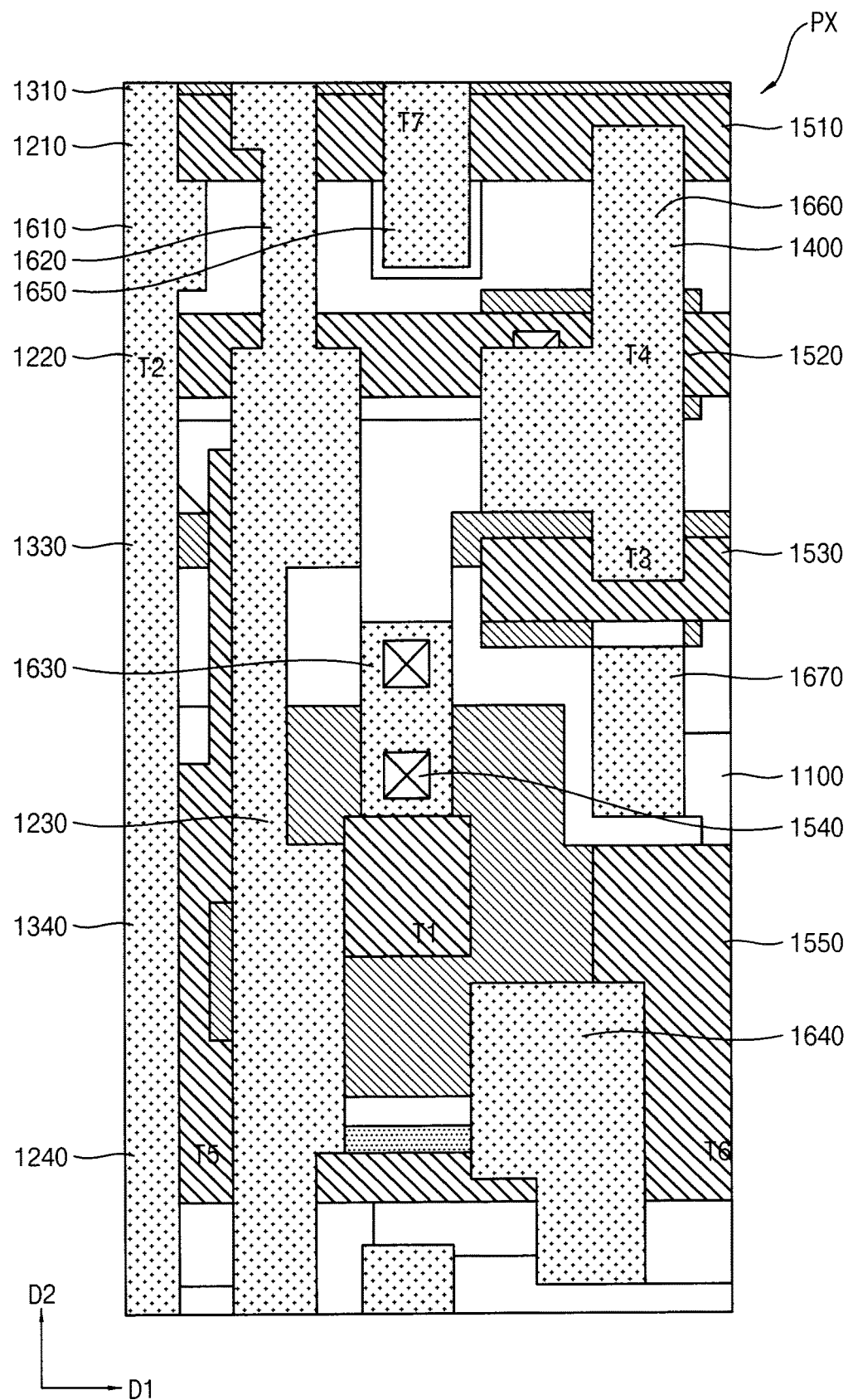

Referring to FIGS. 13 and 14, a fourth conductive pattern 1600 may be disposed on the third interlayer insulating layer. The fourth conductive pattern 1600 may include a data line 1610, a high power voltage line 1620, a second connecting pattern 1630, a first pad 1640, an anode initialization voltage connecting pattern 1650, a gate initialization voltage connecting pattern 1660, and a compensation connecting pattern 1670.

The data voltage DATA may be provided to the data line 1610. The data line 1610 may transfer the data voltage DATA to the second transistor T2. In one embodiment, for example, the data line 1610 may correspond to one of the first to fourth data lines DL1, DL2, DL3, and DL4 described above with reference to FIG. 2.

In an embodiment, the data line 1610 may overlap the shielding pattern 1550. In such an embodiment, the shielding pattern 1550 may be disposed in a same layer as the first connecting pattern 1540, and may be disposed between the first connecting pattern 1540 and the data line 1610.

The high power voltage ELVDD may be provided to the high power voltage line 1620. The high power voltage line 1620 may transfer the high power voltage ELVDD to the fifth transistor T5. In an embodiment, the high power voltage line 1620 may transfer the high power voltage ELVDD to the shielding pattern 1550. In one embodiment, for example, the high power voltage line 1620 may correspond to the driving voltage line PL described with reference to FIG. 1.

The first and second connecting patterns 1540 and 1630 may be configured to connect the gate terminal of the first transistor T1 and the second terminal of the third transistor T3.

The second connecting pattern 1630 may be disposed on the first connecting pattern 1540. In an embodiment, the second connecting pattern 1630 may partially overlap the first connecting pattern 1540. In one embodiment, for example, the second connecting pattern 1630 may not overlap with the first contact hole CNT1. In such an embodiment, the second connecting pattern 1630 may not overlap the opening H of the storage capacitor electrode 1340.

In an embodiment, the second connecting pattern 1630 may overlap the fourth contact hole CNT4 and the fifth contact hole CNT5. In one embodiment, for example, the fourth contact hole CNT4 may expose an upper surface of the first connecting pattern 1540, and the second connecting pattern 1630 may contact the first connecting pattern 1540. In one embodiment, for example, the fifth contact hole CNT5 may expose an upper surface of the second active pattern 1400, and the second connecting pattern 1630 may contact the second active pattern 1400.

In an embodiment, the first, fourth and fifth contact holes CNT1, CNT4, and CNT5 may be spaced apart from each other. In one embodiment, for example, the first and fourth contact holes CNT1 and CNT4 may be spaced apart from each other, such that the second connecting pattern 1630 may be formed to have a minimum planar area.

The first pad 1640 may be configured to connect the second terminal of the sixth transistor T6 and the first terminal of the organic light emitting diode OLED. In an embodiment, the first pad 1640 may be spaced apart from the second connecting pattern 1630 by a predetermined distance DTC. In one embodiment, for example, as the planar area of the second connecting pattern 1630 decreases, a planar area of the pixel structure PX may decrease. Accordingly, a resolution of the display device 10 may be increased.

The anode initialization voltage connecting pattern 1650 may electrically connect the anode initialization voltage line 1310 and the first active pattern 1100. In one embodiment, for example, the anode initialization voltage AINT transferred through the anode initialization voltage line 1310 may be provided to the seventh transistor T7 through the anode initialization voltage connecting pattern 1650.

The gate initialization voltage connecting pattern 1660 may electrically connect the gate initialization voltage line 1510 and the second active pattern 1400. In one embodiment, for example, the gate initialization voltage VINT transferred through the gate initialization voltage line 1510 may be provided to the fourth transistor T4 through the gate initialization voltage connecting pattern 1660. In an embodiment, the gate initialization voltage connecting pattern 1660 may provide the gate initialization voltage VINT to a light blocking pattern (e.g., a light blocking pattern 1730 in FIG. 15) to be described later.

The compensation connecting pattern 1670 may electrically connect the second active pattern 1400 and the first active pattern 1100. In one embodiment, for example, the first terminal of the third transistor T3 (e.g., the source terminal of the third transistor T3) may be connected to the second terminal the first transistor T1 (e.g. the drain terminal of the first transistor T1) through the compensation connecting pattern 1670.

A first via insulating layer (e.g., a first via insulating layer VIAL in FIG. 17) may cover the fourth conductive pattern 1600 and may be disposed on the third interlayer insulating layer. The first via insulating layer may include an organic insulating material. In one embodiment, for example, the first via insulating layer may include a photoresist, a polyacrylic resin, a polyimide resin, an acrylic resin, or the like.

Figure 15:
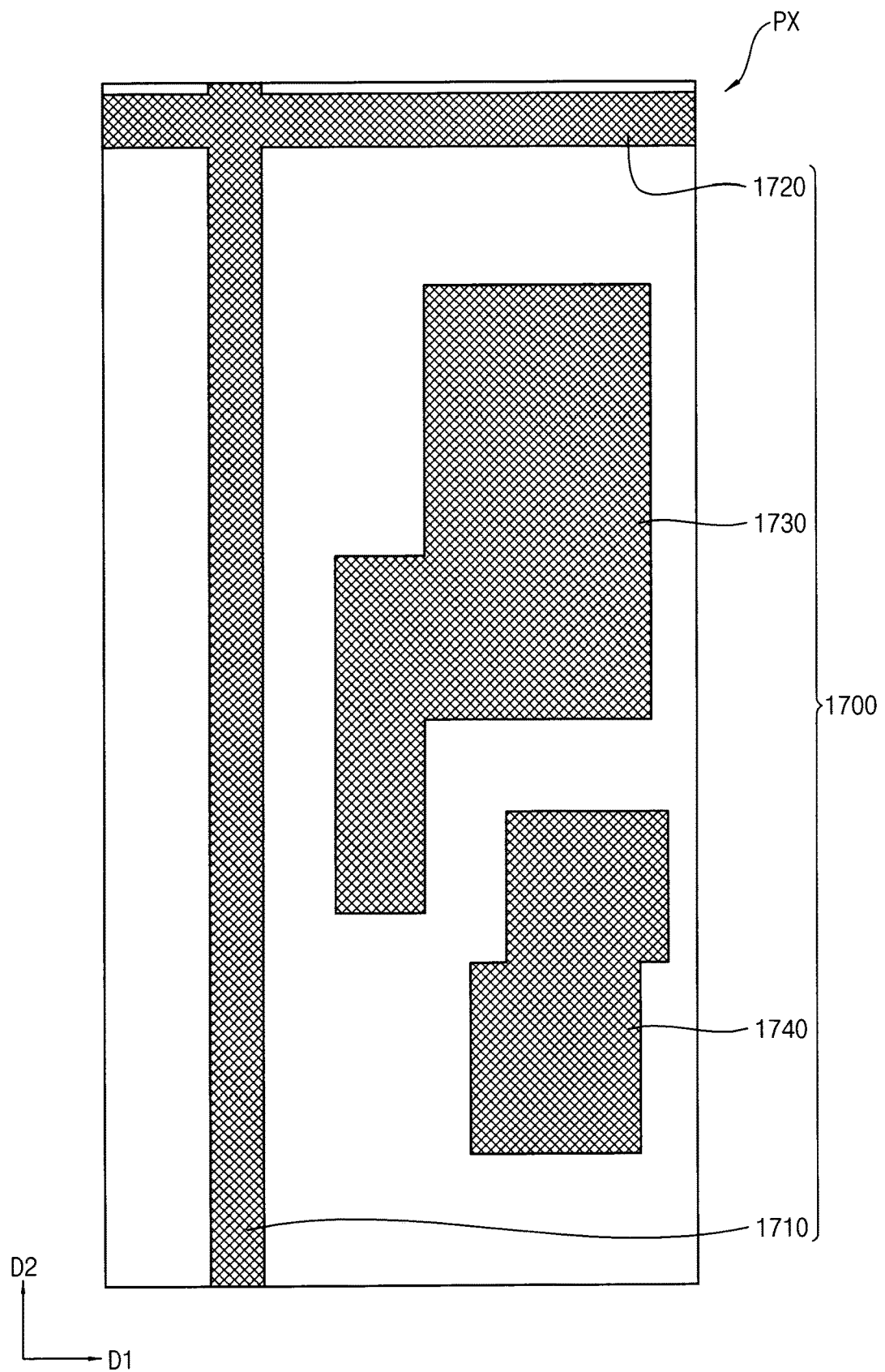
Figure 16:
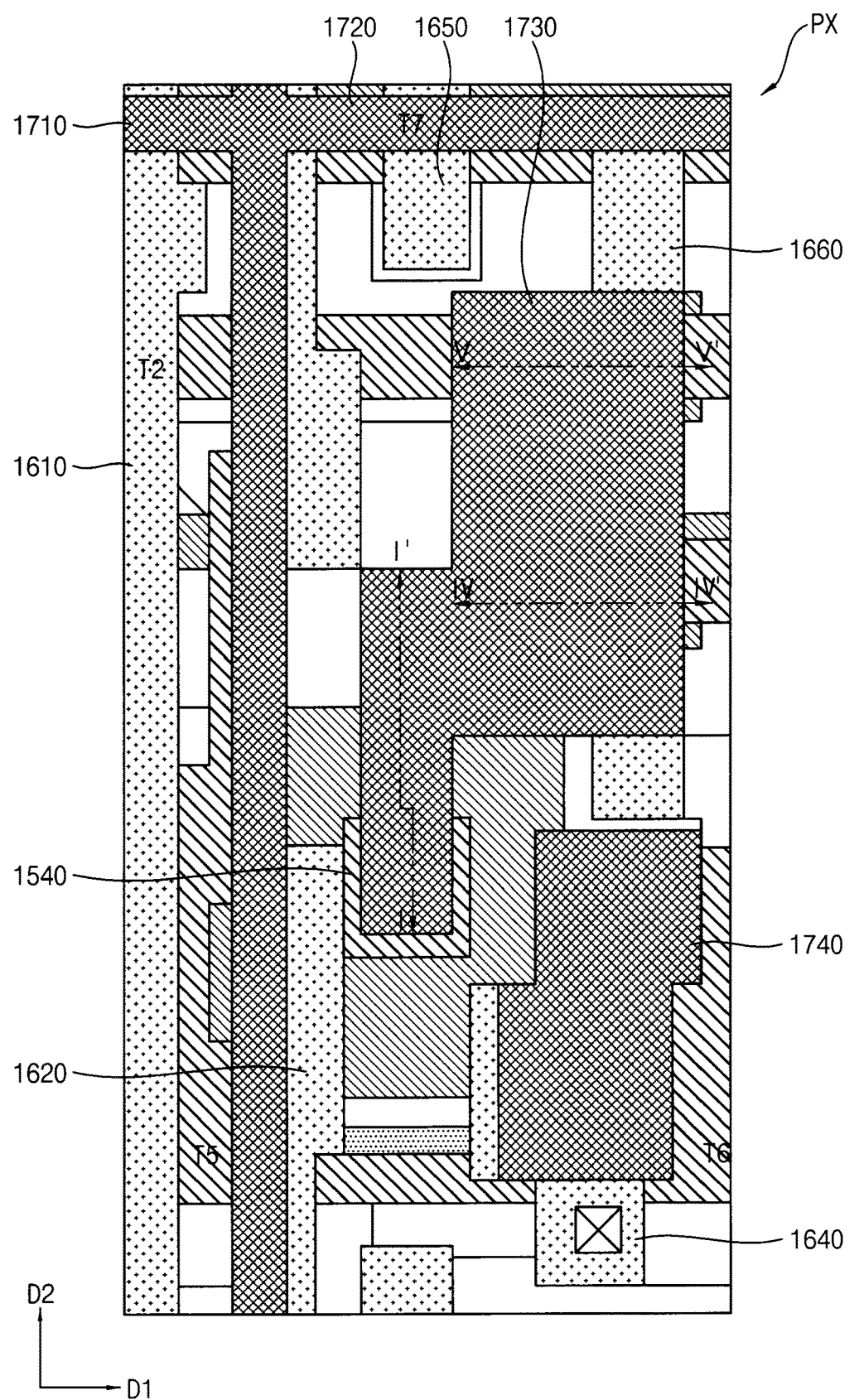

Referring to FIGS. 15 and 16, the fifth conductive pattern 1700 may be disposed on the first via insulating layer. The fifth conductive pattern 1700 may include a first connecting line 1710 extending in the second direction D2, a second connecting line 1720 extending in the first direction D1, a light blocking pattern 1730, and a second pad 1740.

The data voltage DATA may be provided to the first and second connecting lines 1710 and 1720. In an embodiment, the first and second connecting lines 1710 and 1720 may be disposed in the display area DA. In one embodiment, for example, the first and second connecting lines 1710 and 1720 may overlap the first active pattern 1100.

In an embodiment, the first and second connecting lines 1710 and 1720 may provide the data voltage DATA to the data line 1610. In one embodiment, for example, the first and second connecting lines 1710 and 1720 may correspond to one of the first and second connecting lines FL1 and FL2 described above with reference to FIG. 2.

In an embodiment, the light blocking pattern 1730 may overlap the second active pattern 1400. In one embodiment, for example, the second active pattern 1400 may include an oxide semiconductor. When the oxide semiconductor is exposed to light, a leakage current may be generated through the third and fourth transistors T3 and T4 including the oxide semiconductor. In this case, the light may be external light or light generated by the organic light emitting diode OLED. In an embodiment, the light blocking pattern 1730 may overlap the second active pattern 1400 to effectively prevent the second active pattern 1400 from being exposed to the light.

In an embodiment, the gate initialization voltage VINT may be provided to the light blocking pattern 1730. In one embodiment, for example, the light blocking pattern 1730 contacts the gate initialization voltage connecting pattern 1660, such that the light blocking pattern 1730 may receive the gate initialization voltage VINT.

The first and second pads 1640 and 1740 may be configured to connect the second terminal of the sixth transistor T6 and the first terminal of the organic light emitting device OLED. In one embodiment, for example, the second pad 1740 may partially overlap the first pad 1640.

A second via insulating layer (e.g., a second via insulating layer VIA2 in FIG. 21) may cover the fifth conductive pattern 1700 and may be disposed on the first via insulating layer. The second via insulating layer may include an organic insulating material.

In an embodiment, a first electrode (e.g., a first electrode 1810 in FIG. 21), a pixel defining layer (e.g., a pixel defining layer PDL in FIG. 21), a light emitting layer (e.g., a light emitting layer 1820 in FIG. 21), and a second electrode (e.g., a second electrode 1830 in FIG. 21) may be sequentially disposed on the second via insulating layer. In an embodiment, the first electrode may correspond to the first terminal of the organic light emitting diode OLED, and the second electrode may correspond to the second terminal of the organic light emitting diode OLED. In one embodiment, for example, the first electrode may contact the second pad 1740.

Figure 17:
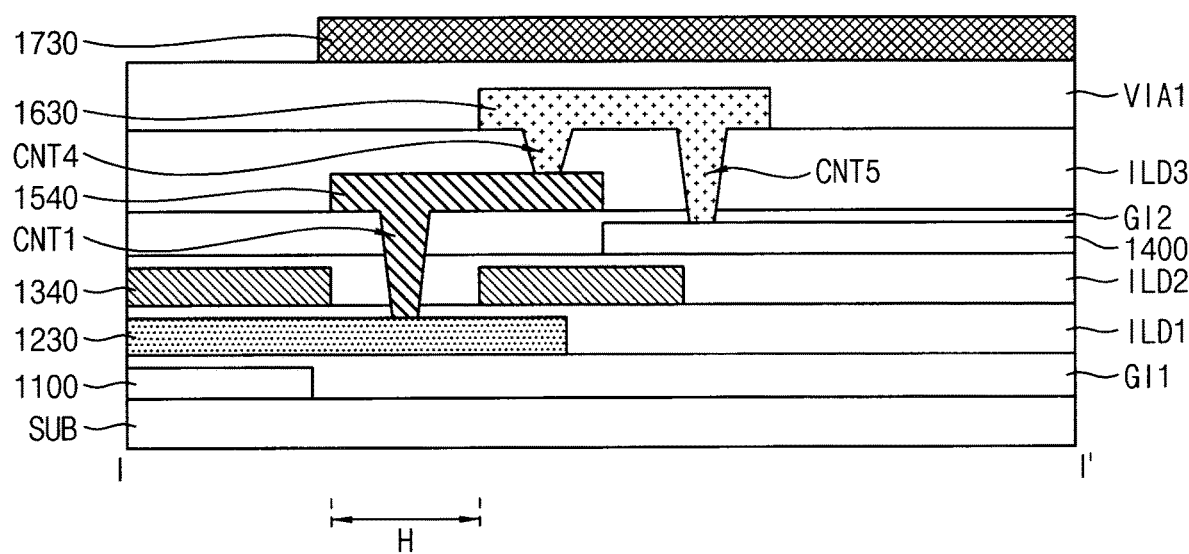
FIG. 17 is a cross-sectional view taken along line I-I' of FIG. 16.

FIG. 17 is a cross-sectional view taken along line I-I' of FIG. 16. Specifically, FIG. 17 may be a cross-sectional view illustrating a part of the first transistor and a part of the third transistor.

Referring to FIGS. 16 and 17, the first active pattern 1100, the first gate electrode 1230, the storage capacitor electrode 1340, the second active pattern 1400, the first connecting pattern 1540, the second connecting pattern 1630, and the light blocking pattern 1730 may be sequentially disposed on the substrate SUB.

In an embodiment, the first contact hole CNT1 may be defined or formed in the first interlayer insulating layer ILD1, the second interlayer insulating layer ILD2, and the second gate insulating layer GI2. The first contact hole CNT1 may overlap the opening H of the storage capacitor electrode 1340 and the first connecting pattern 1540. The first contact hole CNT1 may expose an upper surface of the first gate electrode 1230.

In an embodiment, the first connecting pattern 1540 may contact the first gate electrode 1230 through the first contact hole CNT1.

In an embodiment, the fourth contact hole CNT4 may be defined or formed in the third interlayer insulating layer ILD3. The fourth contact hole CNT4 may overlap the first connecting pattern 1540. The fourth contact hole CNT4 may expose an upper surface of the first connecting pattern 1540. In such an embodiment, the fourth contact hole CNT4 may not overlap the first contact hole CNT1 and the opening H.

In an embodiment, the second connecting pattern 1630 may contact the first connecting pattern 1540 through the fourth contact hole CNT4. In one embodiment, for example, the second connecting pattern 1630 may partially overlap the first connecting pattern 1540. In such an embodiment, the second connecting pattern 1630 may not overlap the first contact hole CNT1. Accordingly, in such an embodiment, an area of the second connecting pattern 1630 on a plane may be reduced. Therefore, as described above with reference to FIG. 13, the area of the pixel structure PX on a plane may be reduced, and the resolution of the display device 10 may be increased.

In an embodiment, the fifth contact hole CNT5 may be defined or formed in the second gate insulating layer GI2 and the third interlayer insulating layer ILD3. The fifth contact hole CNT5 may overlap the second active pattern 1400. The fifth contact hole CNT5 may expose an upper surface of the second active pattern 1400.

In an embodiment, the second connecting pattern 1630 may contact the second active pattern 1400 through the fifth contact hole CNT5. In one embodiment, for example, a part of the second active pattern 1400 exposed by the fifth contact hole CNT5 may correspond to the second terminal of the third transistor T3. Accordingly, in such an embodiment, the gate terminal of the first transistor T1 and the second terminal of the third transistor T3 may be electrically connected to each other by the first and second connecting patterns 1540 and 1630.

In an embodiment, the light blocking pattern 1730 may overlap the first and second connecting patterns 1540 and 1630.

Figure 18:
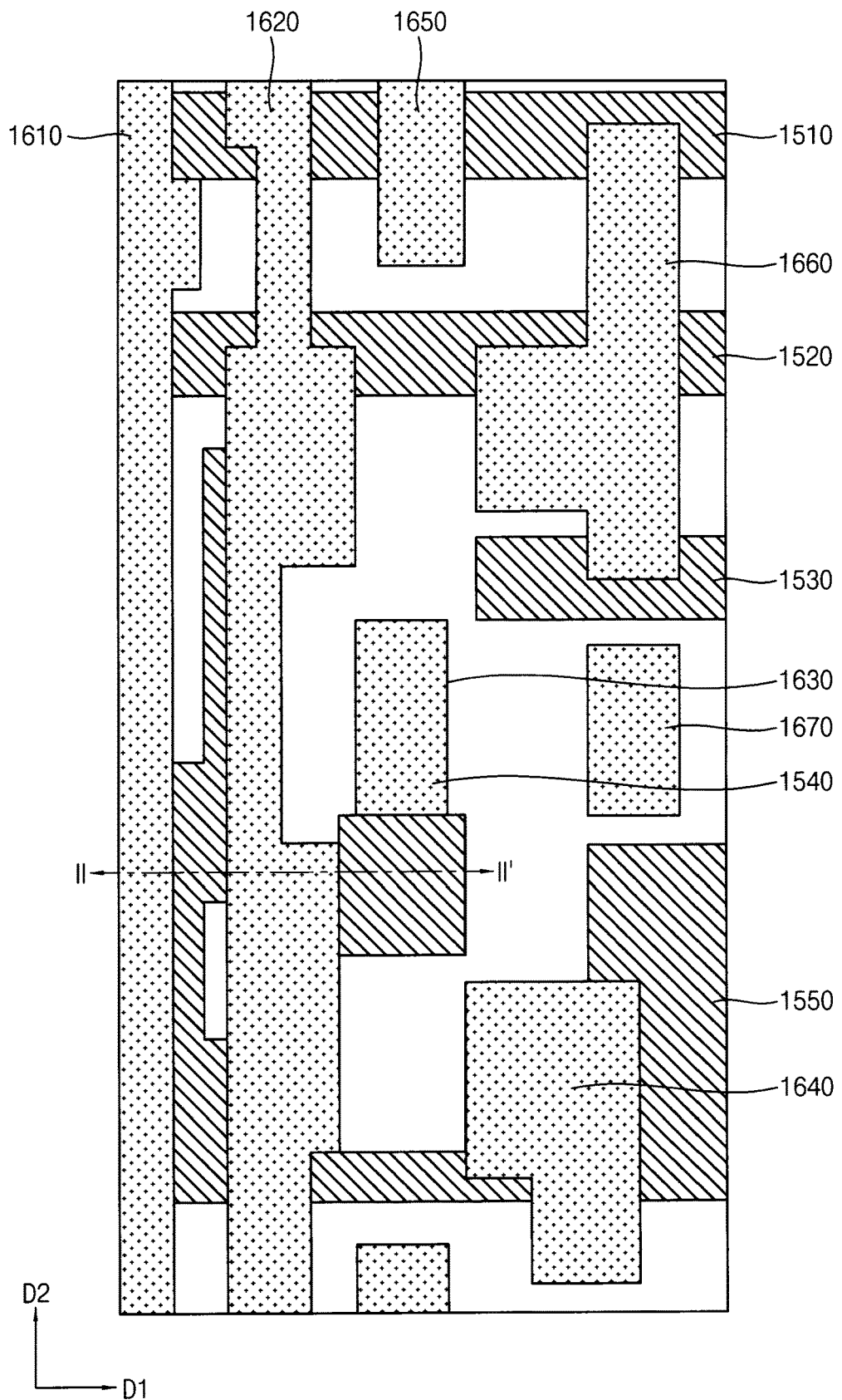
FIG. 18 is a plan view illustrating a third conductive pattern and a fourth conductive pattern included in the display device of FIG. 1.
Figure 19:
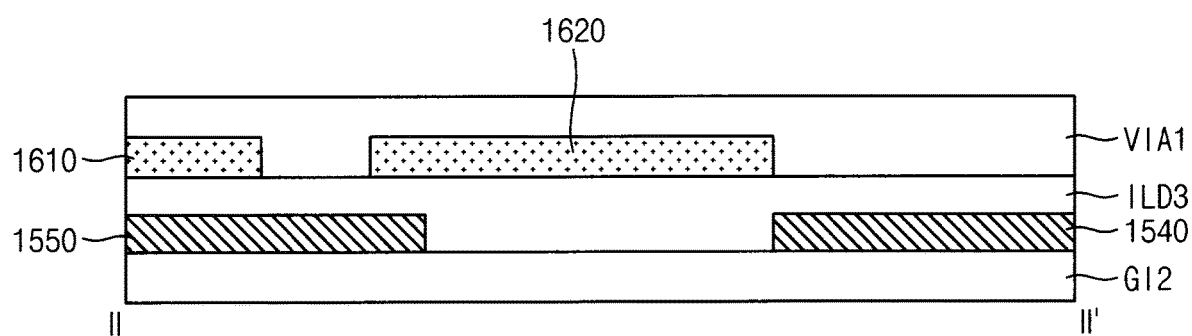
FIG. 19 is a cross-sectional view taken along line II-IF of FIG. 18.

FIG. 18 is a plan view illustrating a third conductive pattern and a fourth conductive pattern included in the display device of FIG. 1. FIG. 19 is a cross-sectional view taken along line II-IF of FIG. 18.

Referring to FIGS. 18 and 19, the shielding pattern 1550 may be disposed in a same layer as the first connecting pattern 1540, and may be disposed under the data line 1610. The high power voltage line 1620, to which the high power voltage ELVDD is provided, may be disposed in a same layer as the data line 1610.

In an embodiment, the shielding pattern 1550 may shield the first connecting pattern 1540. In one embodiment, for example, a constant voltage may be provided to the shielding pattern 1550. In one embodiment, for example, the constant voltage may be the high power voltage ELVDD. In such an embodiment, the shielding pattern 1550 may prevent a crosstalk between the first connecting pattern 1540 and the data line 1610 by providing the high power voltage ELVDD to the shielding pattern 1550. In one embodiment, for example, the shielding pattern 1550 may be disposed to surround the first connecting pattern 1540 on a plane. Accordingly, the shielding pattern 1550 may overlap the data line 1610 and may extend toward the first connecting pattern 1540.

Figure 20:
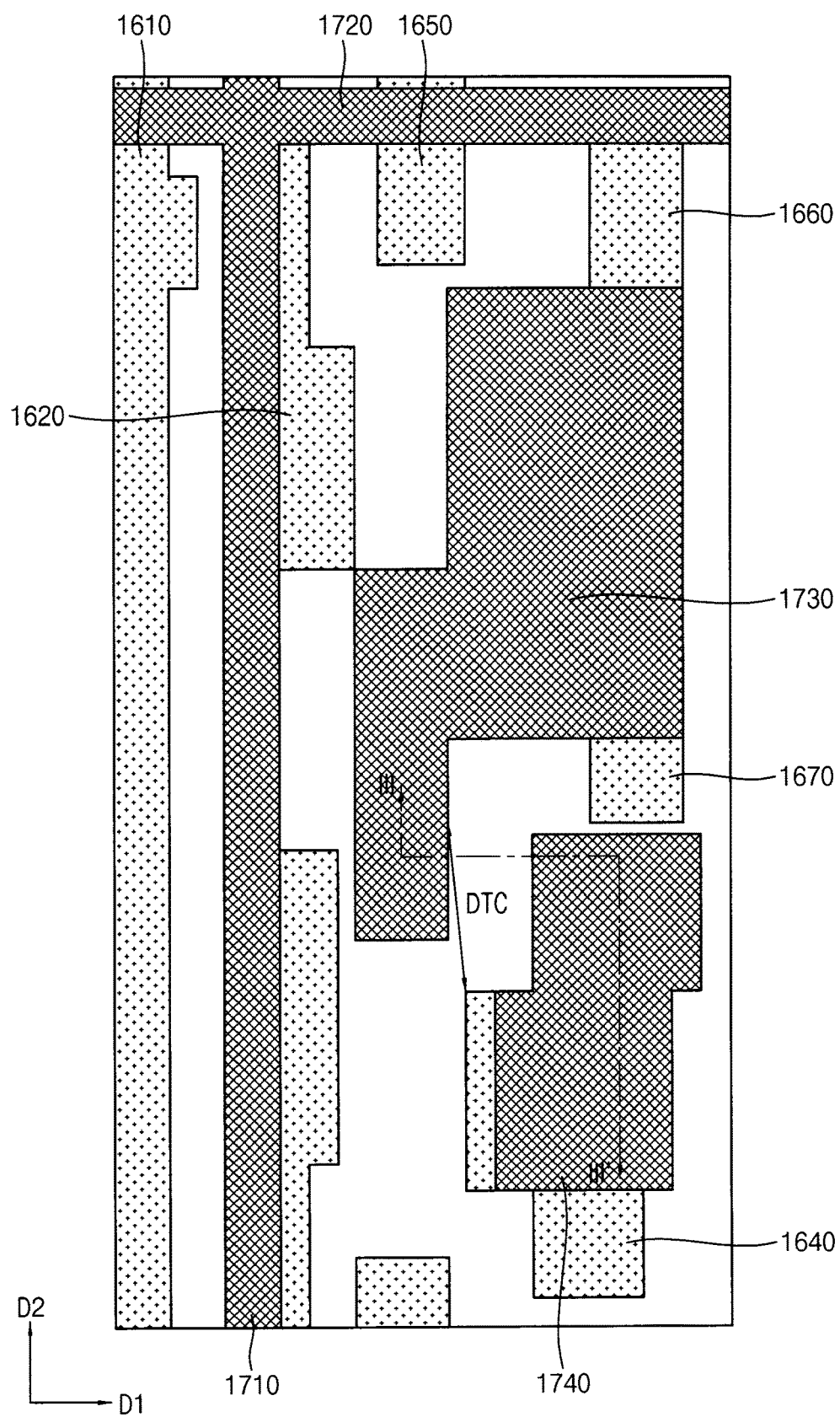
FIG. 20 is a plan view illustrating a fourth conductive pattern and a fifth conductive pattern included in the display device of FIG. 1.
Figure 21:
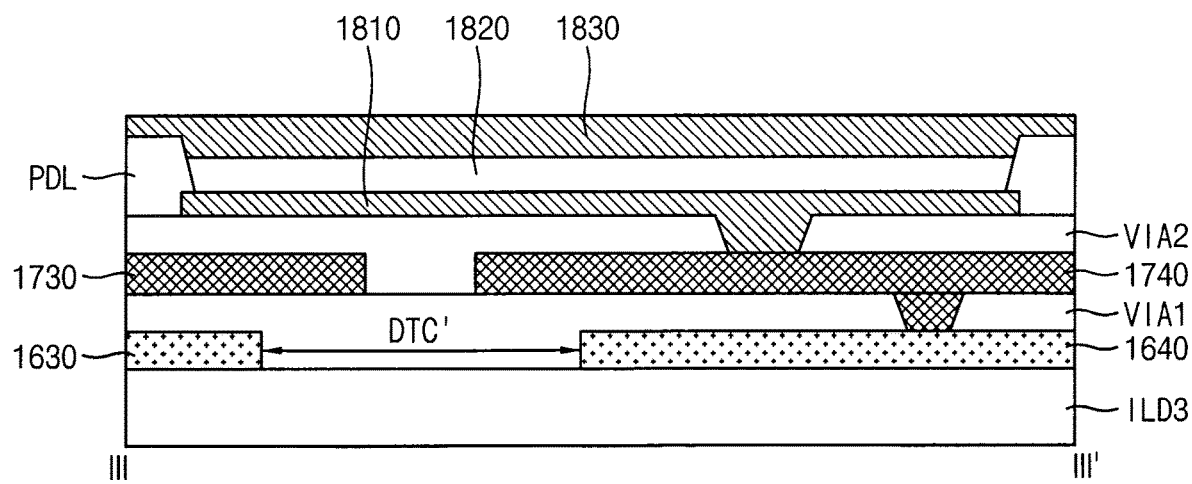
FIG. 21 is a cross-sectional view taken along line of FIG. 20.

FIG. 20 is a plan view illustrating a fourth conductive pattern and a fifth conductive pattern included in the display device of FIG. 1. FIG. 21 is a cross-sectional view taken along line of FIG. 20.

Referring to FIGS. 20 and 21, the first pad 1640 may be disposed to be spaced apart from the second connecting pattern 1630 by a predetermined distance DTC'. The predetermined distance DTC' may substantially correspond to the predetermined distance DTC described above with reference to FIG. 13. In such an embodiment, as described above, the second connecting pattern 1630 may not overlap with the opening H, and accordingly, the planar area of the second connecting pattern 1630 may be reduced. Therefore, the area of the pixel structure PX on a plane may be reduced, and the resolution of the display device 10 may be increased.

Figure 22:
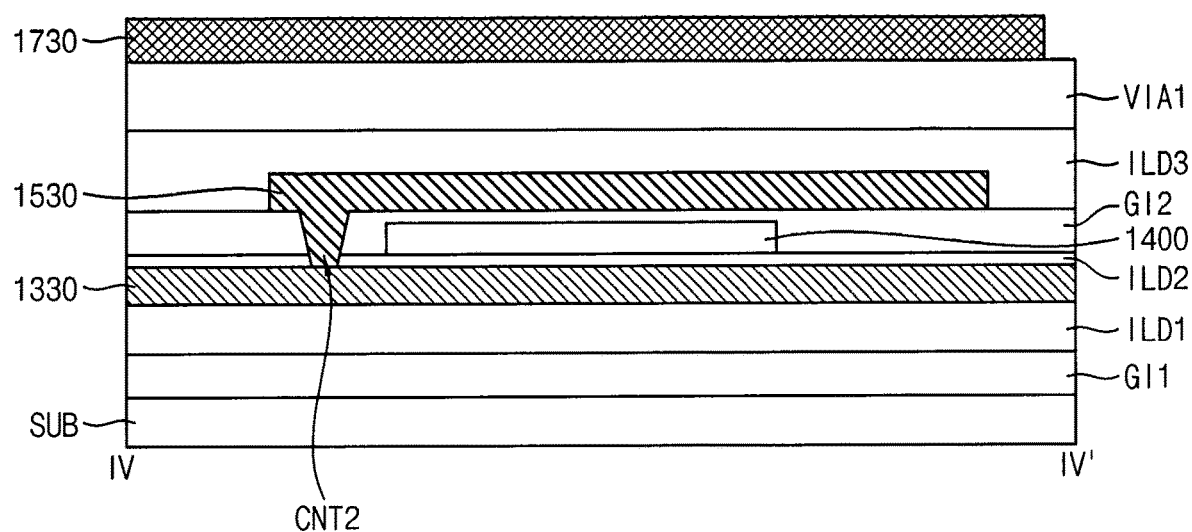
FIG. 22 is a cross-sectional view taken along line IV-IV' of FIG. 16.

FIG. 22 is a cross-sectional view taken along line IV-IV' of FIG. 16. Specifically, FIG. 22 may be a cross-sectional view illustrating the third transistor T3.

Referring to FIGS. 16 and 22, the second bottom gate electrode 1330 may be disposed below the second active pattern 1400, and the second gate electrode 1530 may be disposed on the second active pattern 1400. The second bottom gate electrode 1330 and the second gate electrode 1530 may be connected to each other through the second contact hole CNT2. The light blocking pattern 1730 may overlap the second active pattern 1400.

The second gate signal GC may be provided to the second bottom gate electrode 1330 and the second gate electrode 1530. In such an embodiment, where the display device 10 includes the second bottom gate electrode 1330, a turn-on characteristic and/or a turn-off characteristic of the third transistor T3 may be increased. In such an embodiment, as shown in FIG. 11, the second gate electrode 1530 may be disposed in an island shape by the second bottom gate electrode 1330. Accordingly, a space in which the shielding pattern 1550 is disposed may be secured.

Figure 23:
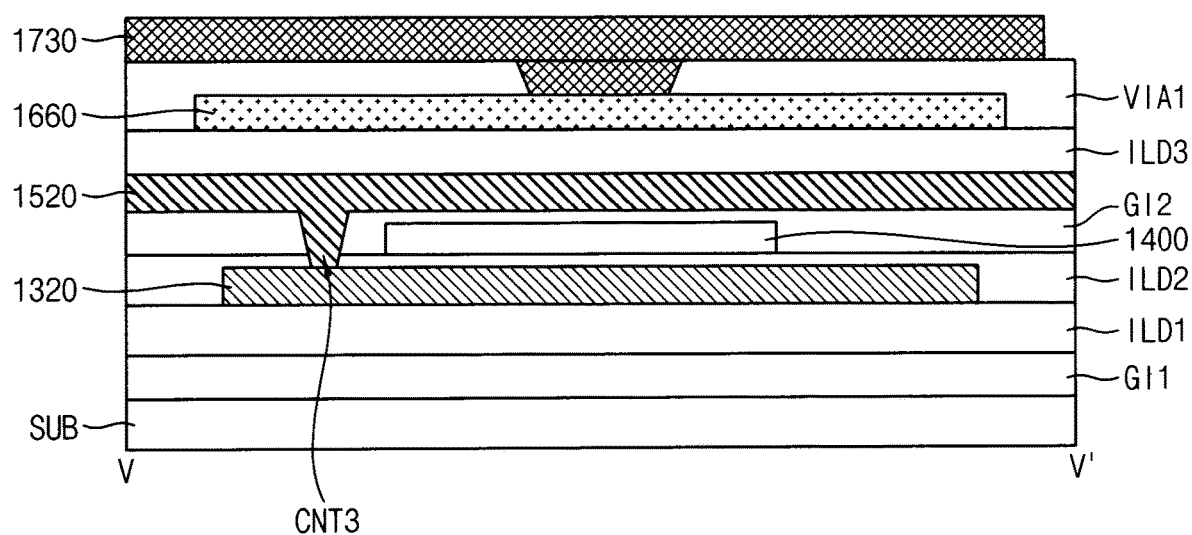
FIG. 23 is a cross-sectional view taken along line V-V' of FIG. 16.

FIG. 23 is a cross-sectional view taken along line V-V' of FIG. 16. Specifically, FIG. 23 may be a cross-sectional view illustrating the fourth transistor T4.

Referring to FIGS. 16 and 23, the first bottom gate electrode 1320 may be disposed under the second active pattern 1400, and the third gate electrode 1520 may be disposed on the second active pattern 1400. The first bottom gate electrode 1320 and the third gate electrode 1520 may be connected to each other through the third contact hole CNT3. The light blocking pattern 1730 may overlap the second active pattern 1400. In one embodiment, for example, the light blocking pattern 1730 may contact the gate initialization voltage connecting pattern 1660, and the gate initialization voltage VINT may be provided through the gate initialization voltage connecting pattern 1660.

The third gate signal GI may be provided to the first bottom gate electrode 1320 and the third gate electrode 1520. In such an embodiment, where the display device 10 includes the first bottom gate electrode 1320, a turn-on characteristic and/or a turn-off characteristic of the fourth transistor T4 may be increased.

Figure 24:
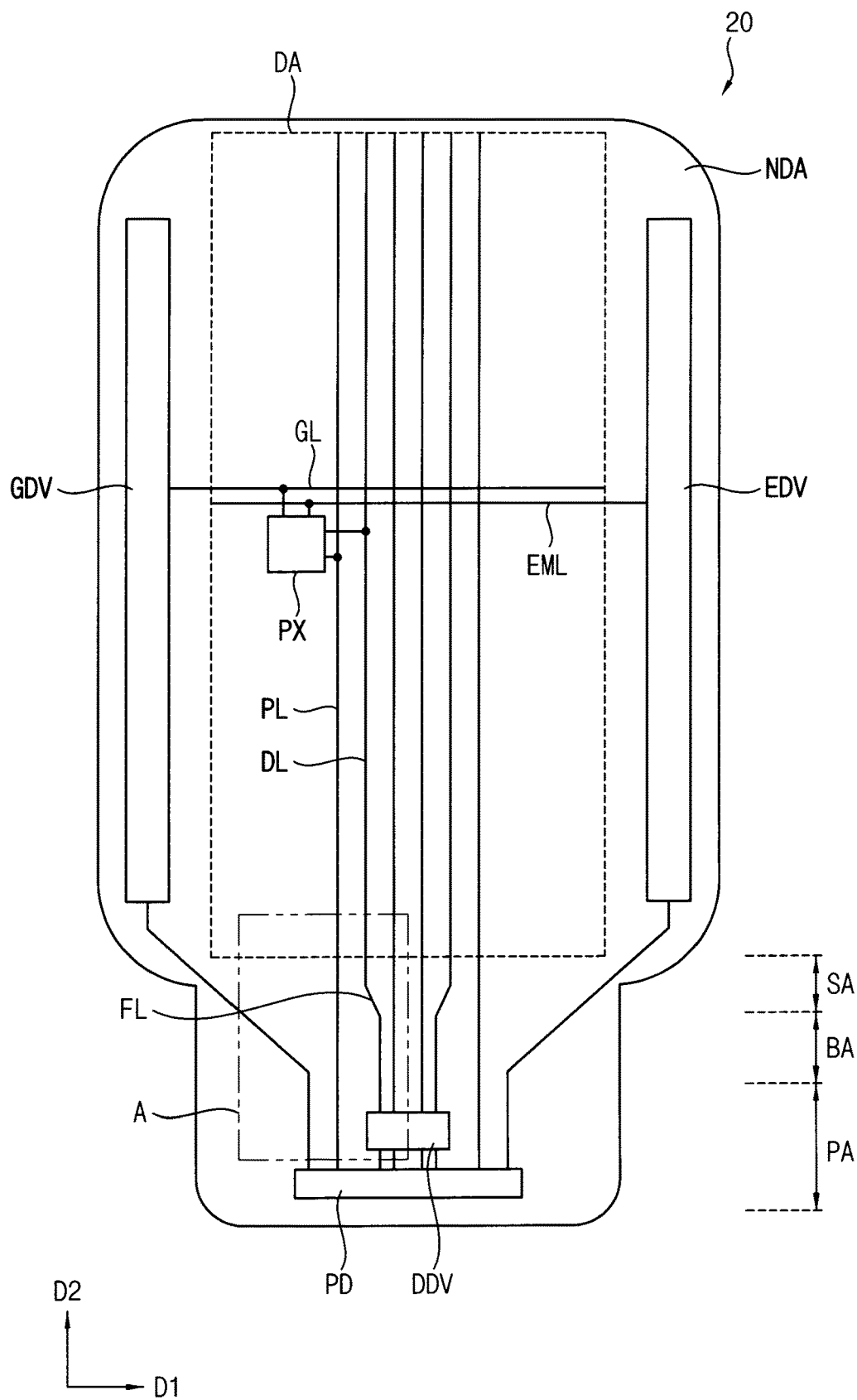
FIG. 24 is a plan view illustrating a display device according to an alternative embodiment.
Figure 25:
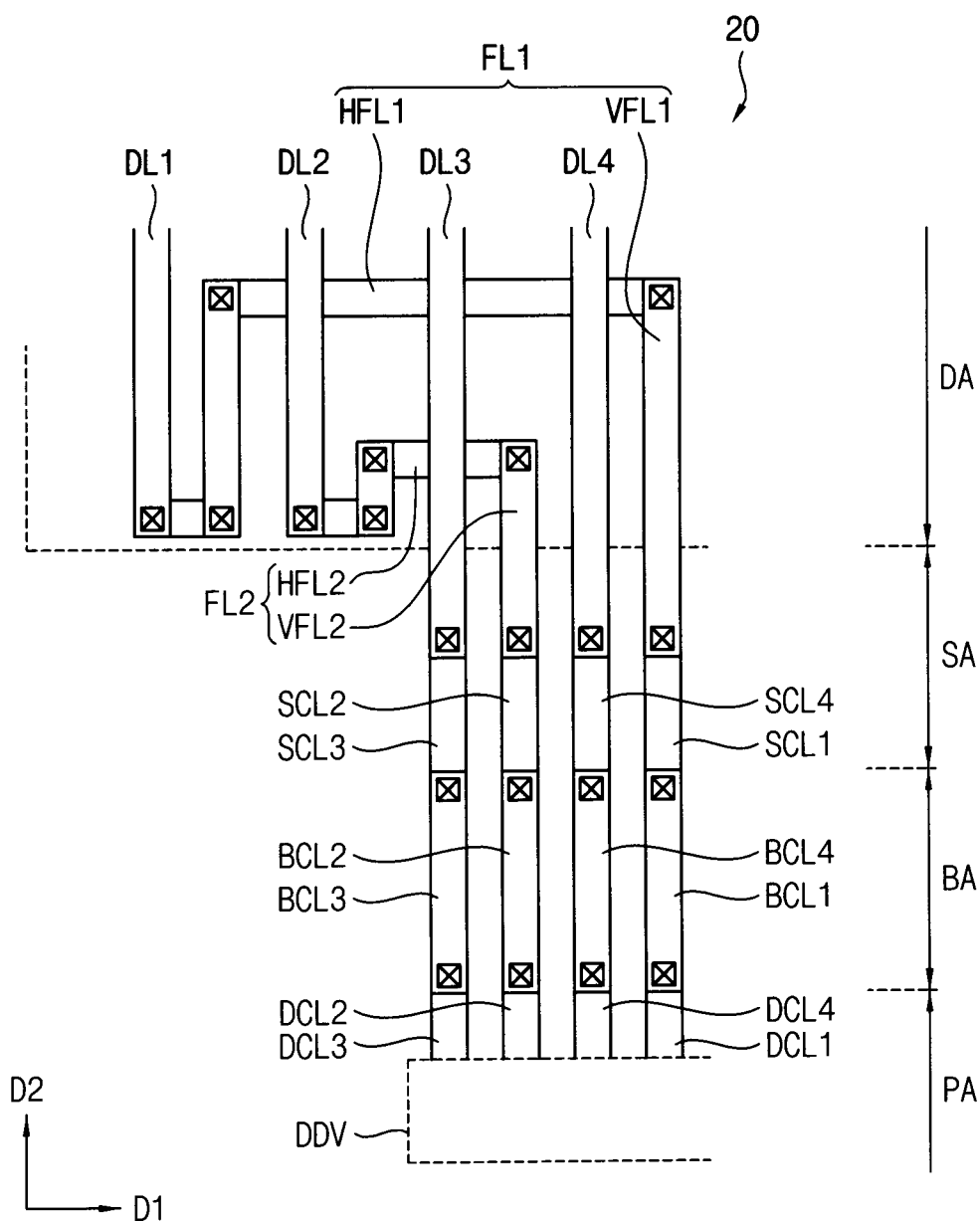
FIG. 25 is an enlarged view illustrating a connecting line included in the display device of FIG. 24.
Figure 26:
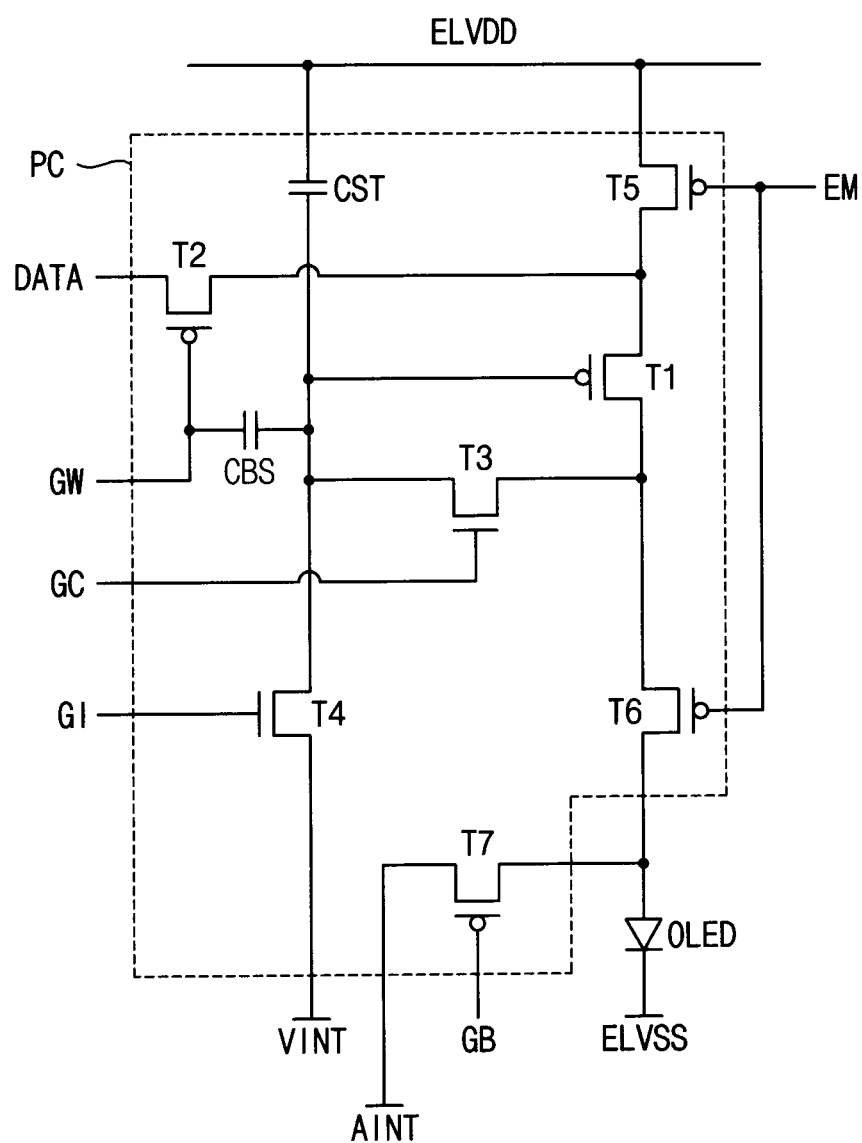
FIG. 26 is a circuit diagram illustrating an embodiment of a pixel circuit and an organic light emitting diode included in the display device of FIG. 24.

The display device 10 may electrically connect the gate terminal of the first transistor T1 and the second terminal of the third transistor T3 through the first connecting pattern 1540 and the second connecting pattern 1630. In such an embodiment, the display device 10 includes a shielding pattern 1550 that shields the first connecting pattern 1540, such that a crosstalk between the first connecting pattern 1540 and the data line 1610 may be effectively prevented. In such an embodiment, the second connecting pattern 1630 partially overlaps the first connecting pattern 1540, such that the area of the second connecting pattern 1630 on a plane may be reduced, and the resolution of the display device 10 may be increased FIG. 24 is a plan view illustrating a display device according to an alternative embodiment. FIG. 25 is an enlarged view illustrating a connecting line included in the display device of FIG. 24. FIG. 26 is a circuit diagram illustrating an embodiment of a pixel circuit and an organic light emitting diode included in the display device of FIG. 24. Specifically, FIG. 25 may be an enlarged view of area A of FIG. 24.

Referring to FIGS. 24, 25, and 26, an embodiment of a display device 20 may include a display area DA and a non-display area NDA surrounding the display area DA. The non-display area NDA may include a bending area BA which is bendable, a peripheral area SA between the display area DA and the bending area BA, and a pad area PA.

In one embodiment, for example, a pixel structure PX may be disposed in the display area DA and a driver for driving the pixel structure PX may be disposed in the non-display area NDA. In one embodiment, for example, a pad part PD and a data driver DDV may be disposed in the pad area PA, and the bending area BA may be bent based on a virtual bending axis. Since the pixel structure PX is not disposed in the peripheral area SA, a width extending in a second direction D2 of the peripheral area SA may be defined as a dead space of the display device 20.

In the display area DA, the pixel structure PX, a data line DL connected to the pixel structure PX, a gate line GL connected to the pixel structure PX, an emission management line EML connected to the pixel structure PX, a driving voltage line PL connected to the pixel structure PX, and a connecting line FL1 and FL2 connected to the pixel structure PX may be disposed in the display area DA. In such an embodiment, the data line DL, the gate line GL, the emission management line EML, and the driving voltage line PL may be substantially the same as the data line DL, the gate line GL, the emission management line EML, and the driving voltage line PL described above with reference to FIG. 1.

The connecting line FL1 and FL2 may be electrically connected to the data driver DDV and the data line DL. The connecting line FL1 and FL2 may receive the data voltage DATA from the data driver DDV and provide the data voltage DATA to the data line DL.

The driver may include a gate driver GDV, the data driver DDV, an emission driver EDV, and a pad part PD. In such an embodiment, the driver may further include a timing controller and the timing controller may control the gate driver GDV, the data driver DDV, the emission driver EDV, and the pad part PD. In such an embodiment, the gate driver GDV, the data driver DDV, the emission driver EDV, the pad part PD, and the timing controller may be substantially the same as the gate driver GDV, the data driver DDV, the emission driver EDV, the pad part PD, and the timing controller described above with reference to FIG. 1.

In an embodiment, as shown in FIG. 25, the data line DL and the connecting line FL1 and FL2 may be disposed in the display area DA. In one embodiment, for example, first to fourth data lines DL1, DL2, DL3, and DL4, a first connecting line FL1, and a second connecting line FL2 may be disposed in the display area DA. In one embodiment, for example, the connecting lines FL1 and FL2 may be a fan-out line electrically connecting the data driver DDV and the data line DL.

In one embodiment, for example, the pixel structure PX may include first to fourth pixel structures disposed along the first direction D1. The first data line DL1 may be connected to the first pixel structure, the second data line DL2 may be connected to the second pixel structure, the third data line DL3 may be connected to the third pixel structure, and the fourth data line DL4 may be connected to the fourth pixel structure.

In an embodiment, the first connecting line FL1 may include a first vertical connecting line VFL1 and a first horizontal connecting line HFL1, and the second connecting line FL2 may include a second vertical connecting line VFL2 and a second horizontal connecting line HFL2. In one embodiment, for example, the first and second vertical connecting lines VFL1 and VFL2 may extend in the second direction D2, and the first and second horizontal connecting lines HFL1 and HFL2 may extend in the first direction D1.

The first connecting line FL1 may electrically connect the data driver DDV and the first data line DL1. In one embodiment, for example, a first data voltage may be provided to the first pixel structure through the first connecting line FL1 and the first data line DL1.

In such an embodiment, the first vertical connecting line VFL1 may be connected to a first transfer line SCL1, the first transfer line SCL1 may be connected to a first bending transfer line BCL1, and the first bending transfer line BCL1 may be connected to a first data transfer line DCL1.

Figure 29:
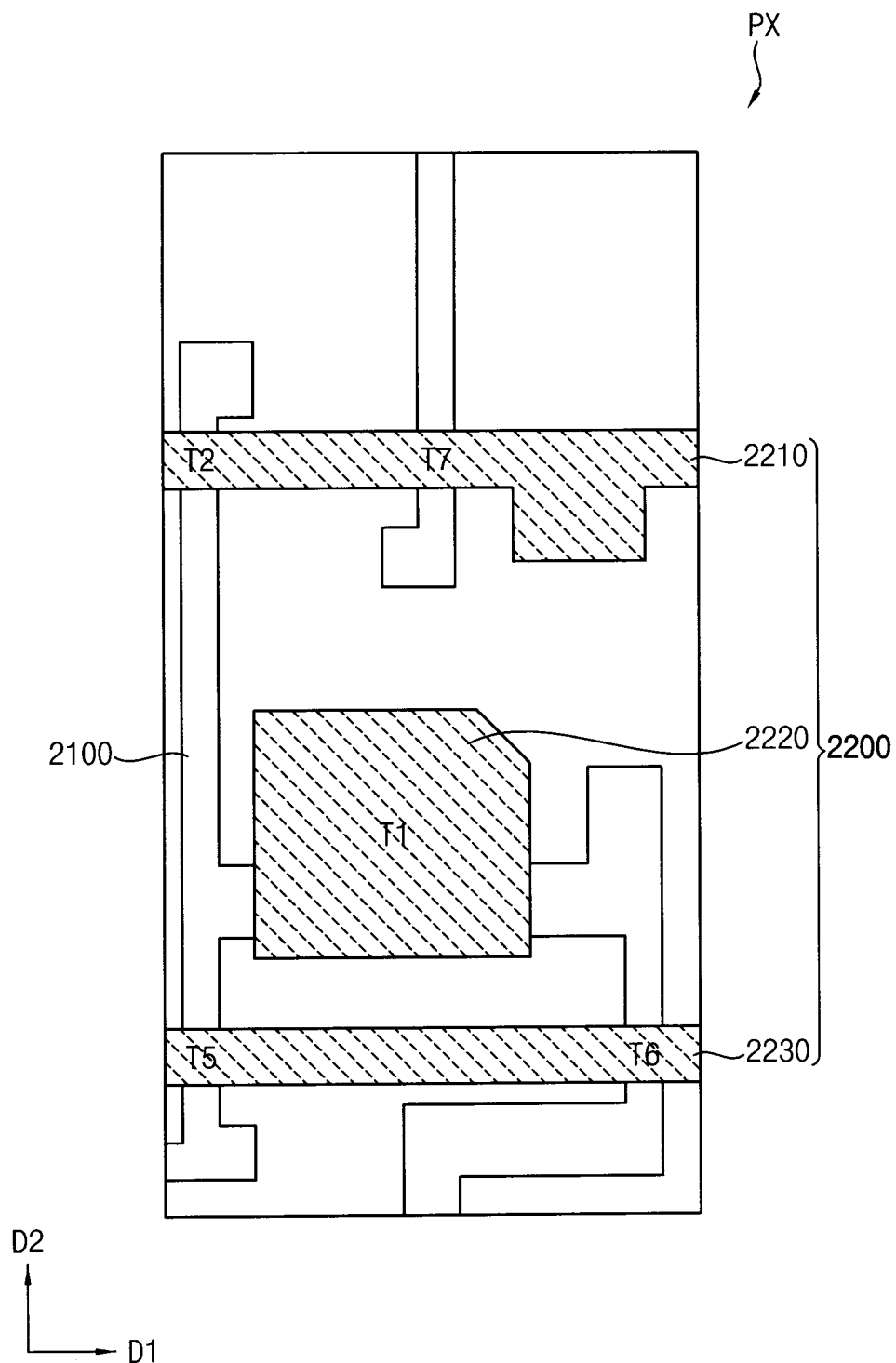
Figure 38:
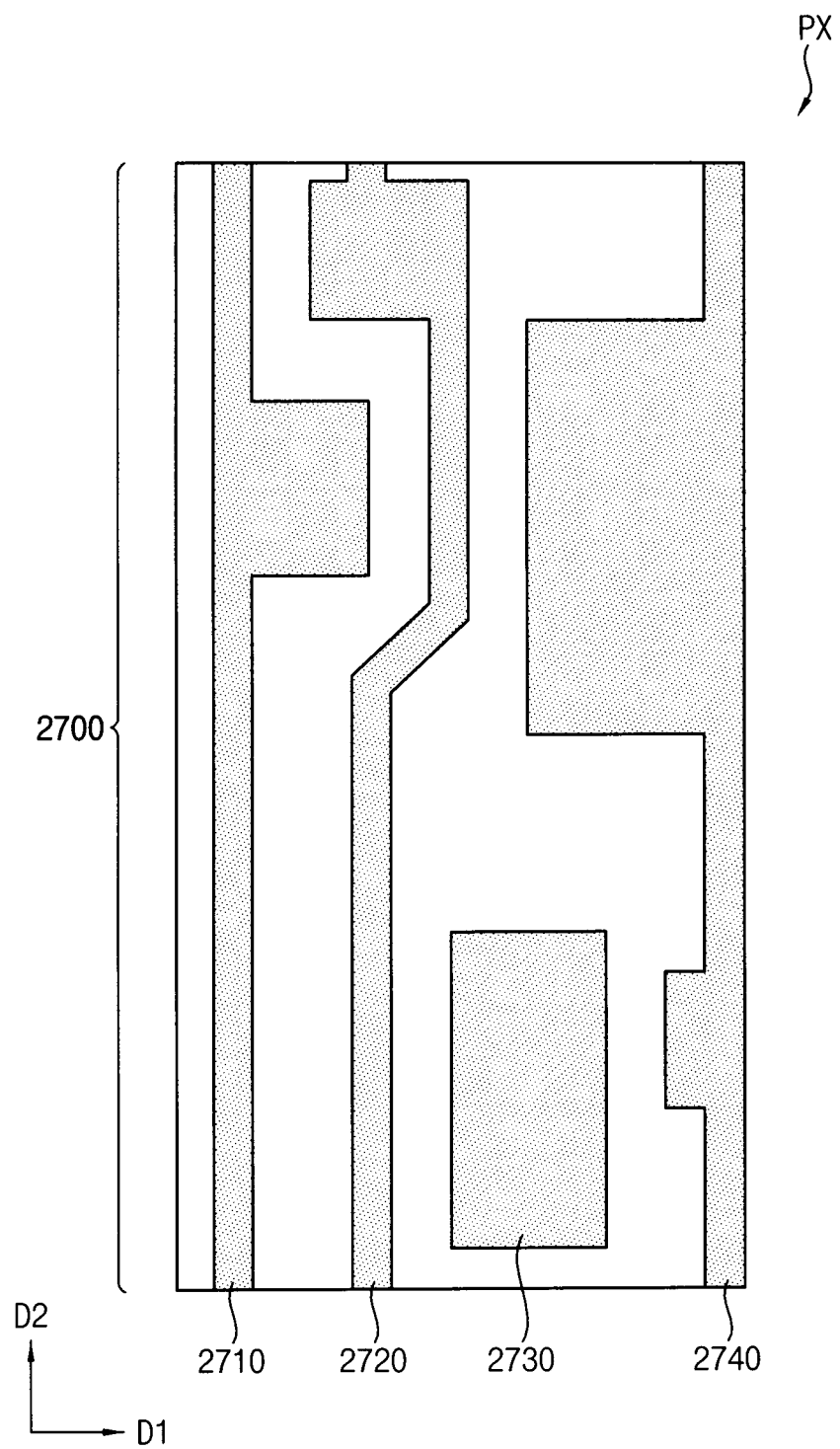

In one embodiment, for example, the first vertical connecting line VFL1 may extend from the peripheral area SA to the display area DA, and may be disposed in a first layer (for example, a first layer in which the fifth conductive pattern 2700 of FIG. 38 is disposed). The first transfer line SCL1 may be disposed in the peripheral area SA and may be disposed in a second layer (for example, a second layer in which the first conductive pattern 2200 of FIG. 29 is disposed) disposed below the first layer. The first bending transfer line BCL1 may be disposed in the bending area BA and may be disposed in the first layer. The first data transfer line DCL1 may be disposed in the pad area PA and may receive the first data voltage from the data driver DDV.

The second connecting line FL2 may electrically connect the data driver DDV and the second data line DL2. In one embodiment, for example, a second data voltage may be provided to the second pixel structure through the second connecting line FL2 and the second data line DL2.

In an embodiment, the second vertical connecting line VFL2 may be connected to a second transfer line SCL2, the second transfer line SCL2 may be connected to a second bending transfer line BCL2, and the second bending transfer line BCL2 may be connected to a second data transfer line DCL2. In such an embodiment, a structure of the second vertical connecting line VFL2, the second transfer line SCL2, the second bending transfer line BCL2, and the second data transfer line DCL2 may be substantially the same as a structure of the first vertical connection line VFL1, the first transfer line SCL1, the first bending transfer line BCL1, and the first data transfer line DCL1, and thus any repetitive detailed descriptions thereof will be omitted.

The third data line DL3 may be connected to the data driver DDV. In one embodiment, for example, a third data voltage may be provided to the third pixel structure through the third data line DL3.

In such an embodiment, the third vertical connecting line VFL3 may be connected to a third transfer line SCL3, the third transfer line SCL3 may be connected to a third bending transfer line BCL3, and the third bending transfer line BCL3 may be connected to a third data transfer line DCL3.

Figure 30:
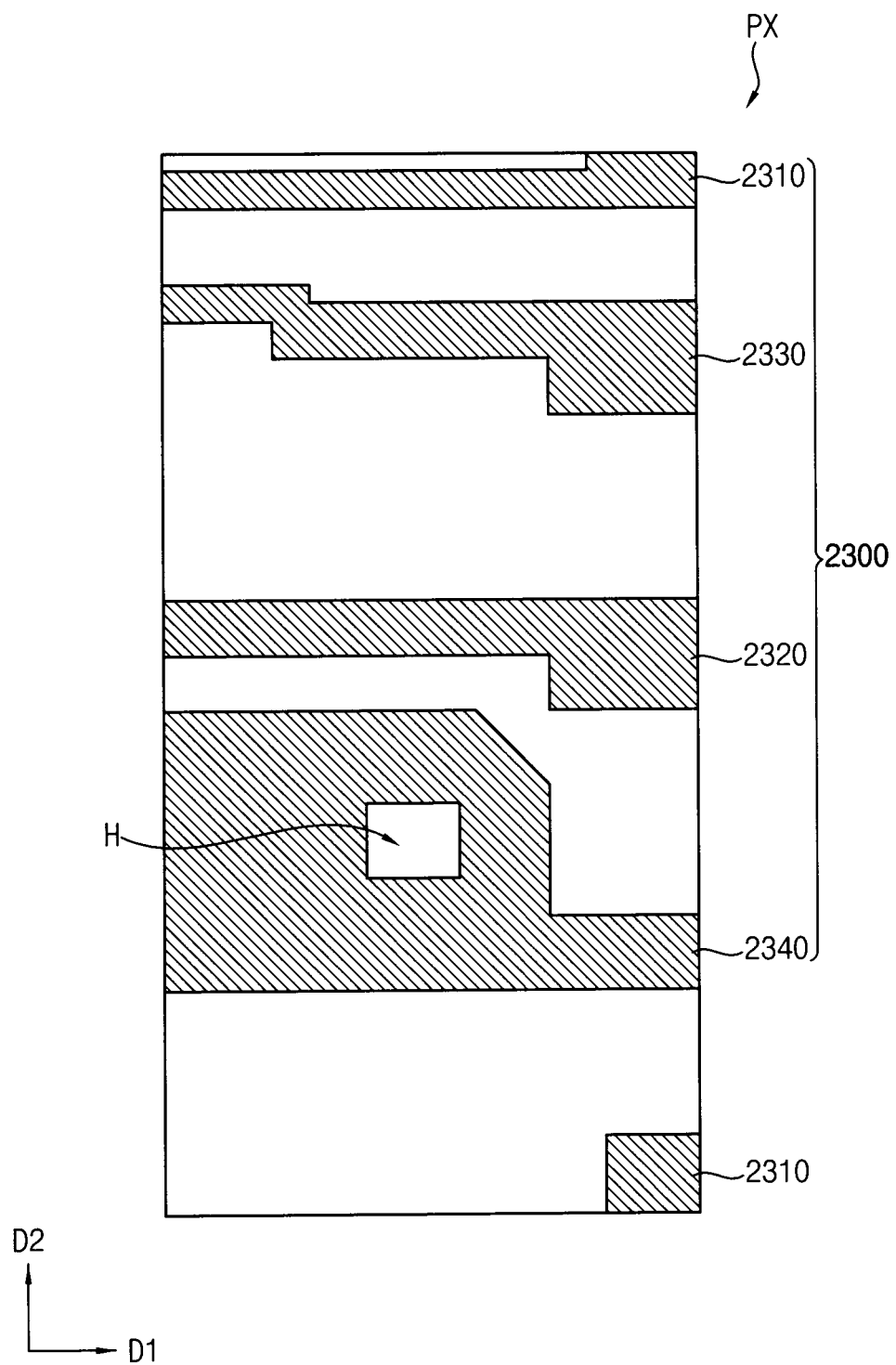

In one embodiment, for example, the third vertical connecting line VFL3 may extend from the peripheral area SA to the display area DA, and may be disposed in the first layer. The third transfer line SCL3 may be disposed in the peripheral area SA and may be disposed in a third layer (for example, a third layer in which the second conductive pattern 2300 of FIG. 30 is disposed) disposed below the first layer. The third bending transfer line BCL3 may be disposed in the bending area BA and may be disposed in the first layer. The third data transfer line DCL3 may be disposed in the pad area PA and may receive the third data voltage from the data driver DDV.

The fourth data line DL4 may be connected to the data driver DDV. In one embodiment, for example, a fourth data voltage may be provided to the fourth pixel structure through the fourth data line DL4.

In an embodiment, the fourth vertical connecting line VFL4 may be connected to a fourth transfer line SCL4, the fourth transfer line SCL4 may be connected to a fourth bending transfer line BCL4, and the fourth bending transfer line BCL4 may be connected to a fourth data transfer line DCL4. In such an embodiment, a structure of the fourth vertical connecting line VFL4, the fourth transfer line SCL4, the fourth bending transfer line BCL4, and the fourth data transfer line DCL4 may be substantially the same as a structure of the third vertical connection line VFL3, the third transfer line SCL3, the third bending transfer line BCL3, and the third data transfer line DCL3, and thus any repetitive detailed descriptions thereof will be omitted.

In an embodiment, the second layer may be disposed under the third layer. In one embodiment, for example, the first and second transfer lines SCL1 and SCL2 may be disposed under the third and fourth transfer lines SCL3 and SCL4.

Accordingly, in such an embodiment, a space margin may be secured in the second layer (or in the third layer) of the peripheral area SA, and additional lines may be further disposed in the space margin. However, the invention is not limited thereto, and the connection structure and arrangement position of the above-described lines may be variously modified.

In an embodiment, the connecting line FL1 and FL2 is disposed in the display area DA, such that a width extending in the second direction D2 of the peripheral area SA of the display device 20 may be reduced compared to a width extending in the second direction D2 of a peripheral area of a conventional display device. Accordingly, in such an embodiment, the dead space of the display device 20 may be reduced.

In such an embodiment, as shown in FIG. 26, a pixel circuit PC may include a first transistor T1, a second transistor T2, a third transistor T3, a fourth transistor T4, a fifth transistor T5, a sixth transistor T6, a seventh transistor T7, a storage capacitor CST, and a boosting capacitor CBS. The pixel circuit PC may be electrically connected to the organic light emitting diode OLED and may provide a driving current to the organic light emitting diode OLED. In such an embodiment, the pixel circuit PC and the organic light emitting diode OLED may be substantially the same as the pixel circuit PC and the organic light emitting diode OLED described above with reference to FIG. 3.

FIGS. 27 to 39 are plan views illustrating a pixel structure included in the display device of FIG. 24.

Figure 27:
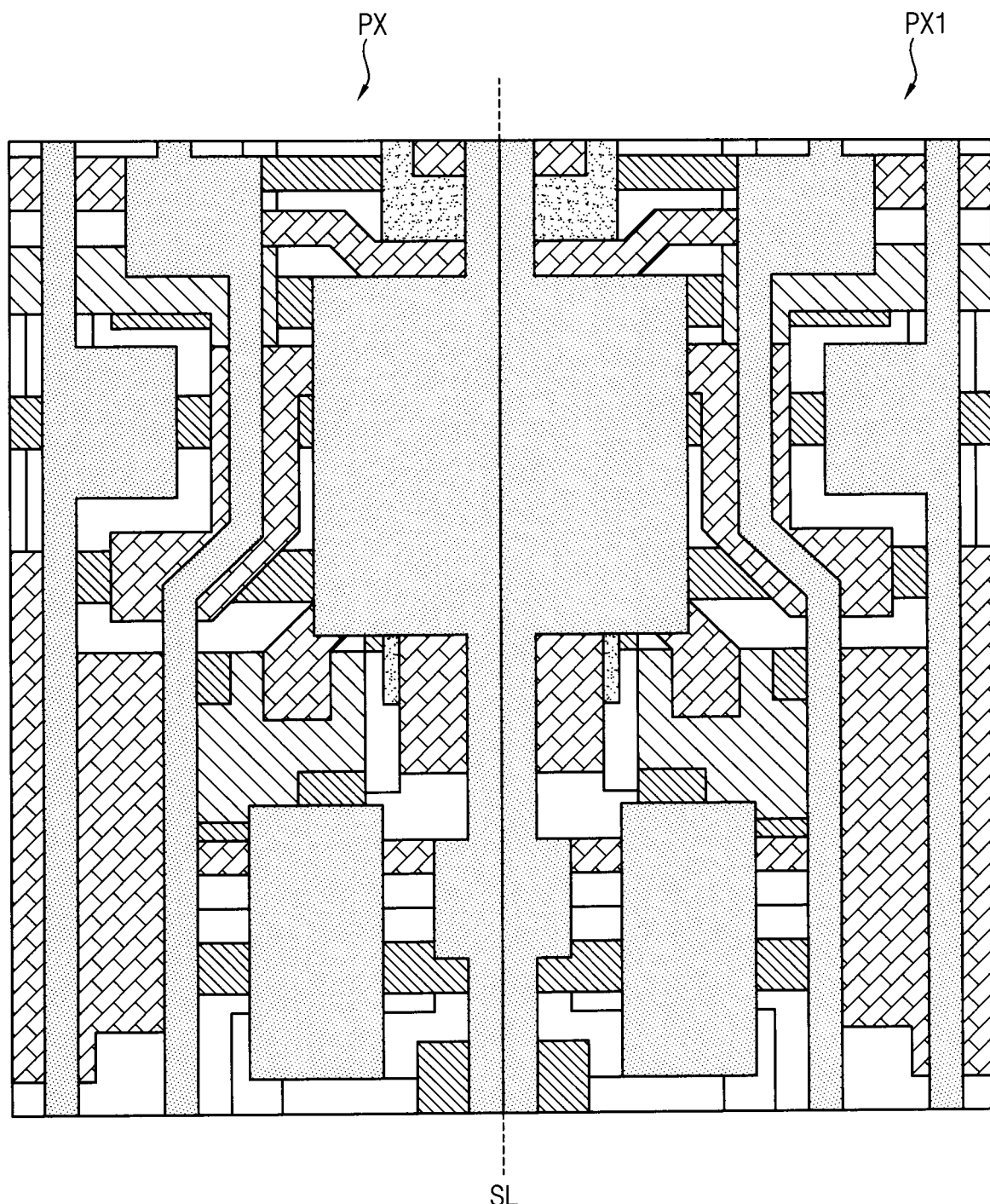
FIGS. 27 to 39 are plan views illustrating a pixel structure included in the display device of FIG. 24.

Referring to FIG. 27, the display device 20 may include the pixel structure PX and a symmetric pixel structure PX1 adjacent to the pixel structure PX. In one embodiment, for example, a structure of the symmetric pixel structure PX1 may be substantially the same as a structure in which the structure of the pixel structure PX is symmetrical with respect to an imaginary symmetric line SL. Hereinafter, the pixel structure PX will be described in detail.

Figure 28:
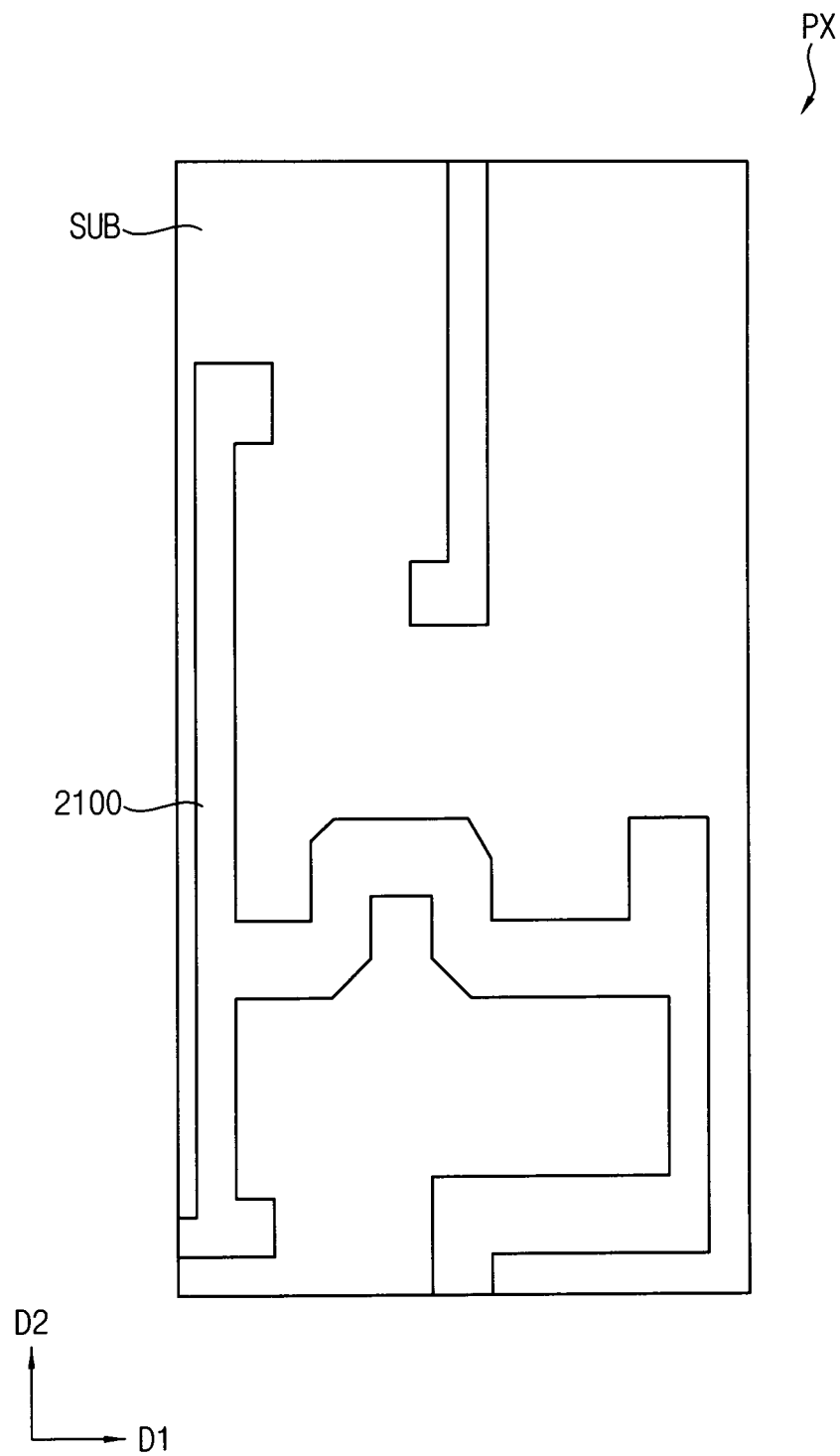

Referring to FIG. 28, the pixel structure PX may include a substrate SUB and a first active pattern 2100 disposed on the substrate SUB.

The substrate SUB may include a glass substrate, a quartz substrate, a plastic substrate, or the like. In an embodiment, the substrate SUB may include a plastic substrate, and thus the display device 20 may be a flexible display device. In such an embodiment, the substrate SUB may have a structure in which at least one organic film layer and at least one barrier layer are alternately stacked. In one embodiment, for example, the organic film layer may include or be formed of an organic material such as polyimide, and the barrier layer may include or be formed of an inorganic material such as silicon oxide or silicon nitride.

A buffer layer may be disposed on the substrate SUB. The buffer layer may effectively prevent diffusion of metal atoms or impurities from the substrate SUB into the first active pattern 2100. In such an embodiment, the buffer layer may allow the first active pattern 2100 to be uniformly formed by controlling a heat transfer rate during a crystallization process for forming the first active pattern 2100.

The first active pattern 2100 may be disposed on the buffer layer. In an embodiment, the first active pattern 2100 may include a silicon semiconductor. In one embodiment, for example, the first active pattern 2100 may include amorphous silicon, polycrystalline silicon, or the like.

In an embodiment, ions may be selectively implanted into the first active pattern 2100. In one embodiment, for example, when the first and second transistors T1 and T2 are the PMOS transistors, the first active pattern 2100 may include a source region into which cations is implanted, a drain region into which cations is implanted, and a channel area into which cations are not implanted.

A first gate insulating layer (e.g., a first gate insulating layer GI1 of FIG. 40) may cover the first active pattern 2100 and may be disposed on the substrate SUB. The first gate insulating layer may include an insulating material. In one embodiment, for example, the first gate insulating layer may include silicon oxide, silicon nitride, titanium oxide, tantalum oxide, or the like.

Referring to FIG. 29, a first conductive pattern 2200 may be disposed on the first gate insulating layer. The first conductive pattern 2200 may include a first gate line 2210, a gate electrode 2220, and a second gate line 2230.

The first gate line 2210 may be disposed on the first active pattern 2100 and may extend in the first direction D1. In an embodiment, the first gate line 2210 may constitute the second transistor T2 together with a part of the first active pattern 2100. In one embodiment, for example, the first gate signal GW may be provided to the first gate line 2210.

In one embodiment, for example, the first gate line 2210 may constitute the seventh transistor T7 together with another part of the first active pattern 2100. In one embodiment, for example, the fourth gate signal GB may be provided to the first gate line 2210. In one embodiment, for example, the first gate signal GW and the fourth gate signal GB may have a substantially same waveform with a phase or time difference.

The gate electrode 2220 may constitute the first transistor T1 together with a part of the first active pattern 2100.

The second gate line 2230 may be disposed on the first active pattern 2100 and may extend in the first direction D1. In one embodiment, for example, the second gate line 2230 may constitute the fifth and sixth transistors T5 and T6 together with parts of the first active pattern 2100. In such an embodiment, the second gate line 2230 may correspond to an emission management line.

In one embodiment, for example, the first conductive pattern 2200 may include a metal, an alloy, a conductive metal oxide, a transparent conductive material, or the like. In one embodiment, for example, the first conductive pattern 1200 may include at least one material selected from silver ("Ag"), an alloy containing silver, molybdenum ("Mo"), an alloy containing molybdenum, aluminum ("Al"), an alloy containing aluminum, Aluminum nitride ("AN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

A first interlayer insulating layer (e.g., a first interlayer insulating layer ILD1 of FIG. 40) may cover the first conductive pattern 2200 and may be disposed on the first gate insulating layer. The first interlayer insulating layer may include an insulating material.

In such an embodiment, the first, second, fifth, sixth, and seventh transistors T1, T2, T5, T6, and T7 may correspond to the first, second, fifth, sixth and seventh transistors T1, T2, T5, T6, and T7 described above with reference to FIG. 26. In one embodiment, for example, the first gate electrode 1230 may correspond to the gate terminal of the first transistor T1 described above with reference to FIG. 26.

In addition, the gate terminals, the first terminals, and the second terminals described with reference to FIG. 26 may substantially correspond to conductive patterns to be described later. However, such a correspondence relationship will not be described in detail, and the correspondence will be apparent to those skilled in the relevant art.

Figure 31:
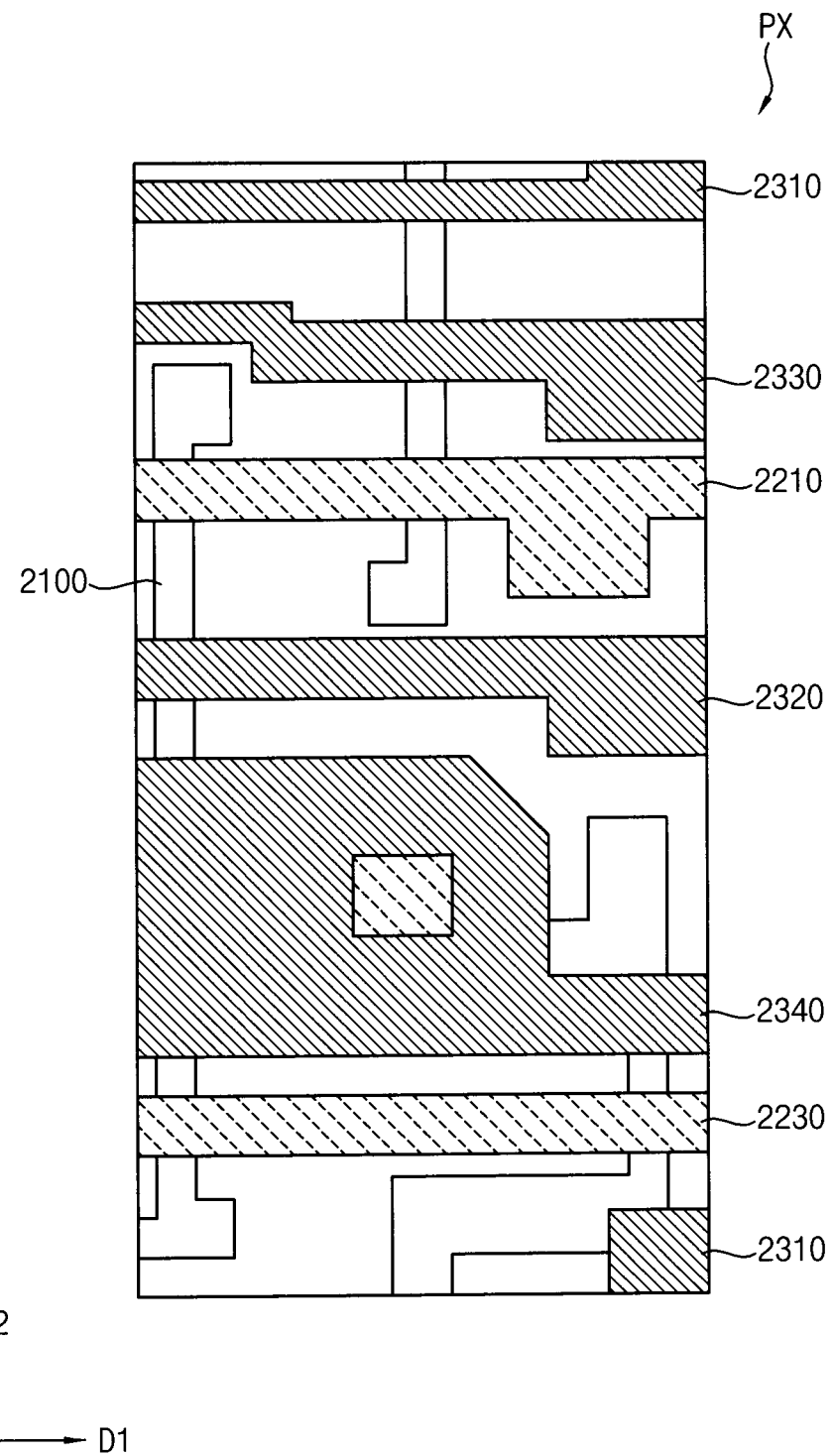

Referring to FIGS. 30 and 31, a second conductive pattern 2300 may be disposed on the first interlayer insulating layer. The second conductive pattern 2300 may include a gate initialization voltage line 2310, a third gate line 2320, a fourth gate line 2330, and a storage capacitor electrode 2340.

The gate initialization voltage line 2310 may extend in the first direction D1. In an embodiment, the gate initialization voltage line 2310 may transfer the gate initialization voltage VINT to the fourth transistor T4. In one embodiment, for example, the gate initialization voltage line 2310 may transfer the gate initialization voltage VINT to a second active pattern (e.g., a second active pattern 2400 of FIG. 32).

The third gate line 2320 may extend in the first direction D1. In an embodiment, the third gate line 2320 may transfer the second gate signal GC to the third transistor T3. In one embodiment, for example, the third gate line 2320 may contact a first top electrode (e.g., a first top electrode 2530 of FIG. 42).

The fourth gate line 2330 may extend in the first direction D1. In an embodiment, the fourth gate line 2330 may transfer the third gate signal GI to the fourth transistor T4. In one embodiment, for example, the fourth gate line 2330 may contact a second top electrode (e.g., a second top electrode 1540 in FIG. 43).

The storage capacitor electrode 2340 may extend in the first direction D1. In an embodiment, the storage capacitor electrode 2340 may constitute the storage capacitor CST together with the gate electrode 2220. In one embodiment, for example, the storage capacitor electrode 2340 may overlap the gate electrode 2220, and the high power voltage ELVDD may be provided to the storage capacitor electrode 2340.

In an embodiment, an opening H may be defined through the storage capacitor electrode 2340 to expose an upper surface of the gate electrode 2220. The gate electrode 2220 may contact a first connecting pattern (e.g., a first connecting pattern 2520 of FIG. 40) through the opening H. In one embodiment, for example, the gate terminal of the first transistor T1 and the second terminal of the third transistor T3 may be electrically connected to each other through the opening H.

In one embodiment, for example, the second conductive pattern 2300 may include a metal, an alloy, a conductive metal oxide, a transparent conductive material, or the like.

A second interlayer insulating layer (e.g., a second interlayer insulating layer ILD2 in FIG. 40) may cover the second conductive pattern 2300 and may be disposed on the first interlayer insulating layer. The second interlayer insulating layer may include an insulating material.

Figure 32:
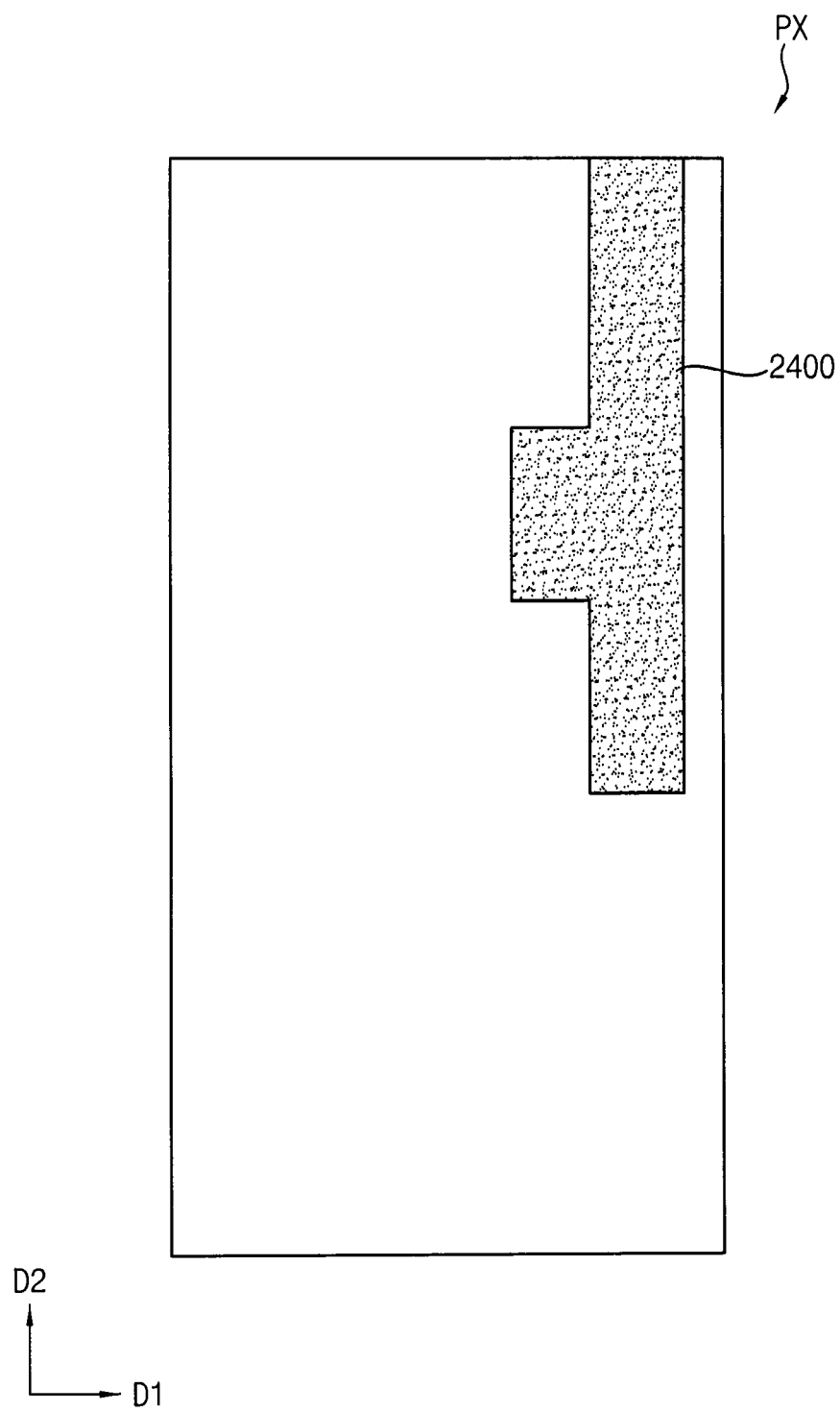
Figure 33:
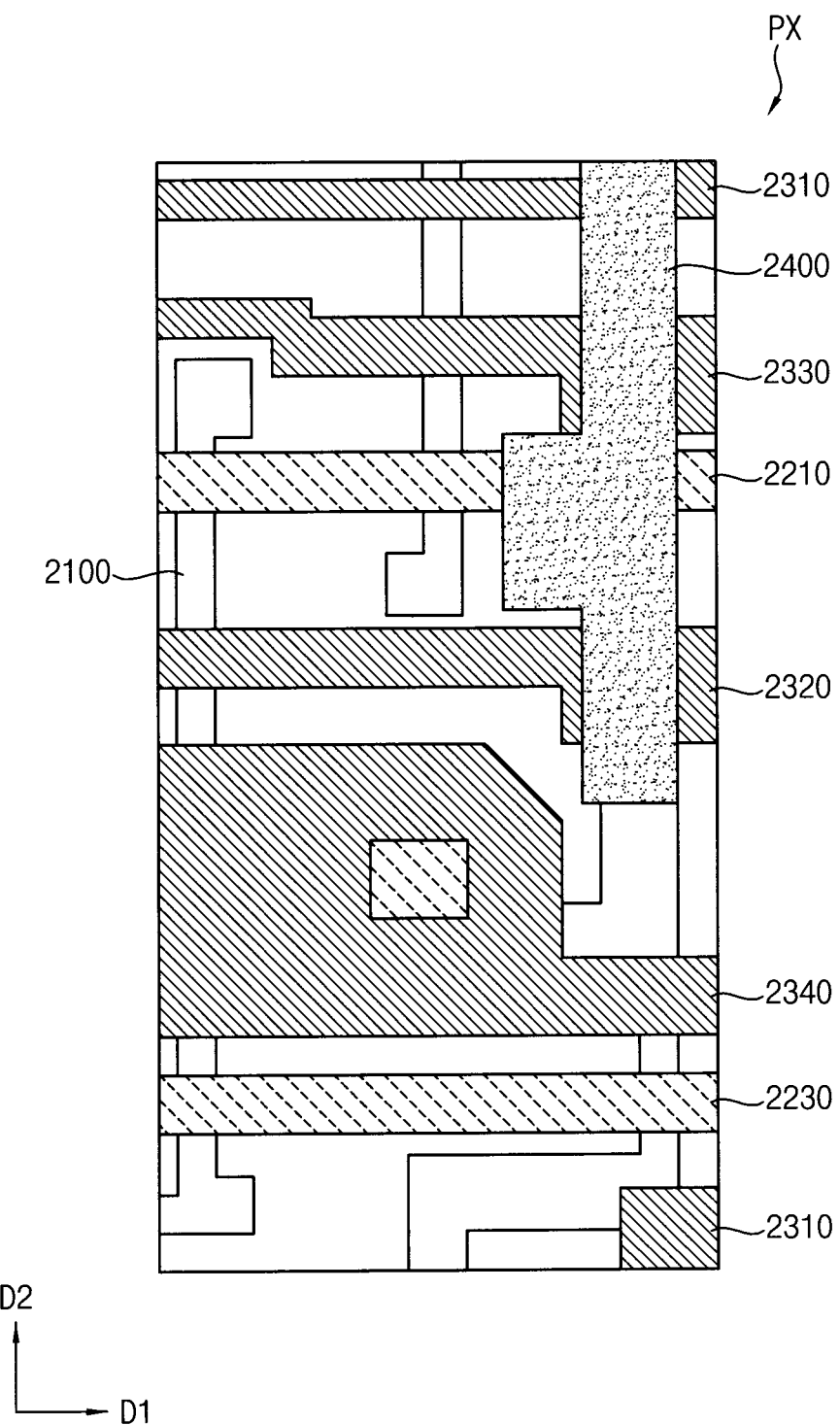

Referring to FIGS. 32 and 33, the second active pattern 2400 may be disposed on the second interlayer insulating layer. In one embodiment, for example, the second active pattern 2400 may overlap the third gate line 2320 and the fourth gate electrode 2330.

In an embodiment, the second active pattern 2400 may be disposed in a different layer from the first active pattern 2100 and may not overlap the first active pattern 2100. In one embodiment, for example, the second active pattern 2400 may be formed separately from the first active pattern 2100. In one embodiment, for example, the first active pattern 2100 may include the silicon semiconductor, and the second active pattern 2400 may include an oxide semiconductor.

In an embodiment, the pixel structure PX may include the first, second, fifth, sixth, and seventh transistors T1, T2, T5, T6, and T7, which are silicon-based semiconductor elements, and the third and fourth transistors T3 and T4 which are oxide-based semiconductor elements. In one embodiment, for example, the first, second, fifth, sixth and seventh transistors T1, T2, T5, T6, and T7 may be the PMOS transistors, and the third and fourth transistors T3 and T4 may be the NMOS transistors.

A second gate insulating layer (e.g., a second gate insulating layer GI2 in FIG. 40) may cover the second active pattern 2400 and may be disposed on the second interlayer insulating layer. The second gate insulating layer may include an insulating material.

Figure 34:
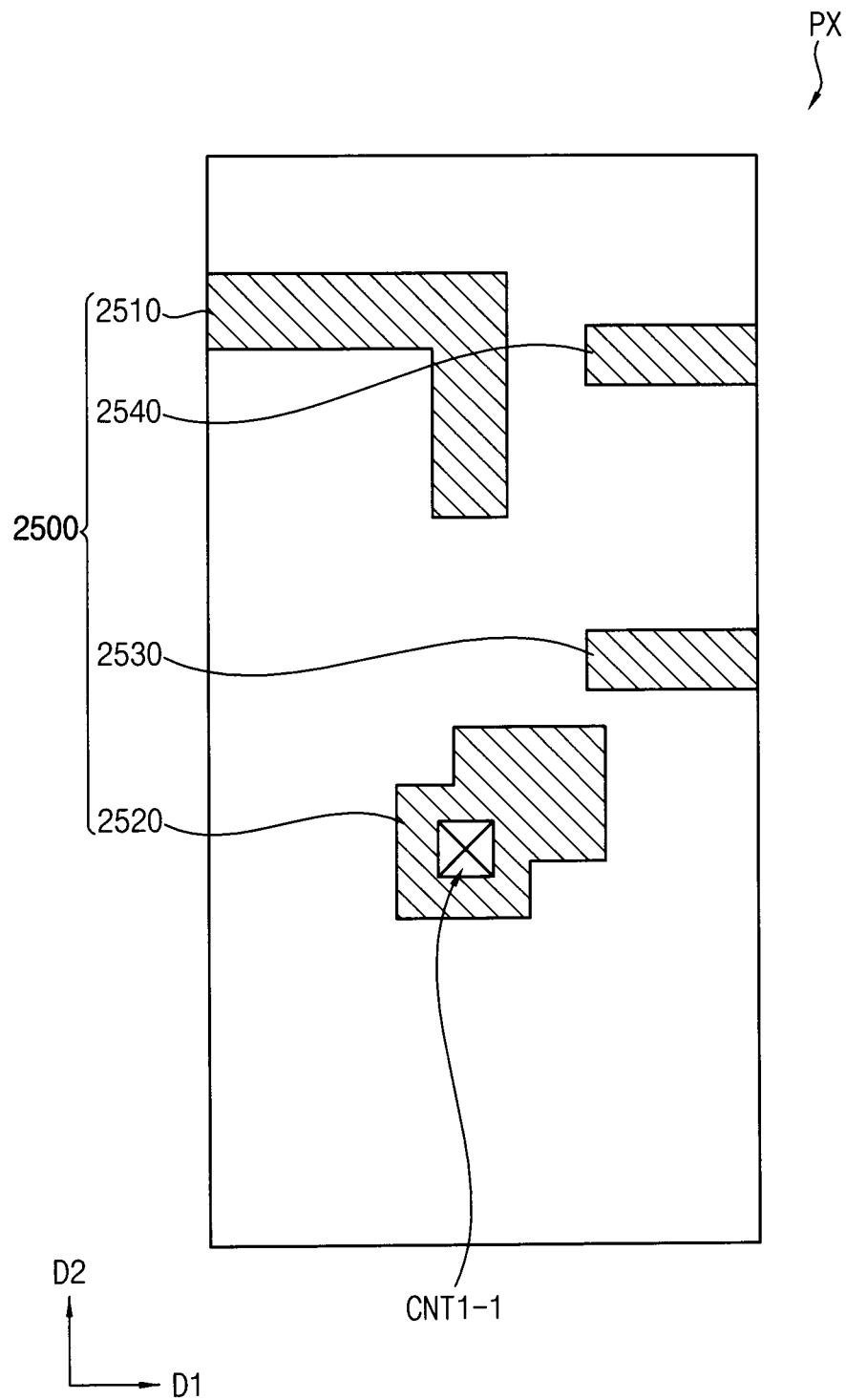
Figure 35:
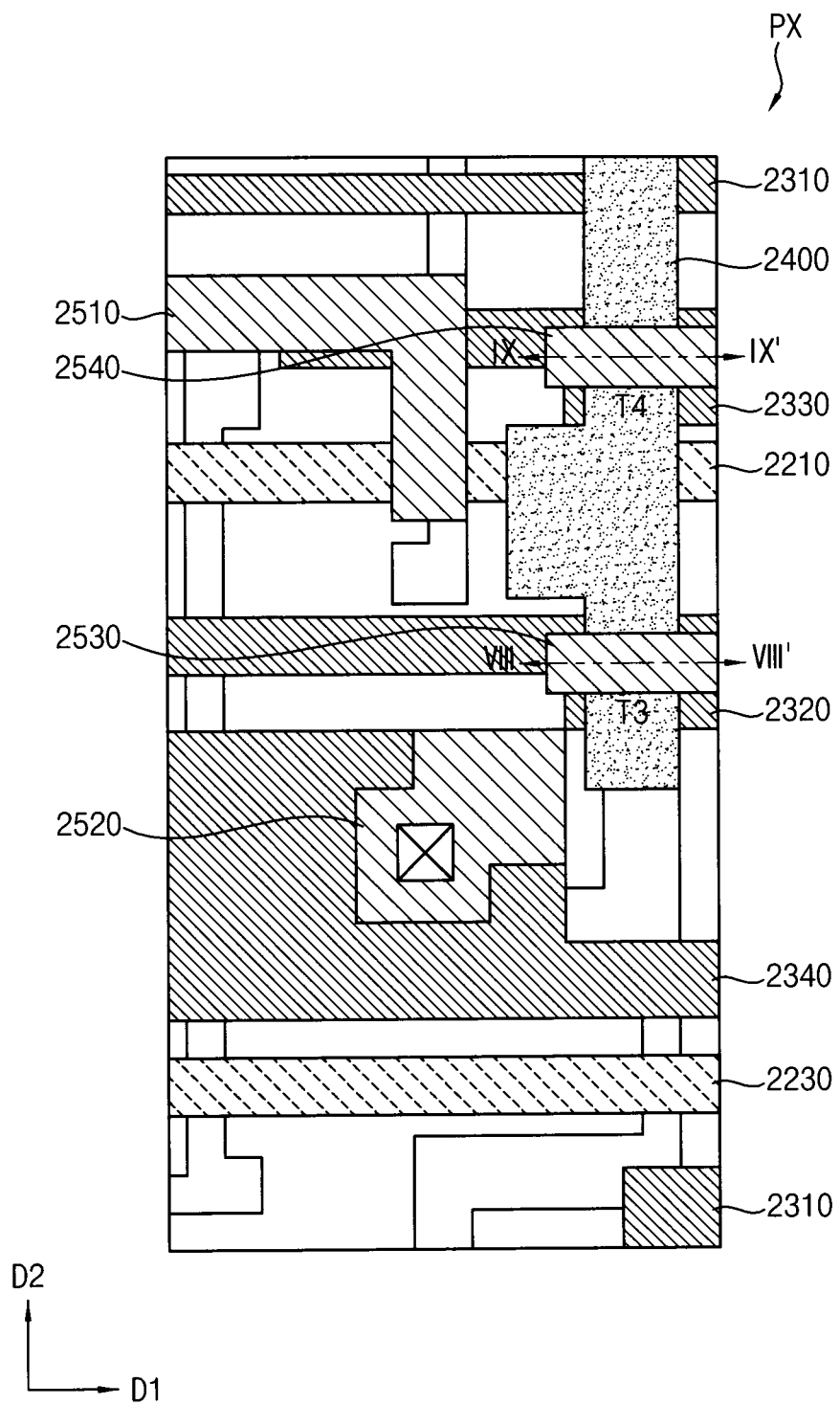

Referring to FIGS. 34 and 35, a third conductive pattern 2500 may be disposed on the second gate insulating layer. The third conductive pattern 2500 may include a third connecting pattern 2510, a first connecting pattern 2520, a first top electrode 2530, and a second top electrode 2540.

In an embodiment, the third connecting pattern 2510 may provide the anode initialization voltage AINT to the seventh transistor T7. The third connecting pattern 2510 may provide the anode initialization voltage AINT to a fourth connecting pattern (e.g., a fourth connecting pattern 2630 of FIG. 41). In one embodiment, for example, the third connecting pattern 2510 may contact the fourth connecting pattern.

Figure 41:
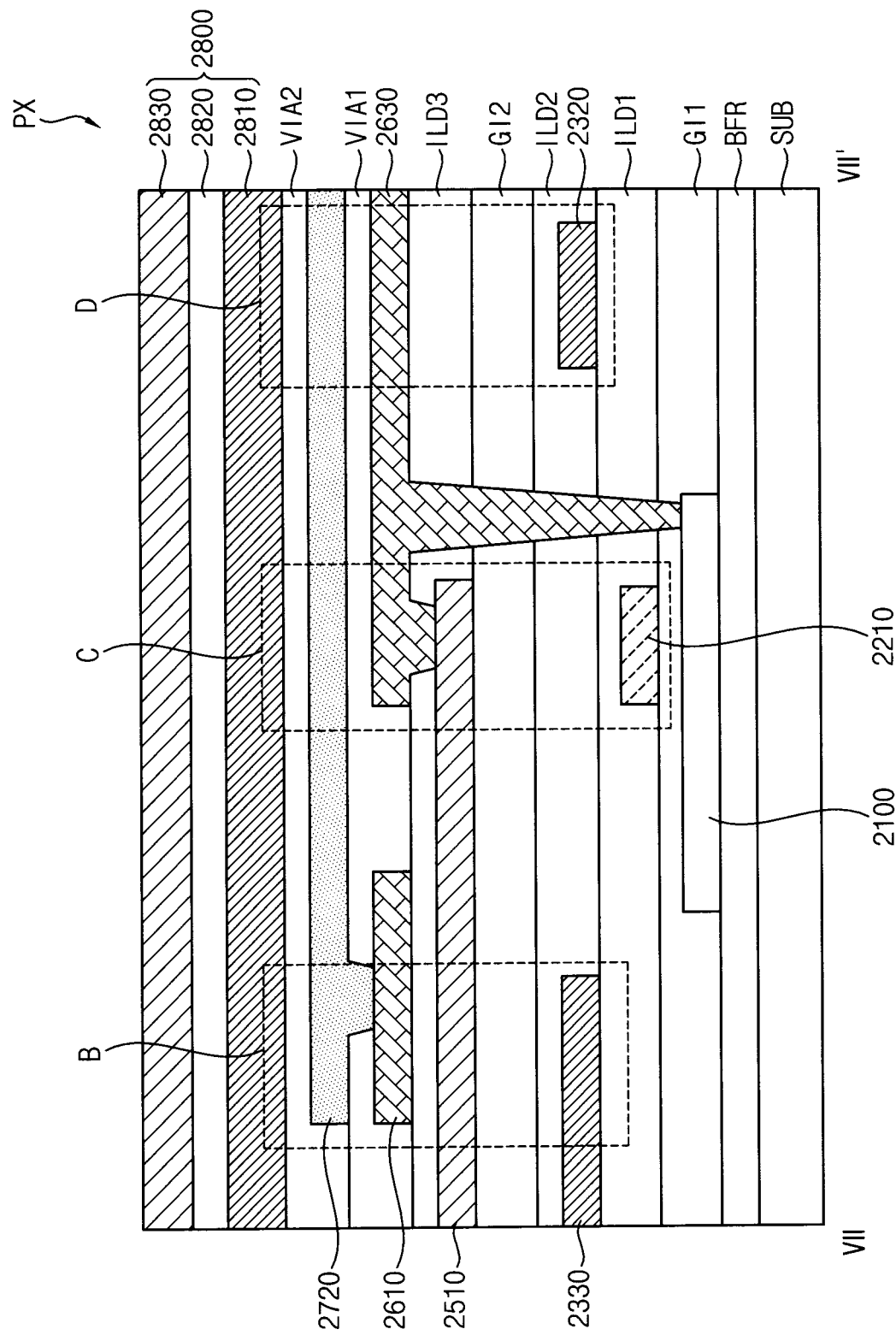
FIG. 41 is a cross-sectional view taken along line VII-VII' of FIG. 39.

In an embodiment, the third connecting pattern 2510 may overlap the first gate line 2210, the fourth gate line 2330, and a vertical connecting line (for example, a vertical connecting line 2720 in FIG. 41). This will be described later in greater detail with reference to FIG. 41.

In an embodiment, the first connecting pattern 2520 may electrically connect the gate terminal of the first transistor T1 and the second terminal of the third transistor T3. The first connecting pattern 2520 may contact the gate electrode 2220 and a second connecting pattern (e.g., a second connecting pattern 2660 in FIG. 40). In one embodiment, for example, the gate electrode 2220, the opening H of the storage capacitor electrode 2340, and the first connecting pattern 2520 may overlap each other. In such an embodiment, the first connecting pattern 2520 may overlap the first contact hole CNT1-1. The first contact hole CNT1-1 may overlap the opening H of the storage capacitor electrode 1340. The first connecting pattern 2520 may contact the gate electrode 2220 through the first contact hole CNT1-1. This will be described later in greater detail with reference to FIG. 40.

In an embodiment, the first top electrode 2530 may provide the second gate signal GC to the third transistor T3. The first top electrode 2530 may contact the third gate line 2320. In one embodiment, for example, the first top electrode 2530 may overlap the third gate line 2320 and the second active pattern 2400. This will be described later in greater detail with reference to FIG. 42.

In an embodiment, the second top electrode 2540 may provide the third gate signal GI to the fourth transistor T4.

The second top electrode 2540 may contact the fourth gate line 2330. In one embodiment, for example, the second top electrode 2540 may overlap the fourth gate line 2330 and the second active pattern 2400.

A third interlayer insulating layer (e.g., a third interlayer insulating layer ILD3 of FIG. 40) may cover the third conductive pattern 2500 and may be disposed on the second gate insulating layer. The third interlayer insulating layer may include an insulating material.

Figure 36:
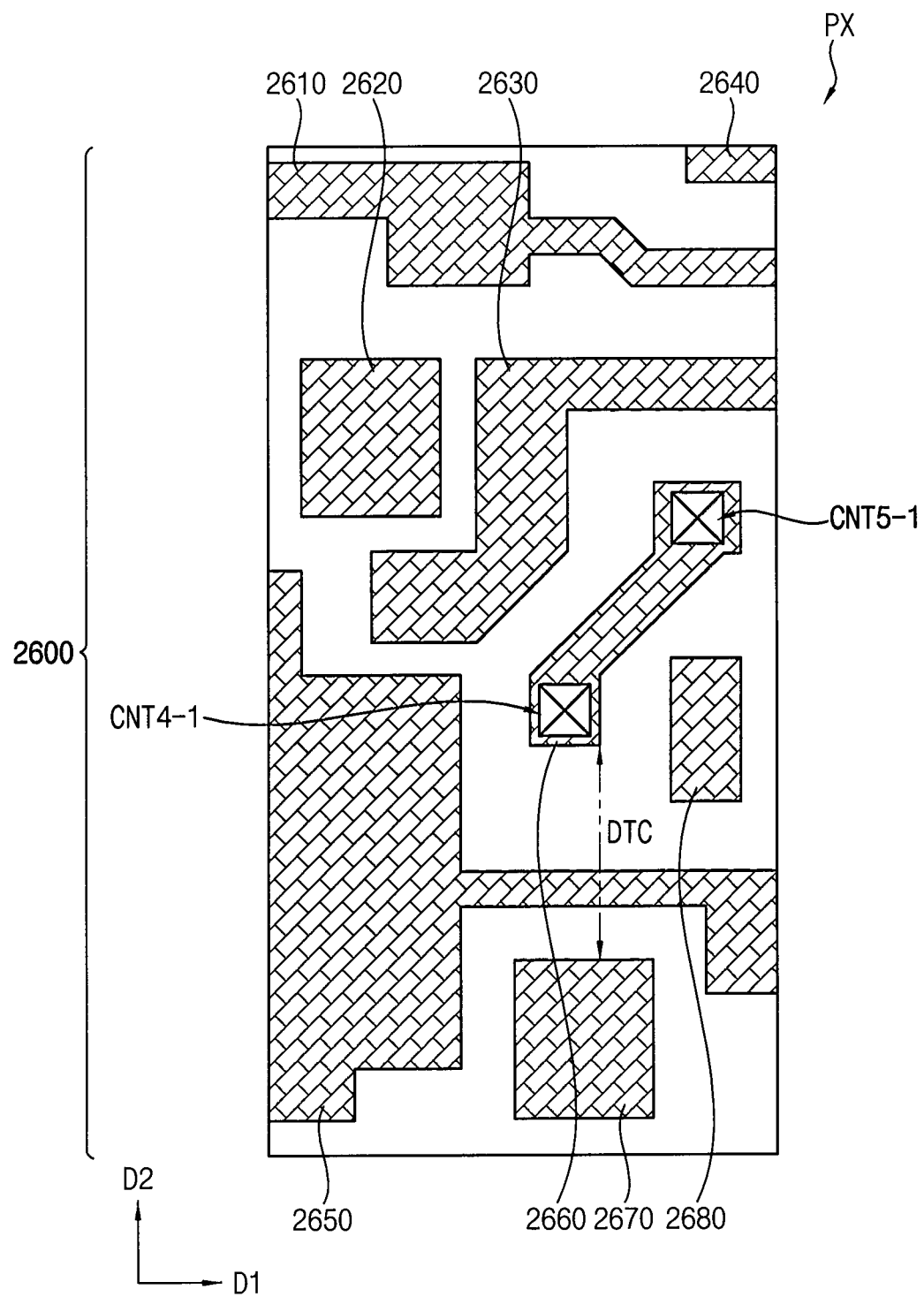
Figure 37:
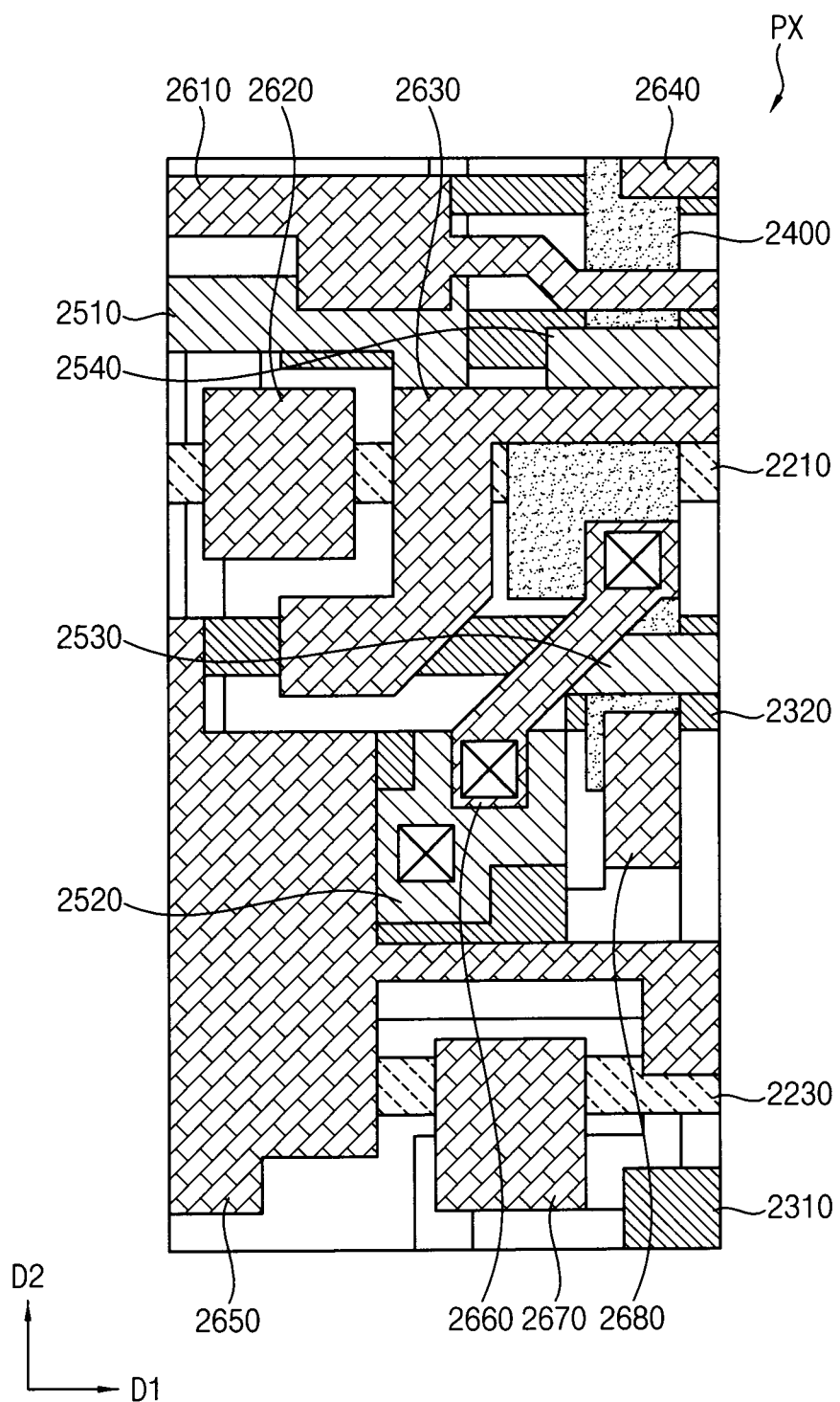

Referring to FIGS. 36 and 37, the fourth conductive pattern 2600 may be disposed on the third interlayer insulating layer. The fourth conductive pattern 2600 may include a horizontal connecting line 2610, a data voltage pad 2620, a fourth connecting pattern 2630, a gate initialization voltage connecting pattern 2640, a shielding pattern 2650, and a second connecting pattern. 2660, a first pad 2670, and a compensation connecting pattern 2680.

The horizontal connecting line 2610 may extend in the first direction D1. In an embodiment, the horizontal connecting line 2610 may transfer the data voltage DATA to the second transistor T2. The horizontal connecting line 2610 may contact a vertical connection line (e.g. a vertical connection line 2720 of FIG. 38) and a data line (e.g. a data line 2710 of FIG. 38). In one embodiment, for example, the horizontal connecting line 2610 may correspond to the first horizontal connecting line HFL1 or the second horizontal connecting line HFL2 of FIG. 25.

In an embodiment, the horizontal connecting line 2610 may overlap the third connecting pattern 2510. Accordingly, an area of the pixel structure PX on a plane may be reduced. In addition, the third connecting pattern 2510 may overlap the fourth gate line 2330 and the horizontal connecting line 2610. Accordingly, the third connecting pattern 2510 may effectively prevent a crosstalk between the fourth gate line 2330 and the horizontal connecting line 2610.

The data voltage pad 2620 may provide the data voltage DATA to the first active pattern 2100. The data voltage pad 2620 may contact the first active pattern 2100 and the data line. In one embodiment, for example, the data voltage pad 2620 may overlap the first active pattern 2100 and the data line.

In an embodiment, the fourth connecting pattern 2630 may provide the anode initialization voltage AINT to the seventh transistor T7. In one embodiment, for example, the fourth connecting pattern 2630 may provide the anode initialization voltage AINT to the first active pattern 2100. The fourth connection pattern 2630 may contact the first active pattern 2100.

In an embodiment, the fourth connecting pattern 2630 may overlap the first gate line 2210, the third gate line 2320, and a vertical connecting line (for example, a vertical connecting line 2720 in FIG. 41). This will be described later in greater detail with reference to FIG. 41.

The gate initialization voltage connecting pattern 2640 may provide the gate initialization voltage VINT to the fourth transistor T4. In one embodiment, for example, the gate initialization voltage connecting pattern 2640 may provide the gate initialization voltage VINT to the second active pattern 2400. The gate initialization voltage connecting pattern 2640 may contact the gate initialization voltage line 2310 and the second active pattern 2400.

The shielding pattern 2650 may provide the high power voltage EVLDD to the first active pattern 2100. In an embodiment, the shielding pattern 2650 may electrically connect a high power voltage line (e.g., a high power voltage line 2740 of FIG. 45) and the first active pattern 2100. In one embodiment, for example, the shielding pattern 2650 may extend in the first direction D1 and may contact the high power voltage line and the first active pattern 2100. The shielding pattern 2650 may overlap the high power voltage line and the first active pattern 2100. This will be described later in greater detail with reference to FIG. 45.

In an embodiment, the shielding pattern 2650 may overlap the vertical connection line and the second gate line 2230. Accordingly, the shielding pattern 2650 may effectively prevent a crosstalk between the vertical connecting line and the second gate line 2230. This will be described later in greater detail with reference to FIG. 44.

In an embodiment, the shielding pattern 2650 may be disposed between the vertical connecting line and the first connecting pattern 2520. Accordingly, the shielding pattern 2650 may prevent a crosstalk between the vertical connecting line and the first connecting pattern 2520. This will be described later in greater detail with reference to FIG. 44.

In an embodiment, the second connecting pattern 2660 may electrically connect the gate terminal of the first transistor T1 and the second terminal of the third transistor T3. The second connecting pattern 2660 may contact the second active pattern 1440 and the first connecting pattern 2520. In one embodiment, for example, the second connecting pattern 2660 may overlap the second active pattern 2400 and the first connecting pattern 2520. In such an embodiment, the second connecting pattern 2660 may not overlap the first contact hole CNT1-1. Accordingly, the second connecting pattern 2660 may be formed to have a minimum planar area. In such an embodiment, the second connecting pattern 2660 may overlap the fourth contact hole CNT4-1 and the fifth contact hole CNT5-1. Accordingly, the second connecting pattern 2660 may contact the first connecting pattern 2520 and the second active pattern 2400. This will be described later in greater detail with reference to FIG. 40.

Figure 40:
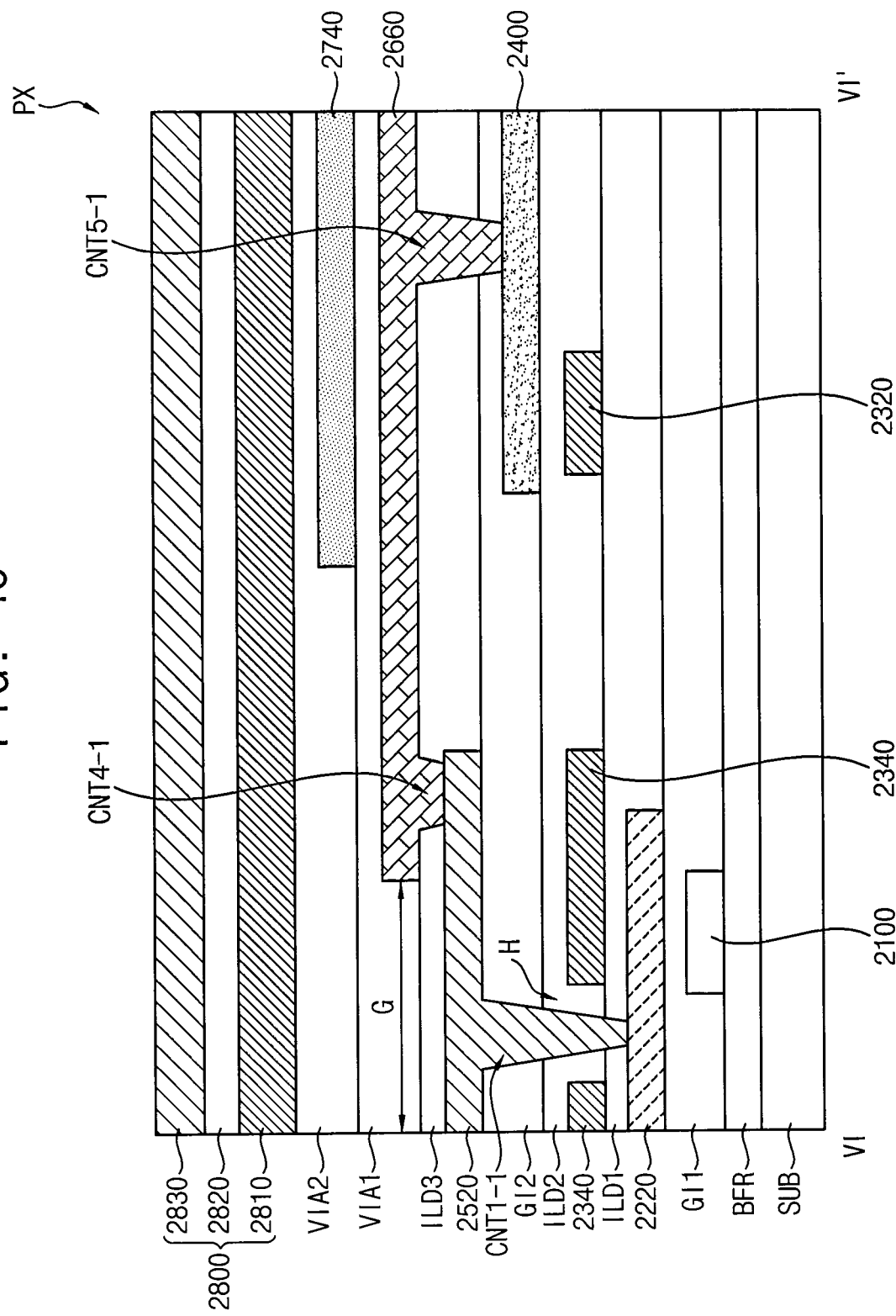
FIG. 40 is a cross-sectional view taken along line VI-VI' of FIG. 39.

The first pad 2670 may provide the anode initialization voltage AINT to a first electrode (for example, a first electrode 2810 of FIG. 40).

The compensation connecting pattern 2680 may electrically connect the second active pattern 2400 and the first active pattern 2100. In one embodiment, for example, the first terminal of the third transistor T3 (for example, the source terminal of the third transistor T3) may be connected to the second terminal of the first transistor T1 (for example, the drain terminal of the first transistor T1) through the compensation connection pattern 2680.

A first via insulating layer (e.g., a first via insulating layer VIAL in FIG. 40) may cover the fourth conductive pattern 1600 and may be disposed on the third interlayer insulating layer. The first via insulating layer may include an organic insulating material. In one embodiment, for example, the first via insulating layer may include a photoresist, a polyacrylic resin, a polyimide resin, an acrylic resin, or the like.

Figure 39:
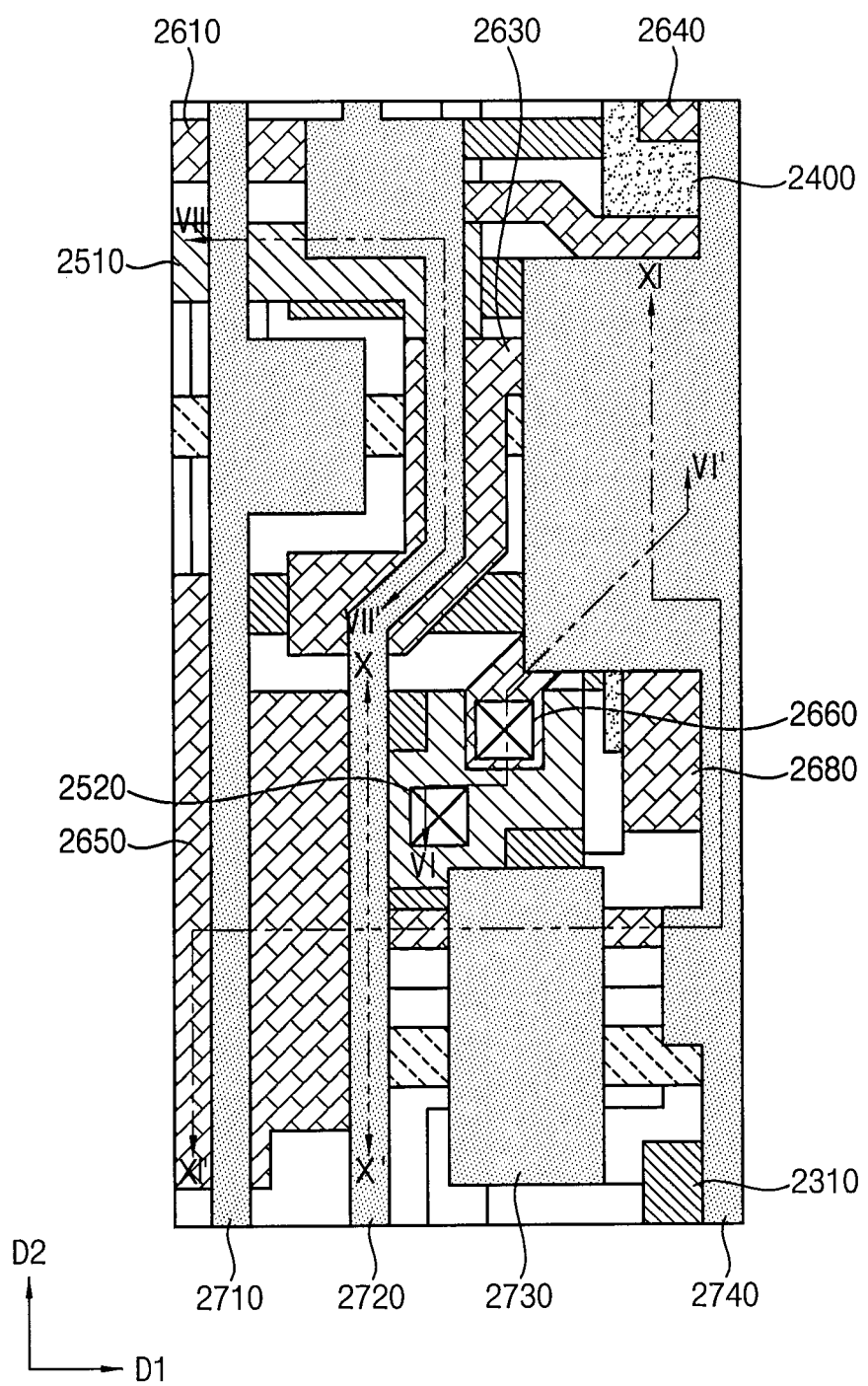

Referring to FIGS. 38 and 39, a fifth conductive pattern 2700 may be disposed on the first via insulating layer. The fifth conductive pattern 2700 may include a data line 2710, a vertical connecting line 2720, a second pad 2730, and a high power voltage line 2740.

The data line 2710 may extend in the second direction D2. In an embodiment, the data line 2710 may transfer the data voltage DATA to the second transistor T2. In one embodiment, for example, the data line 2710 may contact the data voltage pad 2620.

In an embodiment, the data line 2710 may transfer the data voltage DATA from the data driver DDV to the data voltage pad 2620. In such an embodiment, the data line 2710 may correspond to the third data line DL3 or the fourth data line DL4 of FIG. 25. In an alternative embodiment, the data line 2710 may transfer the data voltage DATA from the horizontal connection line to the data voltage pad 2620. In such an embodiment, the data line 2710 may correspond to the first data line DL1 or the second data line DL2 of FIG. 25.

The vertical connecting line 2720 may extend in the second direction D2. In an embodiment, the vertical connecting line 2720 may transfer the data voltage DATA to the second transistor T2. The vertical connecting line 2720 may contact the horizontal connecting line 2610. In one embodiment, for example, the vertical connecting line 2720 may correspond to the first vertical connecting line VFL1 or the second vertical connecting line VFL2 of FIG. 25.

In an embodiment, the fourth gate line 2330, the third connecting pattern 2510, and the vertical connecting line 2720 may overlap each other. In such an embodiment, the first gate line 2210, the third connecting pattern 2510, the fourth connecting pattern 2630, and the vertical connecting line 2720 may overlap each other. In such an embodiment, the third gate line 2320, the fourth connecting pattern 2630, and the vertical connecting line 2720 may overlap each other. This will be described later in greater detail with reference to FIG. 40.

In an embodiment, the second gate line 2230, the shielding pattern 2650, and the vertical connecting line 2720 may overlap each other. This will be described later in greater detail with reference to FIG. 44.

The high power voltage line 2740 may extend in the second direction D2. In an embodiment, the high power voltage line 2740 may transfer the high power voltage ELVDD through the shielding pattern 2650. In one embodiment, for example, the high power voltage line 2740 may contact the shielding pattern 2650.

In an embodiment, the high power voltage pattern 1740 may overlap the second active pattern 2400. In one embodiment, for example, the second active pattern 2400 may include an oxide semiconductor. When the oxide semiconductor is exposed to light, a leakage current may be generated through the third and fourth transistors T3 and T4 including the oxide semiconductor. In this case, the light may be external light or light generated by the organic light emitting diode OLED. In an embodiment of the display device 20, the high power voltage pattern 1740 overlaps the second active pattern 2400, such that the second active pattern 2400 may not be exposed to the light.

FIG. 40 is a cross-sectional view taken along line VI-VI' of FIG. 39.

Referring to FIGS. 26, 39, and 40, the pixel structure PX may have a structure in which the substrate SUB, the buffer layer BFR, the first active pattern 2100, the first gate insulating layer GI1, the gate electrode 2220, the first interlayer insulating layer ILD1, the third gate line 2320, the storage capacitor electrode 2340, the second interlayer insulating layer ILD2, the second active pattern 2400, the second gate insulating layer GI2, the first connecting pattern 2520, the third interlayer insulating layer ILD3, the second connecting pattern 2660, the first via insulating layer VIA1, the high power voltage line 2740, the second via insulating layer VIA2, the first electrode 2810, an emission layer 2820, and a second electrode 2830 are sequentially disposed one on another. The third gate line 2320 and the storage capacitor electrode 2340 may be disposed in a same layer as each other. The first electrode 2810, the emission layer 2820, and the second electrode 2830 may constitute the organic light emitting structure 2800. In one embodiment, for example, the organic light emitting structure 2800 may correspond to the organic light emitting diode OLED described above.

In an embodiment, the first connecting pattern 2520 and the second connecting pattern 2660 may be configured to connect the gate terminal of the first transistor T1 and the second terminal of the third transistor T3. In one embodiment, for example, the first connecting pattern 2520 may contact the gate electrode 2220, and the second connecting pattern 2660 may contact the first connection pattern 2520 and the second active pattern 2400.

In an embodiment, the gate electrode 2220, the opening H of the storage capacitor electrode 2340, and the first connecting pattern 2520 may overlap each other. In an embodiment, the second active pattern 2400 and the second connecting pattern 2660 may overlap each other.

In such an embodiment, the first connecting pattern 2520 may contact the gate electrode 2220 through the first contact hole CNT1-1 overlapping the opening H. In such an embodiment, the second connecting pattern 2660 may contact the first connecting pattern 2520 through the fourth contact hole CNT4-1 spaced apart from the first contact hole CNT1-1, and may contact the second active pattern 2400 through the fifth contact hole CNT5-1 spaced apart from the first and fourth contact holes CNT1-1 and CNT4-1. Accordingly, the second connecting pattern 2660 may partially overlap the first connecting pattern 2520.

In an embodiment, the display device 20 includes the first connecting pattern 2520 and the second connecting pattern 2660, such that the area of the pixel structure PX on a plane may be reduced. Accordingly, the resolution of the display device 20 may be increased.

In an embodiment, a predetermined distance (e.g., DTC of FIG. 36) may be provided between the second connecting pattern 2660 and the first pad 2670. In such an embodiment where the first connecting pattern 2520 is disposed under the second connecting pattern 2660, the second connecting pattern 2660 may not be disposed in a region (e.g. a region G of FIG. 40) where the first connection pattern 2520 is disposed. Accordingly, the first pad 2670 spaced apart from the second connecting pattern 2660 by the predetermined distance DTC may be disposed adjacent to the second direction D2. Therefore, the area of the pixel structure PX on a plane may be reduced FIG. 41 is a cross-sectional view taken along line VII-VII' of FIG. 39

Referring to FIGS. 26, 39, and 41, the pixel structure PX may have a structure in which the substrate SUB, the buffer layer BFR, the first active pattern 2100, the first gate insulating layer GI1, the first gate line 2210, the first interlayer insulating layer ILD1, the third gate line 2320, the fourth gate line 2330, the second interlayer insulating layer ILD2, the second gate insulating layer GI2, the third connecting pattern 2510, the horizontal connecting line 2610, the fourth connecting pattern 2630, the first via insulating layer VIA1, the vertical connecting line 2720, the second via insulating layer VIA2, the first electrode 2810, the emission layer 2820, and the second electrode 2830 are sequentially disposed one on another. The third gate line 2320 and the fourth gate line 2330 may be disposed in a same layer as each other, and the horizontal connecting line 2610 and the fourth connecting pattern 2630 may be disposed in a same layer as each other.

In an embodiment, the first gate signal GW may be provided to the first gate line 2210, the second gate signal GC may be provided to the third gate line 2320, and the third gate signal GI may be provided to the fourth gate line 2330. Each of the first to third gate signals GW, GC, and GI may include a clock signal for turning on or turning off a transistor.

In an embodiment, the third connecting pattern 2510 and the fourth connecting pattern 2630 may provide the anode initialization voltage AINT to the first active pattern 2100. In one embodiment, for example, the fourth connecting pattern 2630 may contact the third connecting pattern 2510 and the first active pattern 2100. The third connecting pattern 2510 may provide the anode initialization voltage AINT to the fourth connecting pattern 2630, and the fourth connecting pattern 2630 may provide the anode initialization voltage AINT to the first active pattern 2100. In one embodiment, for example, the anode initialization voltage AINT may be a constant voltage having a constant voltage level.

In an embodiment, the horizontal connecting line 2610 and the vertical connecting line 2720 may provide the data voltage DATA to the data line 2710. In one embodiment, for example, the horizontal connecting line 2610 and the vertical connecting line 2720 may contact each other. The vertical connecting line 2720 may provide the data voltage DATA to the horizontal connecting line 2610, and the horizontal connecting line 2610 may provide the data voltage DATA to the data line 2710. In one embodiment, for example, the data voltage DATA may have a variable voltage level to emit light of the organic light emitting diode OLED with a desired luminance.

A crosstalk may occur between the vertical connecting line 2720 provided with the data voltage DATA and the first gate line 2210 provided with the first gate signal GW. Accordingly, the voltage level of the data voltage DATA may be changed by the first gate signal GW.

A crosstalk may occur between the vertical connecting line 2720 provided with the data voltage DATA and the third gate line 2320 provided with the second gate signal GC. Accordingly, the voltage level of the data voltage DATA may be changed by the second gate signal GC.

A crosstalk may occur between the vertical connecting line 2720 (or the horizontal connecting line 2610) provided with the data voltage DATA and the fourth gate line 2330 provided with the third gate signal GI. Accordingly, the voltage level of the data voltage DATA may be changed by the third gate signal GI.

If the voltage level of the data voltage DATA is changed, the organic light emitting diode OLED may emit light with undesired luminance. Accordingly, a stain may be visually recognized by the user.

In an embodiment, the display device 20 may include the third connection pattern 2510 and the fourth connection pattern 2630 to prevent the above-described crosstalk.

In an embodiment, the first gate line 2210, the third connecting pattern 2510, the fourth connecting pattern 2630, and the vertical connecting line 2720 may overlap each other in region C of FIG. 41. In one embodiment, for example, the third connecting pattern 2510 and the fourth connecting pattern 2630 may prevent a crosstalk between the first gate line 1220 and the vertical connecting line 2720.

In an embodiment, the third gate line 2320, the fourth connecting pattern 2630, and the vertical connecting line 2720 may overlap each other in region D of FIG. 41. In one embodiment, for example, the fourth connecting pattern 2630 may prevent a crosstalk between the third gate line 2320 and the vertical connecting line 2720.

In an embodiment, the fourth gate line 2330, the third connecting pattern 2510, the horizontal connecting line 2610, and the vertical connecting line 2720 may overlap each other in region B of FIG. 41. In one embodiment, for example, the third connecting pattern 2510 may prevent a crosstalk between the fourth gate line 2330 and the horizontal connecting line 2610, and may prevent a crosstalk between the fourth gate line 2330 and the vertical connecting line 2720.

Figure 42:
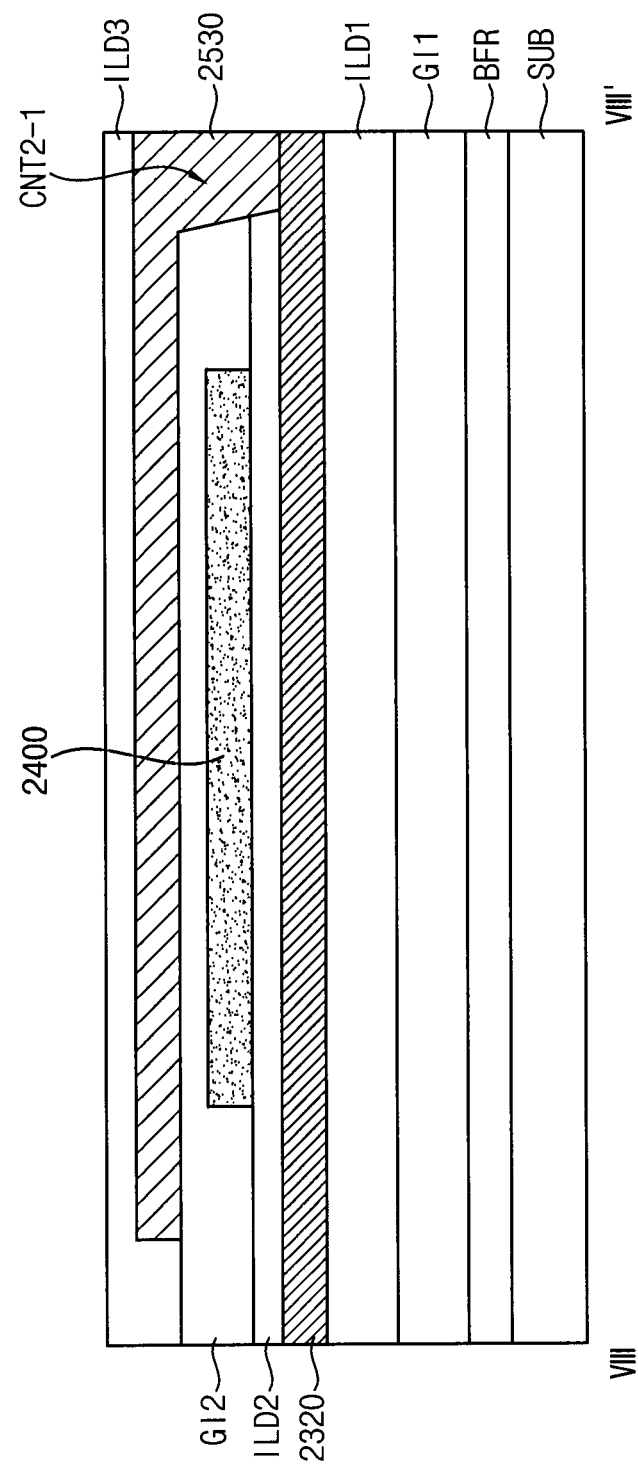
FIG. 42 is a cross-sectional view taken along line VIII-VIII' of FIG. 35.

FIG. 42 is a cross-sectional view taken along line VIII-VIII' of FIG. 35.

Referring to FIGS. 26, 35, and 42, the pixel structure PX may have a structure in which the substrate SUB, the buffer layer BFR, the first gate insulating layer GI1, the first interlayer insulating layer ILD1, the third gate line 2320, the second interlayer insulating layer ILD2, the second active pattern 2400, the second gate insulating layer GI2, the first top electrode 2530, and the third interlayer insulating layer ILD3 are sequentially disposed one on another.

In an embodiment, the third gate line 2320 may be disposed under the second active pattern 2400, and the first top electrode 2530 may be disposed on the second active pattern 2400. In such an embodiment, the third gate line 2320, the second active pattern 2400, and the first top electrode 2530 may overlap each other.

In an embodiment, the second gate signal GC may be provided to the third gate line 2320. In such an embodiment, the first top electrode 2530 may contact the third gate line 2320. In detail, the first top electrode 2530 may contact the third gate line 2320 through the second contact hole CNT2-1. Accordingly, the second gate signal GC may also be provided to the first top electrode 2530. Therefore, a turn-on characteristic and/or a turn-off characteristic of the third transistor T3 may be improved.

Figure 43:
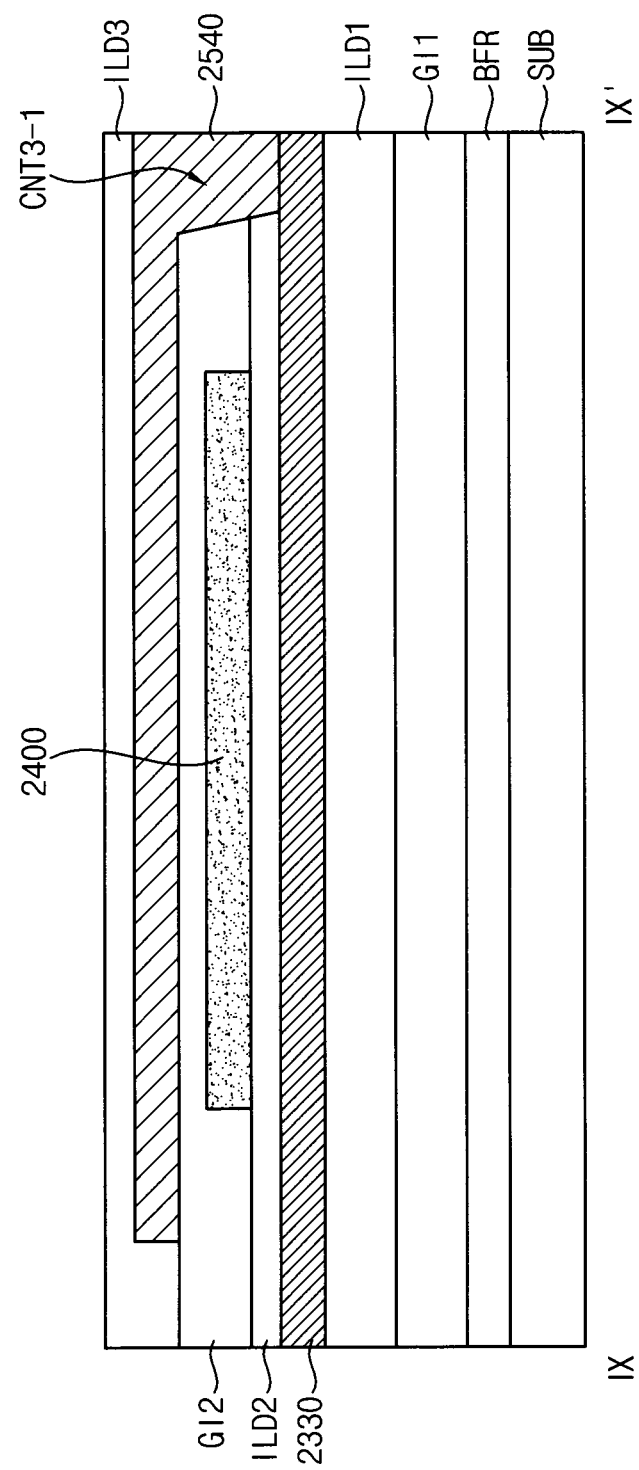
FIG. 43 is a cross-sectional view taken along line IX-IX' of FIG. 35.

FIG. 43 is a cross-sectional view taken along line IX-IX' of FIG. 35.

Referring to FIGS. 26, 35, and 43, the pixel structure PX may have a structure in which the substrate SUB, the buffer layer BFR, the first gate insulating layer GI1, the first interlayer insulating layer ILD1, the fourth gate line 2330, the second interlayer insulating layer ILD2, the second active pattern 2400, the second gate insulating layer GI2, the second top electrode 2540, and the third interlayer insulating layer ILD3 are sequentially disposed one on another.

In an embodiment, the fourth gate line 2330 may be disposed under the second active pattern 2400, and the second top electrode 2540 may be disposed on the second active pattern 2400. In such an embodiment, the fourth gate line 2330, the second active pattern 2400, and the second top electrode 2540 may overlap each other.

In an embodiment, the third gate signal GI may be provided to the fourth gate line 2330. In such an embodiment, the second top electrode 2540 may contact the fourth gate line 2330. In detail, the second top electrode 2540 may contact the fourth gate line 2330 through the third contact hole CNT3-1. Accordingly, the second gate signal GC may also be provided to the second top electrode 2540. Therefore, a turn-on characteristic and/or a turn-off characteristic of the fourth transistor T4 may be improved.

Figure 44:
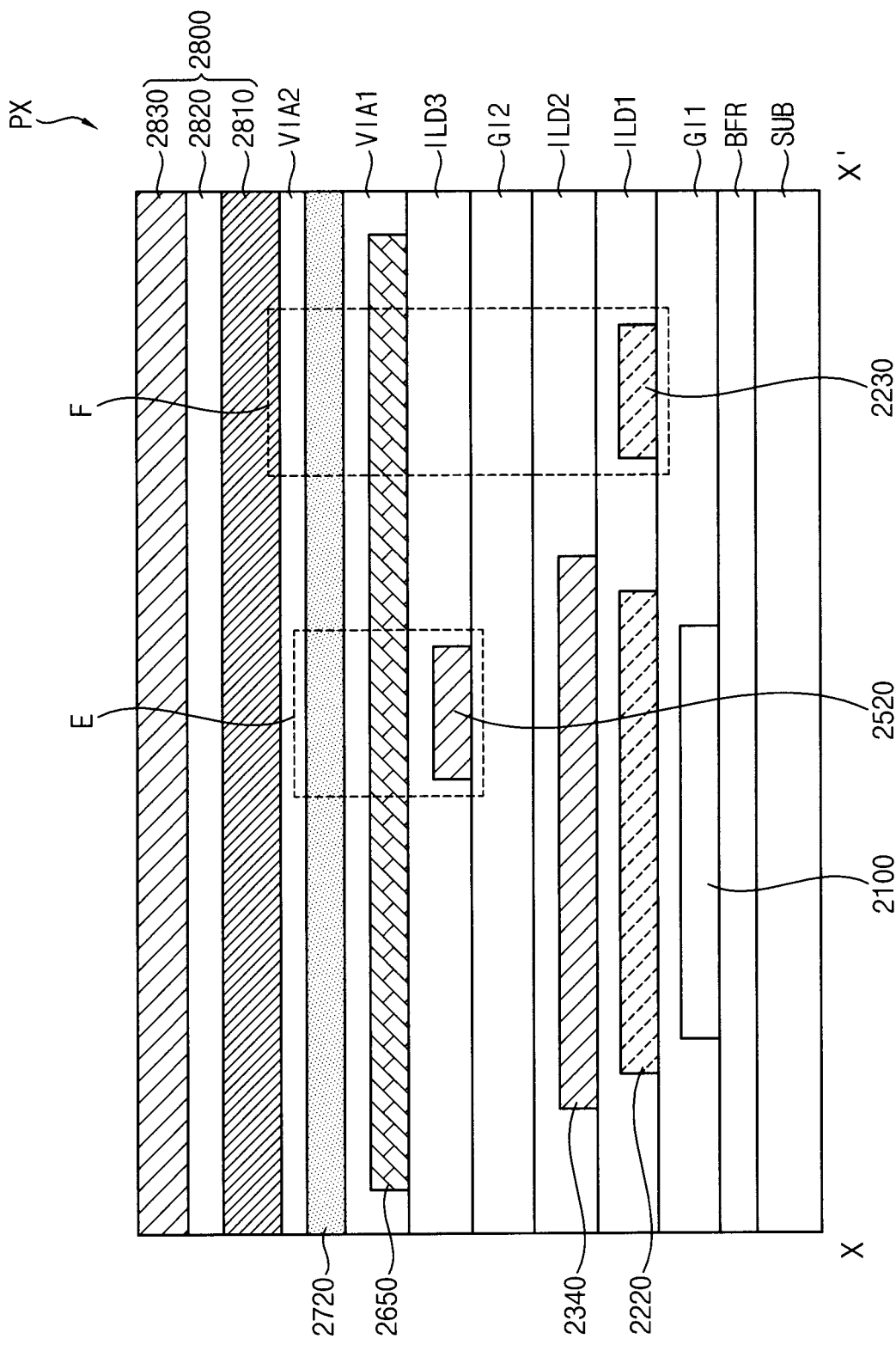
FIG. 44 is a cross-sectional view taken along line X-X' of FIG. 39.

FIG. 44 is a cross-sectional view taken along line X-X' of FIG. 39.

Referring to FIGS. 26, 39, and 44, the pixel structure PX may have a structure in which the substrate SUB, the buffer layer BFR, the first active pattern 2100, the first gate insulating layer GI1, the gate electrode 2220, the second gate line 2230, and the first interlayer insulating layer ILD1, the storage capacitor electrode 2340, the second interlayer insulating layer ILD2, the second gate insulating layer GI2, the first connecting pattern 2520, the third interlayer insulating layer ILD3, the shielding pattern 2650, the first via insulating layer VIA1, the vertical connecting line 2720, the second via insulating layer VIA2, the first electrode 2810, the emission layer 2820, and the second electrode 2830 are sequentially disposed one on another. The gate electrode 2220 and the second gate line 2230 may be disposed in a same layer as each other.

In one embodiment, for example, the first connecting pattern 2520 may electrically connect the gate terminal of the first transistor T1 and the second terminal of the third transistor T3. The high power voltage ELVDD may be provided to the shielding pattern 2650. The vertical connecting line 2720 may provide the data voltage DATA to the data line 2710. The emission management signal EM may be provided to the second gate line 2230. The emission management signal EM may include a clock signal for turning on or off a transistor.

A crosstalk may occur between the vertical connecting line 2720, to which the data voltage DATA is provided, and the first connecting pattern 2520. Accordingly, the voltage level of the data voltage DATA may be changed.

A crosstalk may occur between the vertical connecting line 2720 provided with the data voltage DATA and the second gate line 2230 provided with the emission management signal EM. Accordingly, the voltage level of the data voltage DATA may be changed by the emission management signal GC.

If the voltage level of the data voltage DATA is changed, the organic light emitting diode OLED may emit light with undesired luminance. Accordingly, a stain may be visually recognized by the user.

In an embodiment, the display device 20 may include the shielding pattern 2650 to prevent the above-described crosstalk.

In an embodiment, the first connecting pattern 2520, the shielding pattern 2650, and the vertical connecting line 2720 may overlap each other in region E of FIG. 44. In one embodiment, for example, the shielding pattern 2650 may prevent a crosstalk between the first connecting pattern 2520 and the vertical connecting line 2720.

In an embodiment, the second gate line 2230, the shielding pattern 2650, and the vertical connecting line 2720 may overlap each other in region F of FIG. 44. In one embodiment, for example, the shielding pattern 2650 may prevent a crosstalk between the second gate line 2230 and the vertical connecting line 2720.

Figure 45:
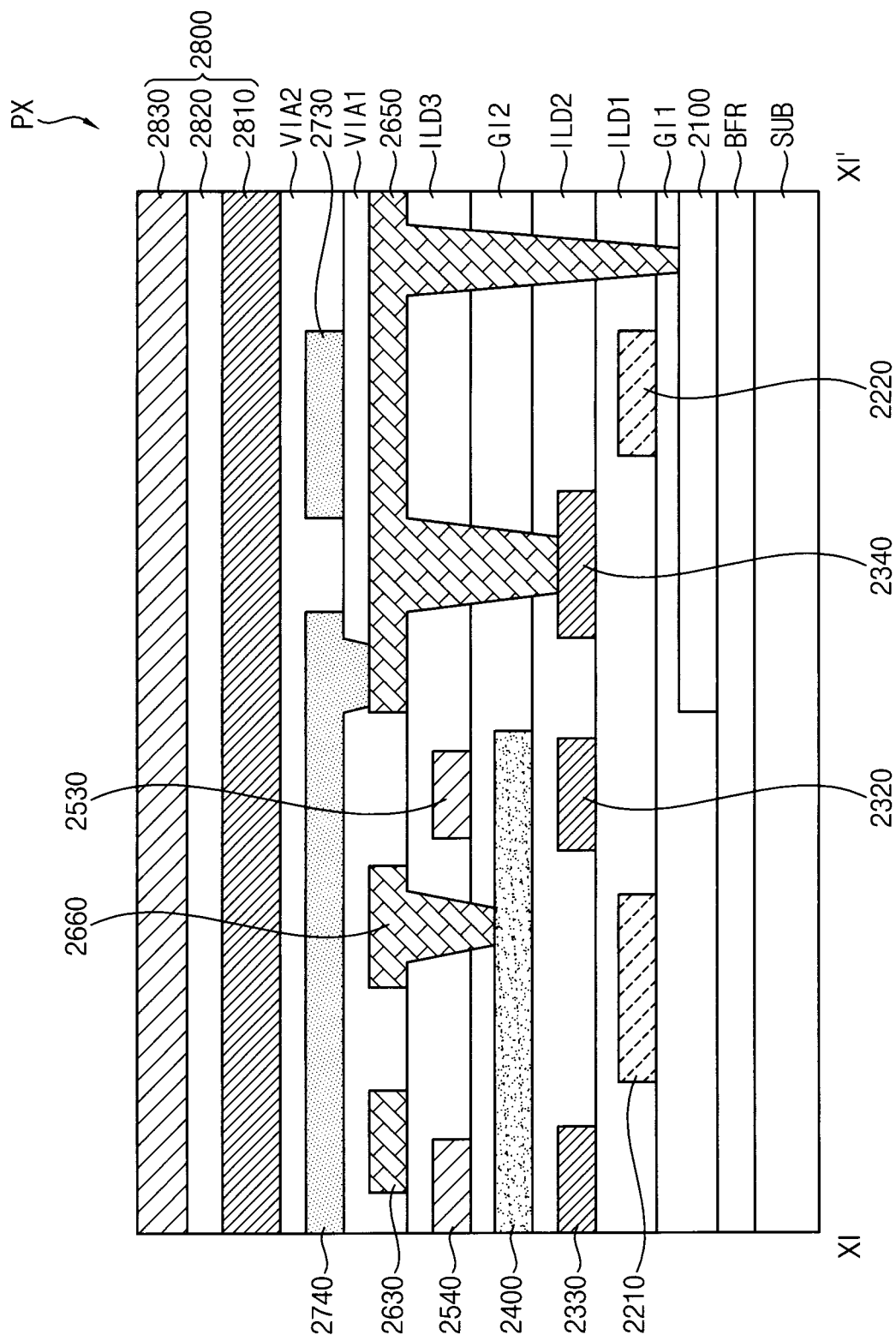
FIG. 45 is a cross-sectional view taken along line XI-XI' of FIG. 39.

FIG. 45 is a cross-sectional view taken along line XI-XI' of FIG. 39.

Referring to FIGS. 26, 39, and 45, the pixel structure PX may have a structure in which the substrate SUB, the buffer layer BFR, the first active pattern 2100, the first gate insulating layer GI, the first gate line 2210, the gate electrode 2220, the third gate line 2320, the fourth gate line 2330, the storage capacitor electrode 2340, the second active pattern 2400, the first top electrode 2530, the second top electrode 2540, the fourth connecting pattern 2630, the shielding pattern 2650, the second connecting pattern 2660, the first via insulating layer VIA1, the second pad 2730, the high power voltage line 2740, the second via insulating layer VIA2, the first electrode 2810, the emission layer 2820, and the second electrode 2830 are sequentially disposed one on another. The first gate line 2210 and the gate electrode 2220 may be disposed in a same layer as each other, and the third gate line 2320, the fourth gate line 2330 and the storage capacitor electrode 2340 may be disposed in a same layer as each other. The first top electrode 2530 and the second top electrode 2540 may be disposed in a same layer as each other, the fourth connecting pattern 2630, the shielding pattern 2650 and the second connecting pattern 2660 may be disposed in a same layer as each other, and the second pad 2730 and the high power voltage line 2740 may be disposed in a same layer as each other.

In an embodiment, the high power voltage line 2740 may provide the high power voltage ELVDD to the first active pattern 2100. In one embodiment, for example, the high power voltage line 2740 may contact the shielding pattern 2650, and the shielding pattern 2650 may contact the first active pattern 2100. The high power voltage ELVDD may be provided to the high power voltage line 2740, the shielding pattern 2650, and the first active pattern 2100.

In an embodiment, the high power voltage line 2740 may overlap the second active pattern 2400. In one embodiment, for example, the second active pattern 2400 may include an oxide semiconductor. When the oxide semiconductor is exposed to light, a leakage current may be generated through the third and fourth transistors T3 and T4 including the oxide semiconductor. In this case, the light may be external light or light generated by the organic light emitting diode OLED. In an embodiment, the high power voltage line 2740 overlaps the second active pattern 2400, such that the second active pattern 2400 may not be exposed to the light.

The display device 20 may electrically connect the gate terminal of the first transistor T1 and the second terminal of the third transistor T3 through the first and second connecting patterns 2520 and 2660. In such an embodiment, where the display device 20 includes the shielding pattern 2650 that shields the first connecting pattern 2520, the shielding pattern 2650 may prevent a crosstalk between the first connecting pattern 2520 and the data line 2710. In such an embodiment, the area of the second connecting pattern 2660 on a plane may be reduced by partially overlapping the second connecting pattern 2660 and the first connecting pattern 2520, and the resolution may be increased.

In such an embodiment, where the display device 20 includes the shielding pattern 2650, a crosstalk between the second gate line 2230 and the connecting lines may be effectively prevented, and a crosstalk between the first connecting pattern 2520 and the connecting lines may be effectively prevented. Accordingly, display quality of the display device 20 may be improved.

In such an embodiment, the display device 20 includes the third and fourth connecting patterns 2510 and 2630, a crosstalk between the gate lines (e.g., the first gate line 2210, the third gate line 2320, and the fourth gate line 2330) and the connecting lines (e.g., the horizontal connecting line 2610 and the vertical connecting line 2720) may be effectively prevented. Accordingly, display quality of the display device 20 may be improved.

In such an embodiment, the display device 20 includes the first and second top electrodes 2530 and 2540 to improve turn-on characteristics and/or turn-off characteristics of transistors.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device, comprising:
a substrate;
a first active pattern disposed above the substrate;
a first gate electrode disposed above the first active pattern;
a second active pattern disposed above the first gate electrode;
a second gate electrode disposed above the second active pattern;
a first connecting pattern disposed above the second active pattern and electrically connected to the first gate electrode; and
a second connecting pattern disposed above the first connecting pattern and electrically connected to the first connecting pattern and the second active pattern.

2. The display device of claim 1, wherein the first connecting pattern is disposed in a same layer as the second gate electrode.

3. The display device of claim 1, further comprising:
a shielding pattern disposed above the first connecting pattern, wherein the shielding pattern receives a constant voltage; and
a data line disposed above the shielding pattern, wherein the data line overlaps the shielding pattern, and provides a data voltage.

4. The display device of claim 3, wherein the shielding pattern overlaps the first connecting pattern.

5. The display device of claim 3, wherein the shielding pattern is disposed between the data line and the first connecting pattern.

6. The display device of claim 3, wherein the data line is disposed above the second connecting pattern.

7. The display device of claim 3, wherein the constant voltage is a power voltage.

8. The display device of claim 7, further comprising:
a power voltage line disposed above the shielding pattern, wherein the power voltage line provides the power voltage to the shielding pattern.

9. The display device of claim 1, wherein the second connecting pattern partially overlaps the first connecting pattern.

10. The display device of claim 9, further comprising:
a storage capacitor electrode disposed above the first gate electrode,
wherein a hole is defined through the storage capacitor electrode, and
the second connecting pattern does not overlap the hole.

11. The display device of claim 9, wherein
the first connecting pattern contacts the first gate electrode through a first contact hole overlapping the first connecting pattern and the first gate electrode, and
the second connecting pattern does not overlap the first contact hole.

12. The display device of claim 11, wherein the second connecting pattern contacts the first connecting pattern through a second contact hole overlapping the first connecting pattern and the second connecting pattern.

13. The display device of claim 12, wherein the second connecting pattern contacts the second active pattern through a third contact hole overlapping the second connecting pattern and the second active pattern.

14. The display device of claim 13, wherein the first contact hole, the second contact hole and the third contact hole are spaced apart from each other.

15. The display device of claim 1, further comprising:
a first bottom gate electrode disposed under the second active pattern and electrically connected to the second gate electrode.

16. The display device of claim 15, wherein the first bottom gate electrode overlaps the second gate electrode.

17. The display device of claim 16, further comprising:
a third gate electrode disposed above the second active pattern; and
a second bottom gate electrode disposed under the second active pattern, overlapping the third gate electrode, and electrically connected to the third gate electrode.

18. The display device of claim 1, wherein
the first active pattern includes polycrystalline silicon, and
the second active pattern includes oxide semiconductor.

19. The display device of claim 18, further comprising:
a light blocking pattern disposed above the second connecting pattern and overlapping the second active pattern.

20. The display device of claim 1, further comprising:
a fourth gate electrode disposed between the first active pattern and the second active pattern.

* * * * *